(12) United States Patent
Mizuki et al.

(10) Patent No.: US 8,580,393 B2
(45) Date of Patent: Nov. 12, 2013

(54) POLYMER AND ORGANIC ELECTROLUMINESCENT DEVICE INCLUDING THE SAME

(75) Inventors: Yumiko Mizuki, Sodegaura (JP);
Nobuhiro Yabunouchi, Sodegaura (JP);
Mitsuru Eida, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 455 days.

(21) Appl. No.: 12/921,133

(22) PCT Filed: Feb. 25, 2009

(86) PCT No.: PCT/JP2009/053356
§ 371 (c)(1),
(2), (4) Date: Sep. 3, 2010

(87) PCT Pub. No.: WO2009/110360
PCT Pub. Date: Sep. 11, 2009

(65) Prior Publication Data
US 2011/0017983 A1   Jan. 27, 2011

(30) Foreign Application Priority Data
Mar. 5, 2008   (JP) .................................. 2008-054986

(51) Int. Cl.
*H01L 51/54*   (2006.01)

(52) U.S. Cl.
USPC ........... 428/690; 313/504; 313/505; 313/506; 257/40; 257/E51.05; 257/E51.026; 257/E51.032; 546/18; 546/79; 546/81; 546/101; 564/26; 564/426; 564/434

(58) Field of Classification Search
USPC .............. 428/690, 917; 313/504, 505, 506; 257/40, E51.06, E51.05, E51.026, 257/E51.032; 546/18, 79, 81, 101; 564/26, 564/426, 434
See application file for complete search history.

(56) References Cited

U.S. PATENT DOCUMENTS

2002/0103332 A1\*  8/2002  Leclerc et al. ................ 528/423
2007/0075310 A1\*  4/2007  Lee ................................ 257/40

FOREIGN PATENT DOCUMENTS

GB   2 447 173 A   9/2008
JP   02-223188      9/1990

(Continued)

OTHER PUBLICATIONS

International Preliminary Report on Patentability in PCT/JP2009/053356 dated Oct. 21, 2010.

(Continued)

*Primary Examiner* — Gregory Clark
(74) *Attorney, Agent, or Firm* — Foley & Lardner LLP

(57) ABSTRACT

A polymer compound including a repeating unit shown by the following formula (1) wherein at least one of $Ar^1$, $Ar^2$ and $Ar^3$ in the formula (1) is a group shown by the formula (2) and the two bonds shown in the formula (1) are present on any one or any two of $Ar^1$, $Ar^2$, $Ar^3$ and $L^1$.

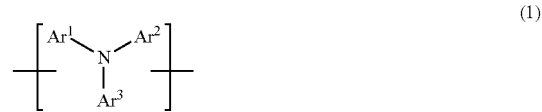

(1)

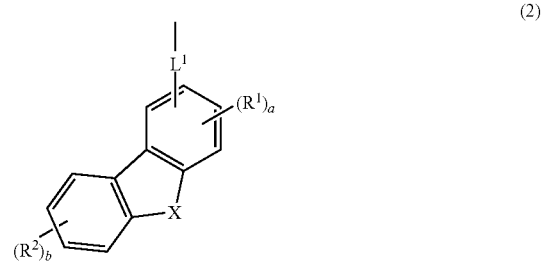

(2)

18 Claims, 1 Drawing Sheet

(56) References Cited

FOREIGN PATENT DOCUMENTS

| | | |
|---|---|---|
| JP | 08-048726 | 2/1996 |
| JP | 2002-128891 | 5/2002 |
| JP | 2004-087395 | 3/2004 |
| JP | 2005-272834 | 10/2005 |
| JP | 2007-119763 | 5/2007 |
| JP | 2007-162009 | 6/2007 |
| JP | 2007-177225 | 7/2007 |
| JP | 2008-174661 | 7/2008 |
| JP | 2008-266425 | 11/2008 |
| WO | WO-2005/049546 A1 | 6/2005 |
| WO | WO-2006/096332 A2 | 9/2006 |
| WO | WO-2008/120470 A1 | 10/2008 |

OTHER PUBLICATIONS

International Search Report in PCT/JP2009/053356 dated May 26, 2009.

* cited by examiner

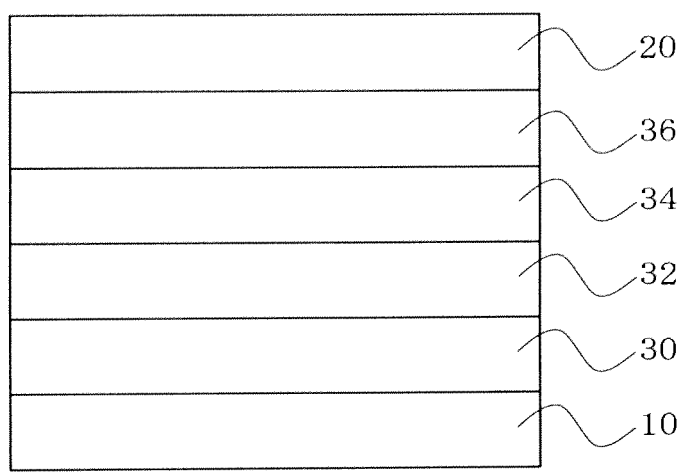

POLYMER AND ORGANIC ELECTROLUMINESCENT DEVICE INCLUDING THE SAME

TECHNICAL FIELD

The invention relates to a polymer compound suitable for use as a material for an organic electroluminescence device and an organic electroluminescence device using the same.

BACKGROUND ART

An organic electroluminescence device (hereinafter the term "electroluminescence" is often abbreviated as "EL") is a self-emission device utilizing the principle that a fluorescent compound emits light by the recombination energy of holes injected from an anode and electrons injected from a cathode when an electric field is impressed.

Use of a polymer compound in an organic compound layer constituting an organic EL device has been studied since improvement in physical or thermal durability can be expected.

For examples, Patent Document 1 reports an organic EL device using, as a polymer, polyvinylcarbazole (PVCz) having hole-injecting capability. Since the glass transition temperature (Tg) of PVCz is very high, a thin film obtained using PVCz has improved stability, whereby an organic EL device with excellent durability can be fabricated. However, the driving voltage of this device is very high. In addition, this device had problems that luminous efficiency and life were not sufficient.

Patent Documents 2 discloses an organic EL device using a polymer obtained by copolymerizing a vinyl anthracene derivative and a vinyl carbazole derivative.

However, this device had a problem that luminous efficiency and life were not sufficient.

A polymer electroluminescence material has an advantage that a film can be formed by applying and printing the solution thereof, and hence various studies have been made (Patent Documents 3 to 7). However, an organic EL device using the above-mentioned polymer compound has a problem that device performance such as life (half life time) and luminous efficiency is not always sufficient.

Patent Document 1: JP-A-H02-223188
Patent Document 2: JP-A-H08-48726
Patent Document 3: JP-A-2005-272834
Patent Document 4: JP-A-2007-119763
Patent Document 5: JP-A-2007-162009
Patent Document 6: JP-A-2007-177225
Patent Document 7: WO2005/049546

The invention has been made to solve the above-mentioned problems, and an object thereof is to provide an organic EL device having a high luminous efficiency and a long life time and a compound which realizes such device.

DISCLOSURE OF THE INVENTION

As a result of intensive studies, the inventors have found that a polymer obtained by allowing an aromatic amine derivative having a specific skeleten such as a carbazole skeleten, a dibenzofuran skeleten and a dibenzothiophene skeleten which bonds to a triarylamino group through a bonding group to be a polymer is effective for increasing the luminous efficiency and the life of an organic EL device. Further, the inventors have found that due to a specific skeleton such as a carbazole skeleton, a dibenzofuran skeleton and a dibenzothiophene skeleton, film adhesiveness to adjacent layers is improved, whereby luminous efficiency and life are improved. The invention has been made based on such findings.

According to the invention, the following embodiments of polymer compounds or the like are provided.

Embodiment 1

A polymer compound comprising a repeating unit shown by the following formula (1) wherein at least one of $Ar^1$, $Ar^2$ and $Ar^3$ is a group shown by the formula (2):

(1)

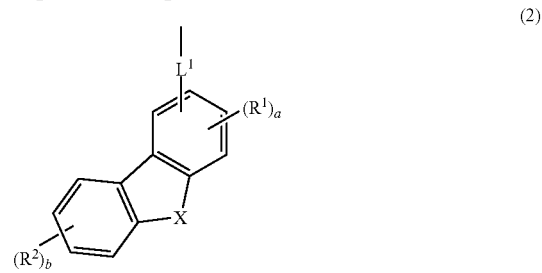

(2)

in the formula (1), $Ar^1$, $Ar^2$ and $Ar^3$, which may be the same or different, are a group shown by the formula (2), a substituted or unsubstituted aromatic hydrocarbon group having 6 to 60 carbon atoms that form a ring (hereinafter referred to as ring carbon atoms) or a substituted or unsubstituted aromatic heterocyclic group having 5 to 60 atoms that form a ring (hereinafter referred to as ring atoms);

in the formula (2), $L^1$ is a substituted or unsubstituted aromatic hydrocarbon group having 6 to 60 ring carbon atoms, a substituted or unsubstituted fluorene group or a substituted or unsubstituted aromatic heterocyclic group having 5 to 60 ring atoms;

X is a substituted or unsubstituted hetero atom;

$R^1$ and $R^2$, which may be the same or different, are a hydrogen atom, a substituted or unsubstituted aryl group having 6 to 60 ring carbon atoms, a substituted or unsubstituted alkyl group having 1 to 50 carbon atoms, a substituted or unsubstituted alkoxy group having 1 to 50 carbon atoms, a substituted or unsubstituted aryloxy group having 6 to 50 ring carbon atoms, a substituted or unsubstituted arylthio group having 5 to 50 ring atoms, a substituted or unsubstituted alkoxycarbonyl group having 2 to 50 carbon atoms, an amino group substituted by a substituted or unsubstituted aryl group having 6 to 50 ring carbon atoms, a halogen atom, a cyano group, a nitro group, a hydroxyl group or a carboxyl group;

when the formula (1) has two or more groups shown by the formula (2), the groups shown by the formula (2) may be the same or different;

a is an integer of 0 to 3 and b is an integer of 0 to 4; and the two bonds shown in the formula (1) are present on any one or any two of $Ar^1$, $Ar^2$, $Ar^3$ and $L^1$.

Embodiment 2

The polymer compound as found in embodiment 1, wherein one or more and two or less of $Ar^1$, $Ar^2$ and $Ar^3$ in the formula (1) is a group shown by the formula (2).

Embodiment 3

The polymer compound as found in embodiment 1 or 2, wherein at least one of the two bonds is present on a group other than the group of the formula (2).

Embodiment 4

The polymer compound as found in any one of embodiments 1 to 3, wherein the X is a group selected from a group shown by the following formula (3), O and S:

=NR³                       (3)

Embodiment 5

The polymer compound as found in any one of embodiments 1 to 4, wherein the group of the formula (2) is a group selected from the following formulas (4) to (8):

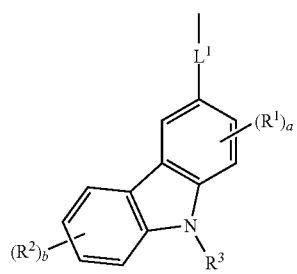
(4)

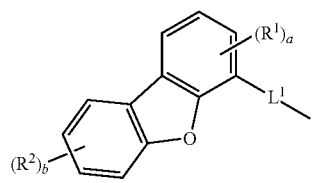
(5)

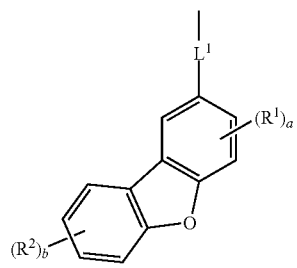
(6)

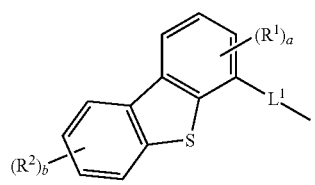
(7)

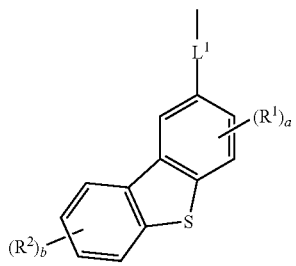
(8)

wherein $L^1$, $R^1$, $R^3$, a and b are as defined in the formulas (1) to (3).

Embodiment 6

The polymer compound as found in any one of embodiments 1 to 5, which comprises at least one of the repeating units selected from those shown by the following formulas (9) to (13):

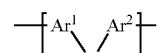
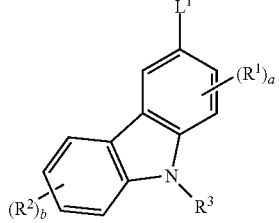
(9)

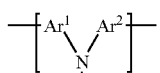
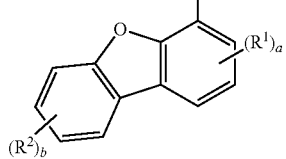
(10)

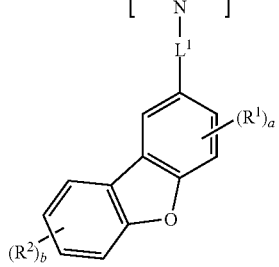
(11)

-continued

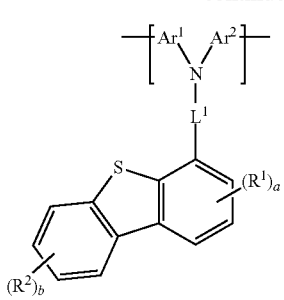

(12)

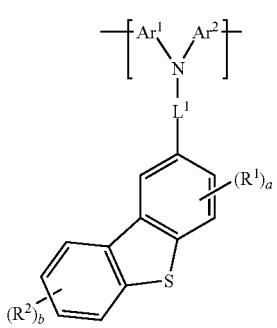

(13)

wherein Ar¹, Ar², L¹, R¹ to R³, a and b are as defined in the formulas (1) to (3).

Embodiment 7

The polymer compound as found in embodiment 1, wherein the formula (1) is a repeating unit shown by the following formula (1'):

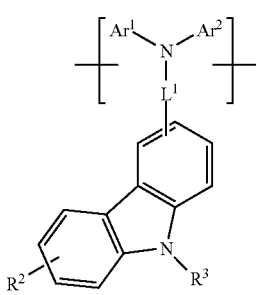

(1')

wherein L¹, Ar¹, Ar², R² and R³ are defined in the formulas (1) to (3).

Embodiment 8

The polymer compound as found in any one of embodiments 1 to 7, wherein Ar¹, Ar² and Ar³ are independently a ring selected from the group comprising a benzene ring, a naphthalene ring, an anthracene ring, a pyrene ring and a phenanthrene ring.

Embodiment 9

The polymer compound as found in any one of embodiments 1 to 8, wherein at least one of Ar¹, Ar² and Ar³ has a substituent and the substituent is a group selected from the group comprising an alkyl group, an alkoxy group, an alkylthio group, an aryl group, an aryloxy group, an arylthio group, an arylalkyl group, an arylalkenyl group, an arylalkinyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group.

Embodiment 10

The polymer compound as found in any one of embodiments 1 to 9, wherein L¹ is a group selected from the group comprising a substituted or unsubstituted phenylene group, a substituted or unsubstituted biphenylene group, a substituted or unsubstituted terphenylene group, a substituted or unsubstituted naphthylene group, a substituted or unsubstituted phenanthrylene group, and a substituted or unsubstituted fluorenylene group.

Embodiment 11

The polymer compound as found in any one of embodiments 1 to 10, wherein R³ is a substituted or unsubstituted aryl group having 6 to 60 ring carbon atoms.

Embodiment 12

The polymer compound as found in any one of embodiments 1 to 11, wherein R¹ and R² are a substituted or unsubstituted aryl group having 6 to 60 ring carbon atoms, and bonded to the 3$^{rd}$ or the 6$^{th}$ position of the carbazole ring.

Embodiment 13

The polymer compound as found in any one of embodiments 1 to 12 which has a structure shown by the following formula (14) or (15):

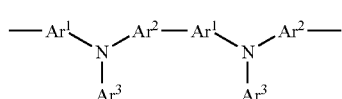

(14)

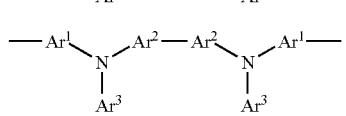

(15)

wherein Ar¹, Ar² and Ar³ are as defined in the formula (1).

Embodiment 14

The polymer compound as found in any one of embodiments 1 to 13 which comprises at least one of the repeating units shown by the following formulas (16) to (19).

(16)

(17)

(18)

(19)

wherein $Ar^4$, $Ar^5$, $Ar^6$ and $Ar^7$ are independently an arylene group, a divalent heterocyclic group or a divalent group having a metal complex; $X^1$, $X^2$ and $X^3$ are independently —$CR^4$=$CR^5$—, —C≡C—, —$N(R^6)$—, —$(SiR^7R^8)_m$— or —$C(R^9R^{10})$—; $R^4$ and $R^5$ are independently a hydrogen atom, an alkyl group, an aryl group, a monovalent heterocyclic group, a carboxyl group, a substituted carboxyl group, or a cyano group; $R^6$ to $R^{10}$ are independently a hydrogen atom, an alkyl group, an aryl group, a monovalent heterocyclic group, an arylalkyl group or a group containing a substituted amino group; l is an integer of 1 or 2; m is an integer of 1 to 12; and when each of $R^4$ to $R^{10}$ plurally exist, they may be the same or may differ.

Embodiment 15

A material for an organic electroluminescence device which comprises the polymer compound as found in any one of embodiments 1 to 14.

Embodiment 16

The material for an organic electroluminescence device as found in embodiment 15, which is for a hole-transporting layer or a hole-injecting layer.

Embodiment 17

An organic electroluminescence device comprising:
an anode;
a cathode; and
one or more organic thin film layers comprising an emitting layer between the anode and the cathode, at least one of the organic thin film layers comprising the material for an organic electroluminescence device as found in embodiment 15.

Embodiment 18

The organic electroluminescence device as found in embodiment 17, further comprising at least one of a hole-transporting layer and a hole-injecting layer between the anode and the emitting layer, the hole-transporting layer and the hole-injecting layer comprising the material for an organic electroluminescence device as found in embodiment 16.

An organic EL device using the polymer compound of the invention as a material for an organic EL device has a high luminous efficiency and a long life.

BRIEF DESCRIPTION OF THE DRAWINGS

FIG. 1 is a schematic cross sectional view of an organic EL device as one embodiment of the invention.

BEST MODE FOR CARRYING OUT THE INVENTION

The polymer compound of the invention is characterized by being a polymer compound containing a repeating unit shown by the following formula (1), and at least one of $Ar^1$, $Ar^2$ and $Ar^3$ of the formula (1) is a group shown by formula (2).

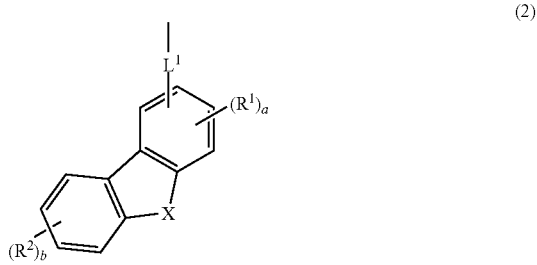

In the repeating unit shown by the formula (1), each of two bonds at the time of polymerization presents on any of $Ar^1$, $Ar^2$, $Ar^3$ and $L^1$. The bonds may be present on one of $Ar^1$, $Ar^2$, $Ar^3$ and $L^1$. That is, in the adjacent repeating units shown by the formula (1), each bond may be formed by any of $Ar^1$, $Ar^2$, $Ar^3$ and $L^1$.

In the formula (1), $Ar^1$, $Ar^2$ and $Ar^3$ are independently a group shown by the formula (2), a substituted or unsubstituted aromatic hydrocarbon group having 6 to 60 (preferably 6 to 18) ring carbon atoms or a substituted or unsubstituted aromatic heterocyclic group having 5 to 60 (preferably 5 to 20) ring atoms. These groups become any of mono to trivalent groups according to the position of the bonds at the time of polymerization. Examples of the monovalent group are mainly shown below. As for the divalent and trivalent groups, the same groups can be exemplified except for the number of valence.

Examples of the aromatic hydrocarbon group shown by $Ar^1$, $Ar^2$ and $Ar^3$ include a phenyl group, a 1-naphthyl group, a 2-naphthyl group, a 1-anthracenyl group, a 2-anthracenyl group, a 9-anthracenyl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group and a fluorenyl group.

Of the above-mentioned groups, a benzene ring or those in which a plurality of benzene rings are fused are preferable. For example, aromatic hydrocarbon rings such as a benzene ring, a naphthalene ring, an anthracene ring, a tetracene ring, a pentacene ring, a pyrene ring, and a phenanthrene ring can be given. Of these, a benzene ring, a naphthalene ring, an anthracene ring and a phenanthrene ring are preferable.

As the aromatic heterocyclic group shown by $Ar^1$, $Ar^2$ and $Ar^3$, a thiophenylyl group, a 1-phenylthiophenylyl group, a 1,4-diphenylthiophenylyl group, a benzothiophenylyl group, a 1-phenylbenzothiophenylyl group, a 1,8-diphenylbenzothiophenylyl group, a furyl group, a 1-phenyldibenzothiophenylyl group, a 1,8-diphenylthiophenylyl group, a furyl group, a dibenzofuranyl group, a 1-phenyldibenzofuranyl group, a 1,8-diphenyldibenzofuranyl group, a benzothiazolyl group can be given. Further preferably, a dibenzofuranyl group, a dibenzothiophenylyl group, a 1-phenylthiophenylyl group, a 1-phenylbenzothiophenylyl group, a 1-phenyldibenzofuranyl group, a benzothiazolyl group, or the like can be given.

When an aromatic hydrocarbon group and an aromatic heterocyclic group have a substituent, in view of solubility in an organic solvent, device characteristics, easeness in synthesis, etc., it is preferred that the substitutent be selected from an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group.

The above-mentioned alkyl group may be linear, branched or cyclic, and has normally about 1 to 20 carbon atoms, preferably 3 to 20 carbon atoms. Specific examples thereof include a methyl group, an ethyl group, a propyl group, and i-propyl group, a butyl group, an i-butyl group, a t-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a lauryl group, a trifluoromethyl group, a pentafluoroethyl group, a perfluorobutyl group, a perfluorohexyl group and a perfluorooctyl group. In respect of well-balanced solubility in an organic solvent, device performance, easiness of synthesis or the like and thermal resistance, a pentyl group, an isoamyl group, a hexyl group, an octyl group, a 2-ethylhexyl group, a decyl group and a 3,7-dimethyloctyl group are preferable.

The alkoxy group may be linear, branched or cyclic, and has normally about 1 to 20 carbon atoms, preferably 3 to 20 carbon atoms. The specific examples thereof include a methoxy group, an ethoxy group, a propyloxy group, an i-propyloxy group, a butoxy group, an i-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group and a 2-methoxy ethyloxy group. In respect of well-balanced solubility in an organic solvent, device performance, easiness in synthesis or the like and thermal resistance, a pentyloxy group, a hexyloxy group, an octyloxy group, 2-ethyl hexyloxy group, a decyloxy group, and a 3,7-dimethyloctyloxy group are preferable.

The alkylthio group may be linear, branched or cyclic, and normally has about 1 to 20 carbon atoms, preferably 3 to 20 carbon atoms. Specific examples thereof include a methylthio group, an ethylthio group, a propylthio group, an i-propylthio group, a butylthio group, an i-butylthio group, a t-butylthio group, a pentylthio group, a hexylthio group, a cyclohexylthio group, a hepthylthio group, an octylthio group, a 2-ethylhexylthio group, a nonylthio group, a decylthio group, a 3,7-dimethyloctylthio group, a laurylthio group and a trifluoromethylthio group. In respect of well-balanced solubility in an organic solvent, device performance, easiness in synthesis or the like and thermal resistance, a pentylthio group, a hexylthio group, an octylthio group, a 2-ethylhexylthio group, a decylthio group and a 3,7-dimethyloctylthio group are preferable.

An aryl group is a group of atoms obtained by removing one hydrogen atom from an aromatic hydrocarbon, and includes those with a fused ring and those in which two or more independent benzene rings or fused rings are bonded directly or through a group such as vinylene. An aryl group normally has about 6 to 60 carbon atoms, preferably 7 to 48 carbon atoms. As the specific examples thereof, a phenyl group, a $C_1$-$C_{12}$ alkoxyphenyl group ($C_1$-$C_{12}$ means that the number of carbon atoms is 1 to 12, the same is applied below), a $C_1$-$C_{12}$ alkylphenyl group, a 1-naphthyl group, a 2-naphthyl group, a 1-anthracenyl group, a 2-anthracenyl group, 9-anthracenyl group, a pentafluorophenyl group, etc. can be exemplified. In respect of solubility in an organic solvent, device performance, easiness in synthesis or the like, a $C_1$-$C_{12}$ alkoxyphenyl group and a $C_1$-$C_{12}$ alkylphenyl group are preferable.

As the specific examples of the $C_1$-$C_{12}$ alkoxy, methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy, etc. are exemplified.

As the specific examples of the $C_1$-$C_{12}$ alkylphenyl group, a methylphenyl group, an ethylphenyl group, a dimethylphenyl group, a propylphenyl group, a mesityl group, a methylethylphenyl group, an i-propylphenyl group, a buthylphenyl group, an i-butylphenyl group, a t-butylphenyl group, a pentylphenyl group, an isoamylphenyl group, a hexylphenyl group, a heptylphenyl group, an octylphenyl group, a nonylphenyl group, a decylphenyl group, a dodecylphenyl group, etc. are exemplified.

The aryloxy group normally has about 6 to 60 carbon atoms, preferably 7 to 48 carbon atoms. As the specific examples, a phenoxy group, a $C_1$-$C_{12}$ alkoxyphenoxy group, a $C_1$-$C_{12}$ alkylphenoxy group, a 1-naphthyloxy group, a 2-naphthyloxy group, a pentafluorophenyloxy group, etc. are exemplified. In respect of solubility in an organic solvent, device performance, easiness in synthesis or the like, a $C_1$-$C_{12}$ alkoxyphenoxy group and a $C_1$-$C_{12}$ alkylphenoxy group are preferable.

As the specific example of the $C_1$-$C_{12}$ alkoxy, methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy, etc. are exemplified.

As the specific examples of the $C_1$-$C_{12}$ alkylphenoxy group, a methylphenoxy group, an ethylphenoxy group, a dimethylphenoxy group, a propylphenoxy group, 1,3,5-trimethylphenoxy group, a methylethylphenoxy group, an i-propylphenoxy group, a butylphenoxy group, an i-butylphenoxy group, a t-butylphenoxy group, a pentylphenoxy group, an isoamylphenoxy group, a hexylphenoxy group, a heptylphenoxy group, an octylphenoxy group, a nonylphenoxy group, a decylphenoxy group, a dodecyphenoxy group, etc. are exemplified.

The arylthio group normally has about 3 to 60 carbon atoms, and as the specific examples thereof, a phenylthio group, $C_1$-$C_{12}$ alkoxyphenylthio group, a $C_1$-$C_{12}$ alkylphenylthio group, a 1-naphthylthio group, a 2-naphthylthio group, and a pentafluorophenylthio group, etc. are exemplified. In respect of solubility in an organic solvent, device performance, easiness in synthesis or the like, a $C_1$-$C_{12}$ alkoxyphenylthio group and a $C_1$-$C_{12}$ alkylphenylthio group are preferable.

The arylalkyl group normally has about 7 to 60 carbon atoms, preferably 7 to 48 carbon atoms. As the specific examples, a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group, a 2-naphthyl-$C_1$-$C_{12}$ alkyl group, etc. are exemplified. In respect of solubility in an organic solvent, device performance, easiness in synthesis or the like, the $C_1$-$C_{12}$ alkoxyphenyl-$C_1$-$C_{12}$ alkyl group and a $C_1$-$C_{12}$ alkylphenyl-$C_1$-$C_{12}$ alkyl group are preferable.

The arylakoxy group normally has about 7 to 60 carbon atoms, preferably 7 to 48 carbon atoms. As the specific examples thereof, a phenyl $C_1$-$C_{12}$ alkoxy groups such as a phenylmethoxy group, a phenylethoxy group, a phenylbutoxy group, a phenylpentyloxy group, a phenylhexyloxy group, a phenylheptyloxy group and a phenyloctyloxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphthyl-$C_1$-$C_{12}$ alkoxy group, a 2-naphthyl-$C_1$-$C_{12}$ alkoxy group, etc. are exemplified. In respect of solubility in an organic solvent, device performance, easiness in synthesis or the like, a $C_1$-$C_{12}$ alkoxyphenyl-$C_1$-$C_{12}$ alkoxy group and a $C_1$-$C_{12}$ alkylphenyl-$C_1$-$C_{12}$ alkoxy group are preferable.

The arylalkylthio group normally has about 7 to 60 carbon atoms, preferably 7 to 48 carbon atoms. As the specific examples thereof, a phenyl-$C_1$-$C_{12}$ alkylthio group, a $C_1$-$C_{12}$ alkoxyphenyl-$C_1$-$C_{12}$ alkylthio group, a $C_1$-$C_{12}$ alkylphenyl-$C_1$-$C_{12}$ alkylthio group, a 1-naphthyl-$C_1$-$C_{12}$ alkylthio group, a 2-naphthyl-$C_1$-$C_{12}$ alkylthio group, etc. are exemplified. In respect of solubility in an organic solvent, device performance, easiness in synthesis or the like, a $C_1$-$C_{12}$ alkoxyphenyl-$C_1$-$C_{12}$ alkylthio group and a $C_1$-$C_{12}$ alkylphenyl-$C_1$-$C_{12}$ alkylthio group are preferable.

The arylalkenyl group normally has about 8 to 60 carbon atoms. As the specific examples thereof, a phenyl-$C_2$-$C_{12}$ alkenyl group, a $C_1$-$C_{12}$ alkoxyphenyl-$C_2$-$C_{12}$ alkenyl group, a $C_1$-$C_{12}$ alkylphenyl-$C_2$-$C_{12}$ alkenyl group, a 1-naphthyl-$C_2$-$C_{12}$ alkenyl group, a 2-naphthyl-$C_2$-$C_{12}$ alkenyl group, etc. are exemplified. In respect of solubility in an organic solvent, device performance, easiness in synthesis or the like, a $C_1$-$C_{12}$ alkoxyphenyl-$C_2$-$C_{12}$ alkenyl group and a $C_2$-$C_{12}$ alkylphenyl-$C_1$-$C_{12}$ alkenyl group are preferable.

The arylalkynyl group has normally 8 to 60 carbon atoms. As the specific examples thereof, a phenyl $C_2$-$C_{12}$ alkynyl group, a $C_1$-$C_{12}$ alkoxyphenyl-$C_2$-$C_{12}$ alkynyl group, a $C_1$-$C_{12}$ alkylphenyl-$C_2$-$C_{12}$ alkynyl group, a 1-naphthyl-$C_2$-$C_{12}$ alkynyl group, a 2-naphthyl-$C_2$-$C_{12}$ alkynyl group, etc. are exemplified. In respect of solubility in an organic solvent, device performance, easiness in synthesis or the like, a $C_1$-$C_{12}$ alkoxyphenyl-$C_2$-$C_{12}$ alkynyl group and a $C_1$-$C_{12}$ alkylphenyl-$C_2$-$C_{12}$ alkynyl group are preferable.

As the substituted amino group, a amino group which is substituted by one or two groups selected from an alkyl group, an aryl group, an arylalkyl group or a monovalent heterocyclic group can be given. The alkyl group, the aryl group, the arylalkyl group or the monovalent heterocyclic group may have a substituent. The substituted amino group normally has about 1 to 60 carbon atoms, preferably 2 to 48 carbon atoms, excluding the number of carbons of the substitutent.

As the specific examples thereof, a methylamino group, a dimethylamino group, an ethylamino group, a diethylamino group, a propylamino group, a dipropylamino group, an i-propylamino group, a diisopropylamino group, a butylamino group, an i-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a $C_1$-$C_{12}$ alkoxyphenylamino group, a di($C_1$-$C_{12}$ alkoxyphenyl)amino group, a di($C_1$-$C_{12}$alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-$C_1$-$C_{12}$ alkylamino group, a $C_1$-$C_{12}$ alkoxyphenyl-$C_1$-$C_{12}$ alkylamino group, a $C_1$-$C_{12}$ alkylphenyl-$C_1$-$C_{12}$ alkylamino group, a di($C_1$-$C_{12}$ alkoxyphenyl-$C_1$-$C_{12}$ alkyl)amino group, a di($C_1$-$C_{12}$ alkylphenyl-$C_1$-$C_{12}$ alkyl)amino group, a 1-naphthyl-$C_1$-$C_{12}$ alkylamino group, a 2-naphthyl-$C_1$-$C_{12}$ alkylamino group, etc. are exemplified.

As the substituted silyl group, a silyl group which is substituted by one, two or three groups selected from an alkyl group, an aryl group, an arylalkyl group or a monovalent heterocyclic group can be given. The substituted silyl group normally has about 1 to 60 carbon atoms, preferably 3 to 48 carbon atoms. The alkyl group, the aryl group, the arylalkyl group or the monovalent heterocyclic group may have a substituent.

As the specific examples thereof, a trimethylsilyl group, a triethylsilyl group, and a tripropylsilyl group, a tri-i-propylsilyl group, a dimethyl-i-propylsilyl group, a diethyl-i-propylsilyl group, a t-butylsilyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyl-dimethylsilyl group, a lauryldimethylsilyl group, a phenyl-$C_1$-$C_{12}$ alkylsilyl group, a $C_1$-$C_{12}$alkoxyphenyl-$C_1$-$C_{12}$ alkylsilyl group, a $C_1$-$C_{12}$alkylphenyl-$C_1$-$C_{12}$ alkylsilyl group, a 1-naphthyl-$C_1$-$C_{12}$ alkylsilyl group, a 2-naphthyl-$C_1$-$C_{12}$ alkylsilyl group, a phenyl-$C_1$-$C_{12}$ alkyldimethylsilyl group, a triphenylsilyl group, a tri-p-xylylsilyl group, a tribenzylsilyl group, a diphenylmethylsilyl group, a t-butyldiphenylsilyl group, a dimethylphenylsilyl group, etc. are exemplified.

As examples of the halogen atom, a fluorine atom, chlorine atom, bromine atom or iodine atom can be given.

The acyl group normally has 2 to 20 carbon atoms, preferably 2 to 18 carbon atoms. As the specific examples thereof, an acetyl group, a propionyl group, a butylyl group, an isobutylyl group, a pivaloyl group, a benzoyl group, a trifluoroacetyl group, a pentafluorobenzoyl group, etc. are exemplified.

The acyloxy group normally has about 2 to 20 carbon atoms, preferably 2 to 18 carbon atoms. As the specific examples thereof, an acetoxy group, a propionyloxy group, a butyryloxy group, an isobutyryloxy group, a pivaloyloxy group, a benzoyloxy group, a trifluoroacetyloxy group, a pentafluorobenzoyloxy group, etc. are exemplified.

The imine residue has about 2 to 20 carbon atoms, preferably 2 to 18 carbon atoms. As the specific examples thereof, groups shown by the following structural formula can be given.

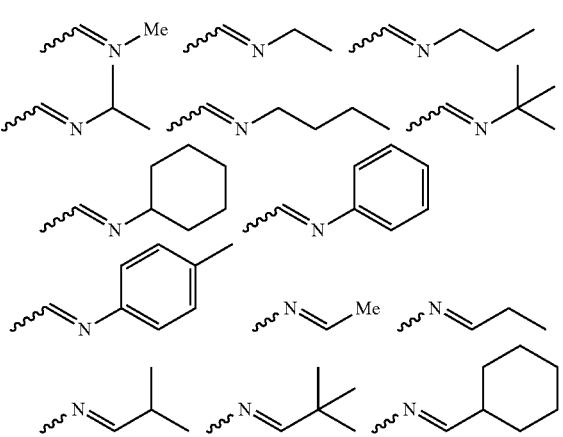

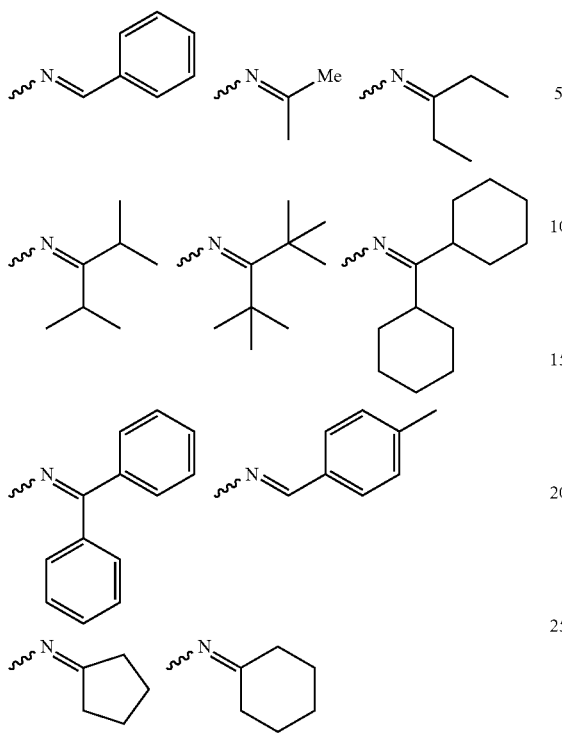

The amide group normally has about 2 to 20 carbon atoms, preferably 2 to 18 carbon atoms. As the specific examples thereof, a formamide group, an acetamide group, and a propioamide group, a butyroamide group, a benzamide group, a trifluoroacetamide group, a pentafluorobenzamide group, a diformamide group, a diacetoamide group, a dipropioamide group, a dibutyroamide group, a dibenzamide group, a ditrifluoroacetamide group and a dipentafluorobenzamide group are exemplified.

As the acid imide group, residues obtained by removing from an acid imide a hydrogen atom which bonds to the nitrogen atom thereof can be given. They have normally about 4 to 20 carbon atoms. As the specific examples thereof, the following groups or the like can be exemplified.

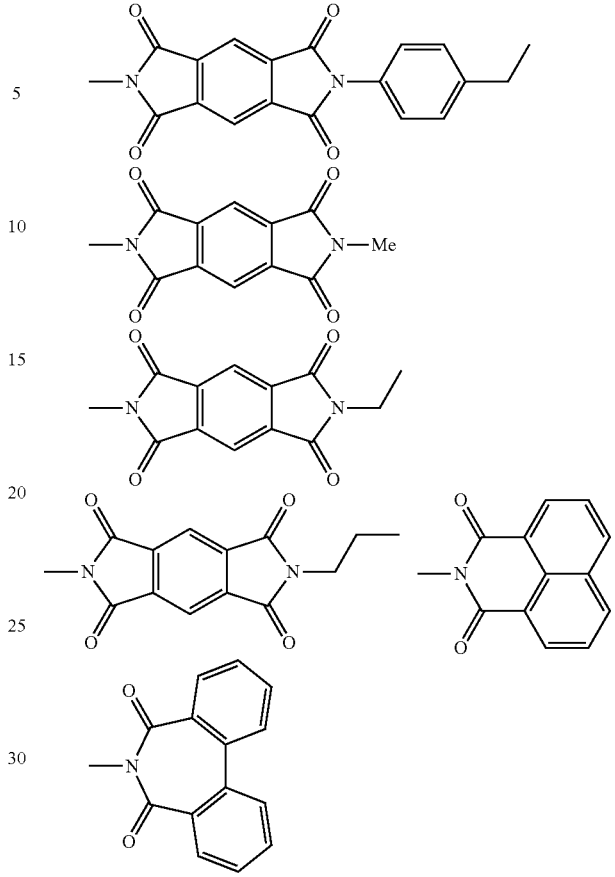

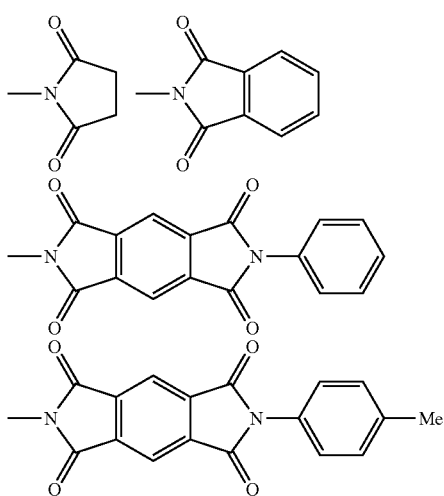

The monovalent heterocyclic group means a group of atoms obtained by removing one hydrogen atom from a heterocyclic compound. It has normally about 4 to 60 carbon atoms, preferably 4 to 20 carbon atoms. The number of carbon atoms of the heterocyclic group does not include the number of carbon atoms of the substituent. Here, the heterocyclic compound means, of organic compounds having a cyclic structure, as an element constituting the ring, those having not only a carbon atom but also a hetero atom such as oxygen, sulfur, nitrogen, phosphor and boron within the ring. Specifically, a thienyl group, a $C_1$-$C_{12}$ alkylthienyl group, a pyrrolyl group, a furyl group, a pyridyl group, a $C_1$-$C_{12}$ alkylpyridyl group, a piperidyl group, a quinolyl group, an isoquinolyl group, etc. are exemplified, with a thienyl group, a $C_1$-$C_{12}$ alkylthienyl group, a pyridyl group and a $C_1$-$C_{12}$ alkylpyridyl group being preferable.

As the substituted carboxyl group, a carboxyl group substituted by an alkyl group, an aryl group, an arylalkyl group or a monovalent heterocyclic group can be given. It has normally about 2 to 60 carbon atoms, preferably 2 to 48 carbon atoms. As the specific examples thereof, a methoxycarbonyl group, an ethoxycarbonyl group, a propoxycarbonyl group, an i-propoxycarbonyl group, a butoxycarbonyl group, an i-butoxycarbonyl group, a t-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, a pyridyloxycarbonyl group, etc. can be given. The alkyl group, the aryl group, the arylalkyl group or the monovalent heterocyclic group may have a substituent. The number of carbon atoms of the substituted carboxyl group does not include the number of carbon atoms of the substituent.

In the formula (2), $L^1$ is a substituted or unsubstituted aromatic hydrocarbon group having 6 to 60 (preferably 6 to 18) ring carbon atoms, a substituted or unsubstituted fluorene group or a substituted or unsubstituted aromatic heterocyclic group having 5 to 60 (preferably 5 to 20) ring atoms. These groups become any of di- to tetravalent groups according to the position of the bonds at the time of polymerization (except for a single bond). Mainly, examples of the divalent group are given below. However, the same group as the divalent groups except for the number of valence can be exemplified as the trivalent and the tetravalent groups.

Thus, by introducing the group shown by the formula (2) into the formula (1), the resulting polymer layer exhibit increased film adhesion to adjacent layers, whereby luminous efficiency and life are improved.

Preferably, as the aromatic hydrocarbon group shown by $L^1$, a phenylene group, a biphenylene group, a terphenylene group, a quarter phenylene group, a naphthylene group, an anthracenylene group, a phenanthrylene group, a chrycenylene group, a pyrenylene group, a perilenylene group, a fluorenylene group, etc. can be given. Of these, a phenylene group, a biphenylene group, a terphenylene group, a fluorenylene group, a naphthylene group and a phenanthrylene group are preferable, with a phenylene group, a biphenylene group, a terphenylene group, a naphthylene group, a phenanthrylene group or a fluorenylene group are further preferable.

As the aromatic heterocyclic group, a thiophenylyl group, a 1-phenylthiophenylyl group, a 1,4-diphenylthiophenylyl group, a benzothiophenylyl group, a 1-phenylbenzothiophenylyl group, a 1,8-diphenylbenzothiophenylyl group, a furyl group, a 1-phenyldibenzothiophenylyl group, a 1,8-diphenylthiophenylyl group, a furyl group, a dibenzofuranyl group, a 1-phenyldibenzofuranyl group, a 1,8-diphenyldibenzofuranyl group and a benzothiazolyl group are preferable. A dibenzofuranyl group, a dibenzothiophenylyl group, a 1-phenylthiophenylyl group, a 1-phenylbenzothiophenylyl group, a 1-phenyldibenzofuranyl group or a benzothiazolyl group are further preferable (a divalent or a higher valency group obtained by removing one or more hydrogen or the like from these monovalent groups) are further preferable.

$R^1$ and $R^2$ in the formula (2) are a hydrogen atom, a substituted or unsubstituted aryl group having 6 to 60 (preferably 6 to 30) ring carbon atoms, a substituted or unsubstituted alkyl group having 1 to 50 (preferably 1 to 20) ring carbon atoms, a substituted or unsubstituted alkoxy group having 1 to 50 (preferably 1 to 20) carbon atoms, a substituted or unsubstituted aryloxy group having 6 to 50 (preferably 6 to 20) ring carbon atoms, a substituted or unsubstituted arylthio group having 5 to 50 (preferably 6 to 20) ring atoms, a substituted or unsubstituted alkoxycarbonyl group having 2 to 50 (preferably 2 to 20) carbon atoms, an amino group substituted by a substituted or unsubstituted aryl group having 6 to 50 (preferably 6 to 20) ring carbon atoms, a halogen atom, a cyano group, a nitro group, a hydroxyl group or a carboxyl group.

In the formula (2), for example, it is preferred that $R^1$ and $R^2$ be a substituted or unsubstituted aryl group having 6 to 60 ring carbon atoms and bonded to the third or sixth position of the carbazole skeleton.

Examples of the aryl groups shown by $R^1$ and $R^2$ include a phenyl group, 1-naphthyl group, 2-naphthyl group, 1-anthracenyl group, 2-anthracenyl group, 9-anthracenyl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group and fluorenyl group. Of these, a phenyl group, a 1-naphthyl group, a 2-naphthyl group, a 4-biphenylyl group, a p-terphenyl-4-yl group, a p-tolyl group and a fluorenyl group are preferable.

As the alkyl group shown by $R^1$ and $R^2$, a methyl group, an ethyl group, an iso-propyl group, a tert-butyl group, an n-octyl group, an n-decyl group, an n-hexadecyl group, a cyclopropyl group, a cyclopentyl group, a cyclohexyl group, a vinyl group, an allyl group, a 2-butenyl group, a 3-pentenyl group, a propargyl group, a 3-pentynyl group, etc. can be given. Of these, a methyl group, an ethyl group, an iso-propyl group, a tert-butyl group, a cyclopentyl group and a cyclohexyl group are preferable.

As the alkoxy group shown by $R^1$ and $R^2$, a methoxy group, an ethoxy group, a n-propoxy group, an iso-propoxy group, a n-butoxy group, a tert-butoxy group, etc. can be given, for example. Of these, a methoxy group, an ethoxy group and a tert-butoxy group are preferable.

As the aryloxy group shown by $R^1$ and $R^2$, a phenyloxy group, a 1-naphthyloxy group, a 2-naphthyloxy group, a 4-biphenylyloxy group, a p-terphenyl-4-yloxy group, a p-tolyloxy group, etc. can be given, for example. Of these, a phenyloxy group and a 2-naphthyloxy group are preferable.

As the arylthio group shown by W and $R^2$, a phenylthio group, a 1-naphthylthio group, a 2-naphthylthio group, a 4-biphenylylthio group, a p-terphenyl-4-ylthio group, a p-tollylthio group, etc. can be given, for example. Of these, a phenylthio group and a 2-naphthylthio group are preferable.

As the alkoxycarbonyl group shown by $R^1$ and $R^2$, a methoxycarbonyl group, an ethoxycarbonyl group, a n-propoxycarbonyl group, an iso-propoxycarbonyl group, a n-butoxycarbonyl group, and a tert-butoxycarbonyl group can be given, for example. Of these, a methoxycarbonyl group and an ethoxycarbonyl group are preferable.

As for the amino group substituted by an aryl group shown by $R^1$ and $R^2$, the same amino group substituted by the aryl group shown by $R^1$ and $R^2$ or the like can be given.

As the amino group shown by $R^1$ and $R^2$, an amino group, a methylamino group, a dimethylamino group, a diethylamino group, a dibenzylamino group or the like can be given. Of these, a dimethylamino group and a diethylamino group are preferable.

As the halogen atom shown by $R^1$ and $R^2$, a fluorine atom, a chlorine atom, a bromine atom and an iodine atom can be given, for example.

It is preferred that $R^1$ and $R^2$ be a hydrogen atom, a phenyl group, a biphenylyl group, a terphenylyl group, an α-naphthyl group, a β-naphthyl group, a methyl group, an ethyl group, a propyl group, an isopropyl group and an arylamino group.

Each of these groups may further be substituted. If two or more of these groups are present, these groups may be the same or different. If possible, they may be combined to form a ring.

The X in the formula (2) is a substituted or unsubstituted hetero atom. A hetero atom means an atom other than hydrogen and carbon. Preferably, the hetero atom is P, As, Sb, Bi, O, S, Se, Te, Po, Si and B. More preferably, the hetero atom is N, O and S. The substitutent for the hetero atom is the same as the substitutent of the above-mentioned aromatic hydrocarbon group and the aromatic heterocyclic group shown by $Ar^1$ or the like.

If X is a nitrogen atom, a group shown by the following formula (3) is preferable.

$R^3$ in the formula (3) is a substituted or unsubstituted aryl group having 6 to 60 (preferably 6 to 18) ring carbon atoms or a substituted or unsubstituted alkyl group having 1 to 50 (preferably 1 to 6) carbon atoms. $R^3$ is preferably a substituted or unsubstituted aryl group.

Examples of the aryl group shown by $R^3$ include a phenyl group, 1-naphthyl group, 2-naphthyl group, 1-anthracenyl group, 2-anthracenyl group, 9-anthracenyl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, and 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4''-t-butyl-p-terphenyl-4-yl group. Of these, a phenyl group, a 1-naphthyl group, a 2-naphthyl group, a 4-biphenylyl group, a p-terphenyl-4-yl group are preferable, with a phenyl group, a biphenylyl group, a terphenylyl group, an α-naphthyl group, a β-naphthyl group and a phenanthryl group being still more preferable.

As the alkyl group shown by $R^3$, a methyl group, an ethyl group, an iso-propyl group, a tert-butyl group, an n-octyl group, an n-decyl group, an n-hexadecyl group, a cyclopropyl group, a cyclopentyl group, a cyclohexyl group, a vinyl group, an allyl group, a 2-butenyl group, a 3-pentenyl group, a propargyl group, a 3-pentynyl group, etc. can be given. Of these, a methyl group, an ethyl group, an iso-propyl group, a tert-butyl group, a cyclopentyl group and a cyclohexyl group are preferable.

As the substituent for each group shown by $L^1$, $R^1$, $R^2$ and $R^3$, for example, an alkyl group (preferably one having 1 to 20 carbon atoms, more preferably 1 to 12 carbon atoms, and particularly preferably one having 1 to 8 carbon atoms can be given, and the specific examples thereof include methyl, ethyl, isopropyl, tert-butyl, n-octyl, n-decyl, n-hexadecyl, cyclopropyl, cyclopentyl and cyclohexyl); an alkenyl group (preferably one having 2 to 20 carbon atoms, more preferably one having 2 to 12 carbon atoms, and particularly preferably one having 2 to 8 carbon atoms can be given, and the specific examples thereof include vinyl, allyl, 2-butenyl and 3-pentenyl); an alkynyl group (preferably one having 2 to 20 carbon atoms, more preferably one having 2 to 12 carbon atoms, and particularly preferably one having 2 to 8 carbon atoms can be given, and the specific examples thereof include propargyl and 3-pentynyl); an amino group (preferably one having 0 to 20 carbon atoms, more preferably one 0 to 12 carbon atoms, and particularly preferably one having 0 to 6 carbon atoms can be given, and the specific examples thereof include amino, methylamino, dimethylamino, diethylamino, diphenylamino and dibenzylamino); an alkoxy group (preferably one having 1 to 20 carbon atoms, more preferably one having 1 to 12 carbon atoms, and particularly preferably one having 1 to 8 carbon atoms can be given, and the specific examples thereof include methoxy, ethoxy and butoxy); an aryloxy group (preferably one having 6 to 20 carbon atoms, more preferably one having 6 to 16 carbon atoms, and particularly preferably one having 6 to 12 carbon atoms can be given, and the specific examples thereof include phenyloxy and 2-naphthyloxy); an acyl group (preferably one having 1 to 20 carbon atoms, more preferably one having 1 to 16 carbon atoms, and particularly preferably one having 1 to 12 carbon atoms can be given, and the specific examples thereof include acetyl, benzoyl, formyl and pivaloyl); an alkoxycarbonyl group (preferably one having 2 to 20 carbon atoms, more preferably one having 2 to 16 carbon atoms and particularly preferably one having 2 to 12 carbon atoms can be given, and the specific examples thereof include methoxycarbonyl and ethoxycarbonyl); an aryloxycarbonyl group (preferably one having 7 to 20 carbon atoms, more preferably one having 7 to 16 carbon atoms, and particularly preferably one having 7 to 10 carbon atoms can be given, and the specific examples thereof include phenyloxycarbonyl); an acyloxy group (preferably one having 2 to 20 carbon atoms, more preferably one having 2 to 16 carbon atoms, and particularly preferably 2 to 10 carbon atoms can be given, and the specific examples thereof include acetoxy and benzoyloxy); an acylamino group (preferably one having 2 to 20 carbon atoms, more preferably one having 2 to 16 carbon atoms, and particularly preferably one having 2 to 10 carbon atoms can be given, and the specific examples thereof include acetylamino and benzoylamino); an alkoxycarbonylamino group (preferably one having 2 to 20 carbon atoms, more preferably one having 2 to 16 carbon atoms, and particularly preferably one having 2 to 12 carbon atoms can be given, and the specific examples thereof include methoxycarbonylamino); an aryloxycarbonylamino group (preferably one having 7 to 20 carbon atoms, more preferably one having 7 to 16 carbon atoms, and particularly preferably one having 7 to 12 carbon atoms can be given and the specific examples thereof include phenyloxycarbonylamino); a sulfonylamino group (preferably one having 1 to 20 carbon atoms, more preferably one having 1 to 16 carbon atoms, and particularly preferably one having 1 to 12 carbon atoms can be given, and the specific examples thereof include methanesulfonylamino and benzenesulfonylamino); a sulfamoyl group (preferably one having 0 to 20 carbon atoms, more preferably one having 0 to 16 carbon atoms, and particularly preferably one having 0 to 12 carbon atoms can be given, and the specific examples thereof include sulfamoyl, methylsulfamoyl, dimethylsulfamoyl and phenylsulfamoyl); a carbamoyl group (preferably one having 1 to 20 carbon atoms, more preferably one having 1 to 16 carbon atoms and particularly preferably one having 1 to 12 carbon atoms can be given, and the specific examples thereof include carbamoyl, methylcarbamoyl, diethylcarbamoyl and phenylcarbamoyl); an alkylthio group (preferably one having 1 to 20 carbon atoms, more preferably one having 1 to 16 carbon atoms, and particularly preferably one having 1 to 12 carbon atoms, and the specific examples thereof include methylthio and ethylthio); an arylthio group (preferably one having 6 to 20 carbon atoms, more preferably one having 6 to 16 carbon atoms and particularly preferably one having 6 to 12 carbon atoms can be given, and the specific examples thereof include phenylthio); a sulfonyl group (preferably one having 1 to 20 carbon atoms, more preferably one having 1 to 16 carbon atoms, and particularly preferably one having 1 to 12 carbon atoms can be given, and the specific examples thereof include mesyl and tosyl); a sulfinyl group (preferably one having 1 to 20 carbon atoms, more preferably one having 1 to 16 carbon atoms, and particularly preferably one having 1 to 12 carbon atoms can be given, and the specific examples thereof include methanesulfinyl and benzenesulfinyl); an ureido group (preferably one having 1 to 20 carbon atoms, more preferably one having 1 to 16 carbon atoms, and particularly preferably one having 1 to 12 carbon atoms can be given, and the specific examples thereof include ureide, methylureide and phenylureide); a phosphoric amide group (preferably one having 1 to 20 carbon atoms, more preferably having 1 to 16 carbon atoms, and particularly preferably one having 1 to 12 carbon atoms can be given, and the specific examples thereof include diethylphosphoric amide and phenylphosphoric amide), a hydroxy group, a mercapto group, a halogen atom (for example, a fluorine atom, a chlorine atom, a bromine atom and an iodine atom); a cyano group, a sulfo group, a carboxyl group, a nitro group, a hydroxamic acid group, a sulfino group, a hydrazino group, an imino group, a heterocyclic group (preferably one having 1 to 30 carbon atoms, more preferably one having 1 to 12 carbon atoms, containing as the hetero atom, a nitrogen atom, an oxygen atom or a sulfur atom, for example, can be given, and the specific examples thereof include imidazolyl, pyridyl, quinolyl, furyl, thienyl, piperidyl, morpholino, benzoxazolyl, benzoimidazolyl and benzothiazolyl); a silyl group (preferably one having 3 to 40 carbon atoms, more preferably one having 3 to 30 carbon atoms, and particularly preferably one having 3 to 24 carbon atoms can be given, and the specific examples thereof include trimethylsilyl and triphenylsilyl). These substituents may further be substituted. If there are two or more substituents, they may be the same or different. If possible, they may be bonded to each other to form a ring.

In the formula (2), a is an integer of 0 to 3 and b is an integer of 0 to 4.

In the polymer compound of the invention, all of $Ar^1$, $Ar^2$ and $Ar^3$ in the formula (1) may be the groups shown by the formula (2). It is preferred that one or more and two or less of $Ar^1$, $Ar^2$ and $Ar^3$ in the formula (1) be a group shown by the formula (2). Further, it is more preferred that only one of $Ar^1$, $Ar^2$ and $Ar^3$ in the formula (1) be a group shown by the formula (2).

In this way, by introducing two, or only one, of the groups shown by the formula (2), the synthesis of a polymer is facilitated, the solubility of the polymer in an organic solvent is improved, applicability is improved, whereby device performance without variations can be obtained (in-plane uniformity is improved).

It is preferred that at least one of the bonds in the formula (1) be present on the group other than the group shown by the formula (2). It is more preferred that two bonds be present on a group other than the group shown by the formula (2). For example, as shown in the following formula (1-a), two bonds are present on $Ar^1$ and $Ar^2$, and $Ar^3$ is a group shown by the formula (2) (here, $Ar^1$ and $Ar^2$ are groups other than those shown by the formula (2), that is, a substituted or unsubstituted aromatic hydrocarbon group having 6 to 60 ring carbon atoms or a substituted or unsubstituted aromatic heterocyclic group having 5 to 60 ring atoms).

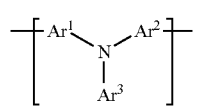

(1-a)

By doing this, the synthesis of the polymer can be conducted further easily, and the solubility of the polymer in an organic solvent is improved, whereby device performance free from variations (in-plane uniformity is improved) can be obtained.

Moreover, when X of the formula (2) is one of N, O and S, it is preferred that the bonding position of $L^1$ and the formula (2) be one of the following formulas (4) to (8). In this way, the resulting polymer layer has improved film adhesiveness with adjacent layers, whereby luminous efficiency and life are further improved.

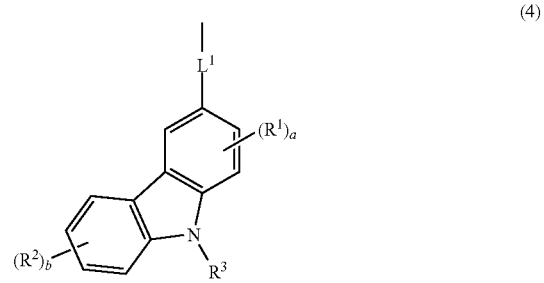

(4)

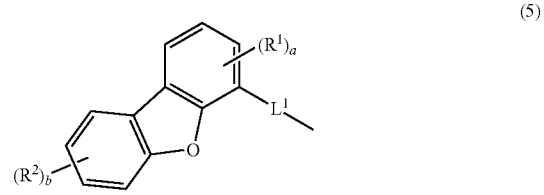

(5)

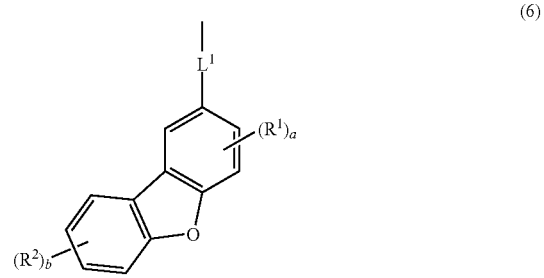

(6)

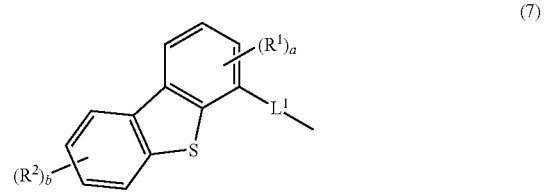

(7)

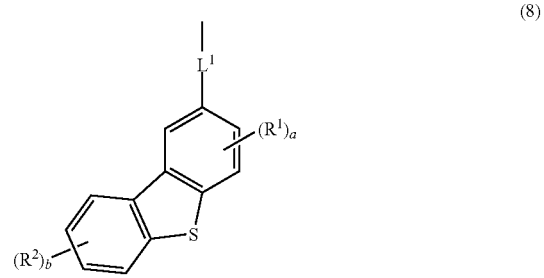

(8)

wherein $L^1$, $R^1$, $R^2$ and $R^3$ are independently the same as that in the formula (2), a is an integer of 0 to 3, and b is an integer of 0 to 4.

It is preferred that the polymer of the invention have the following repeating units (9) to (15).

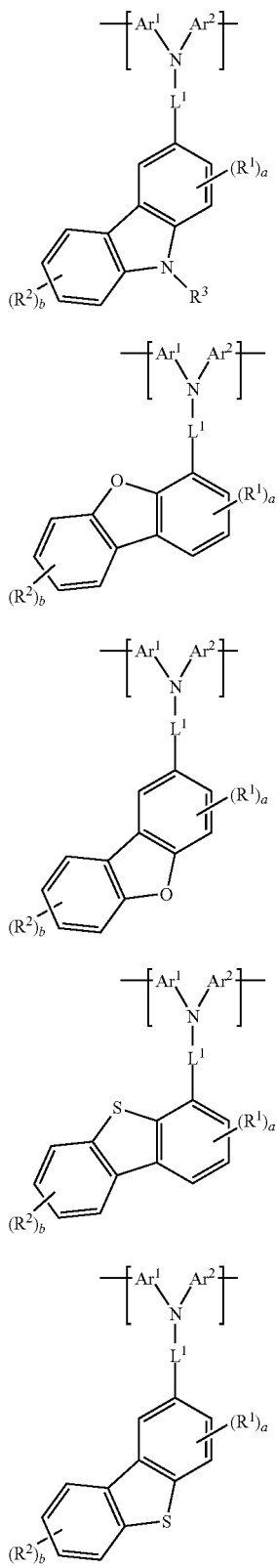

wherein $Ar^1$, $Ar^2$, $L^1$, $R^1$, $R^2$ and $R^3$ are independently the same as that in the formulas (1) to (3), a is an integer of 0 to 3 and b is an integer of 0 to 4.

Further, it is also preferred that the polymer have a repeating unit shown by the following formula (1').

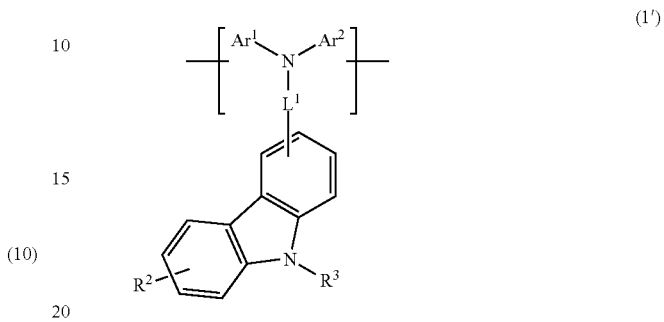

wherein $L^1$, $Ar^1$, $Ar^2$, $R^2$ and $R^3$ are independently the same as that in the formulas (1) to (3).

The repeating unit shown by the formula (1') is preferably one shown by the following formula (1'-1), with one shown by the following formula (1'-2) being particularly preferable.

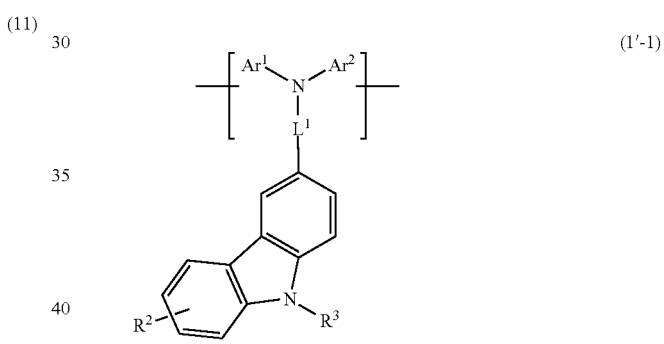

wherein $L^1$, $Ar^1$, $Ar^2$, $R^2$ and $R^3$ are independently the same as that in the formula (1').

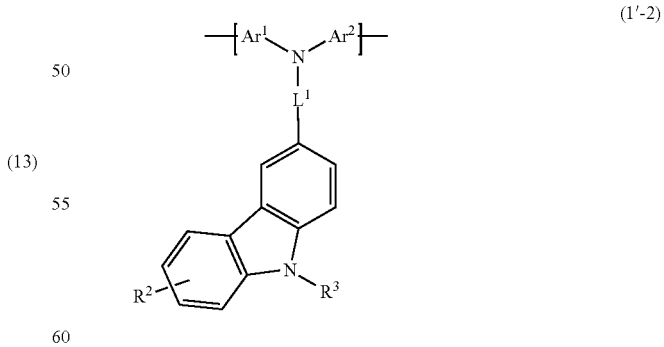

wherein $L^1$, $Ar^1$, $Ar^2$, $R^2$ and $R^3$ are independently the same as that in the formula (1'), but the two bonds are present on $Ar^1$ and $Ar^2$, respectively.

If $Ar^1$ and $Ar^2$ are different groups in the formulas (1-a) and (1'-2), the polymer compound of the invention may contain a structure shown by the following formula (14) or (15).

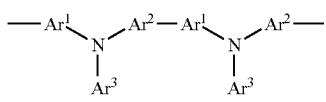
(14)

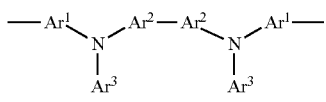
(15)

wherein $Ar^1$, $Ar^2$ and $Ar^3$ are independently the same as that in the formula (1).

The representative examples are shown below.

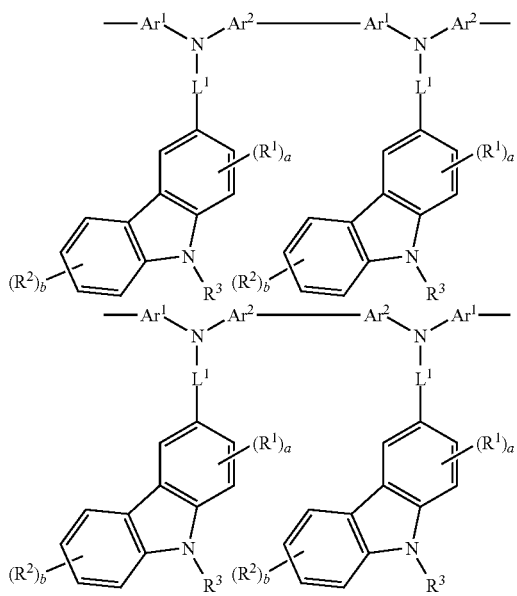

wherein each of $Ar^1$ to $Ar^3$, $L^1$, $R^1$ to $R^3$, a and b are independently the same as that in the formulas (1) to (3).

In respect of changing the emission wavelength, improving luminous efficiency, increasing the heat resistance or the like, the polymer compound of the invention may contain one or more other structural units than the structure shown by the formula (1) contained in the polymer compound of the invention in addition to the structure shown by the formula (1). For example, the structure shown by the following formulas (16) to (19) are preferable.

 (16)

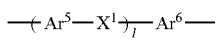 (17)

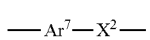 (18)

 (19)

In the formula, $Ar^4$ to $Ar^7$ are independently an arylene group, a divalent heterocyclic group or a divalent group having a metal complex. $X^1$, $X^2$ and $X^3$ are independently —$CR^4$=$CR^5$—, —C≡C—, —N($R^6$)—, —(Si$R^7R^8$)$_m$— or —C($R^9R^{10}$)—. Here, $R^4$ and $R^5$ are independently a hydrogen atom, an alkyl group, an aryl group, a monovalent heterocyclic group, a carboxyl group, a substituted carboxyl group or a cyano group. $R^6$ to $R^{10}$ are independently a hydrogen atom, an alkyl group, an aryl group, a monovalent heterocyclic group, an arylalkyl group or a group which contains a substituted amino group. l is an integer of 1 or 2 and m is an integer of 1 to 12.

If each of $R^4$ to $R^{10}$ is plurally present, they may be the same or different.

The specific examples of the alkyl group, the aryl group, the monovalent heterocyclic group, the substituted carboxyl group, the arylalkyl group or the substituted amino group shown by $R^4$ to $R^{10}$ are the same as the substituents of $Ar^1$, $Ar^2$, and $Ar^3$ in the above formula (1).

The arylene group shown by $Ar^4$ to $Ar^7$ is the group of atoms obtained by removing two hydrogen atoms from the aromatic hydrocarbon, and includes one having a fused ring and one in which two or more independent benzene rings or fused rings are bonded directly or through a group such as vinylene. The arylene group may have a substituent. As for the examples of the substituent, the same substituents as those for $Ar^1$, $Ar^2$ and $Ar^3$ in the formula (1) can be given.

The number of carbon atoms of a part of the arylene group excluding the substituent is normally about 6 to 60, preferably 6 to 20. The total number of carbon atoms of the arylene group including the substituent is normally 6 to 100.

As the arylene group, a phenylene group, a naphthalene-diyl group, an anthracene-diyl group, a biphenyl-diyl group, a fluorene-diyl group, a terphenyl-diyl group, a fused ring compound group, a stylbene-diyl group, a distylbene-diyl group, etc. are exemplified. Of these, a phenylene group, a biphenylene group, a fluorene-diyl group and a stilbene-diyl group are preferable.

The divalent heterocyclic group in $Ar^4$ to $Ar^7$ means the group of atoms obtained by removing two hydrogen atoms from the heterocyclic compound. The group may contain a substituent. Of the divalent heterocyclic groups, an aromatic heterocyclic group is preferable. As for the examples of the substituent, the same substituents as those for $Ar^1$, $Ar^2$ and $Ar^3$ in the formula (1) can be given.

The number of carbon atoms of a part of the divalent heterocyclic group excluding the substituent is normally about 3 to 60. The total number of carbon atoms of the divalent heterocyclic group including the substituent is normally about 3 to 100.

As the divalent heterocyclic group, the following can be given, for example.

(1) A divalent heterocyclic group containing, as the hetero atom, nitrogen (a pyridinediyl group, a diazaphenylene group, a quinolinediyl group, a quinoxalinediyl group, an acrydinediyl group, a bipyridyldiyl group, a phenanthrolinediyl group, or the like) can be given.

(2) A group containing as the hetero atom, oxygen, silicon, nitrogen, selenium or the like and having a fluorene structure can be given.

(3) A five-membered heterocyclic group containing as the hetero atom, oxygen, silicon, nitrogen, sulfur, selenium or the like can be given.

(4) A five-membered fused heterocyclic structure containing as the hetero atom oxygen, silicon, nitrogen, selenium or the like.

(5) A five-membered heterocyclic group containing as the hetero atom oxygen, silicon, nitrogen, sulfur, selenium or the like, which bonds at the α-position of the hetero atom to become a dimer or an oligomer.

(6) A five-membered heterocyclic group containing as the hetero atom oxygen, silicon, nitrogen, sulfur or selenium, which bonds to a phenyl group at the α-position of the hetero atom.

(7) A five-membered heterocyclic group containing as the hetero atom oxygen, nitrogen, sulfur or the like which is substituted by a phenyl group, a furyl group or a thienyl group.

The divalent group having a metal complex structure in $Ar^4$ to $Ar^7$ means the divalent group obtained by removing two hydrogen atoms from an organic ligand of the metal complex having the organic ligand.

The number of carbon atoms of the organic ligand is usually about 4 to 60. Examples thereof include 8-quinolinol and its derivatives, a benzoquinolinol and its derivatives, 2-phenylpyridine and its derivatives, 2-phenyl-benzothiazole and its derivatives, 2-phenyl-benzoxazole and its derivatives, porphyrin and its derivative, etc. can be given.

As the central metal of the complex, for example, aluminum, zinc, beryllium, iridium, platinum, gold, europium, terbium, etc. can be given.

As the metal complex having an organic ligand, a metal complex, a triplet emission complex or the like which are well known as the fluorescence material or the a phosphorescence material with a low molecular weight can be given.

Reference can be made to JP-A-2006-169265 for the specific examples of the structure unit shown by the formulas (16) to (19).

In addition, the polymer compound of the invention may contain a structural unit other than those shown by the formulas (1) and (16) to (19) as far as emission properties or charge-transportation properties are not impaired. Moreover, these repeating units or other repeating units may be connected through non-conjugated units, or these non-conjugated parts may be contained in the repeating unit.

The specific examples of the polymer compound of the invention are shown below. In addition, the invention is not limited to these illustrated compounds.

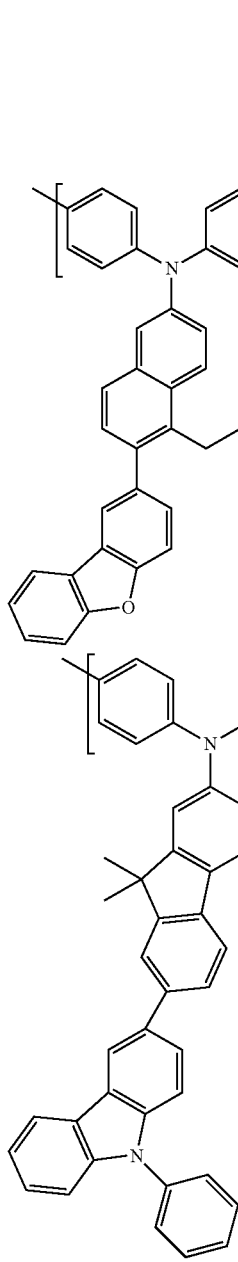

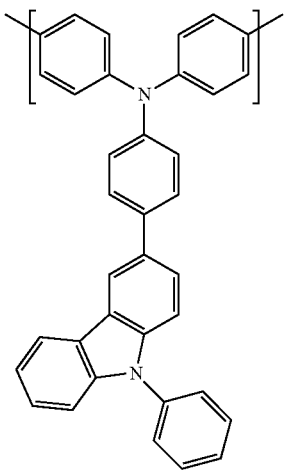

-continued
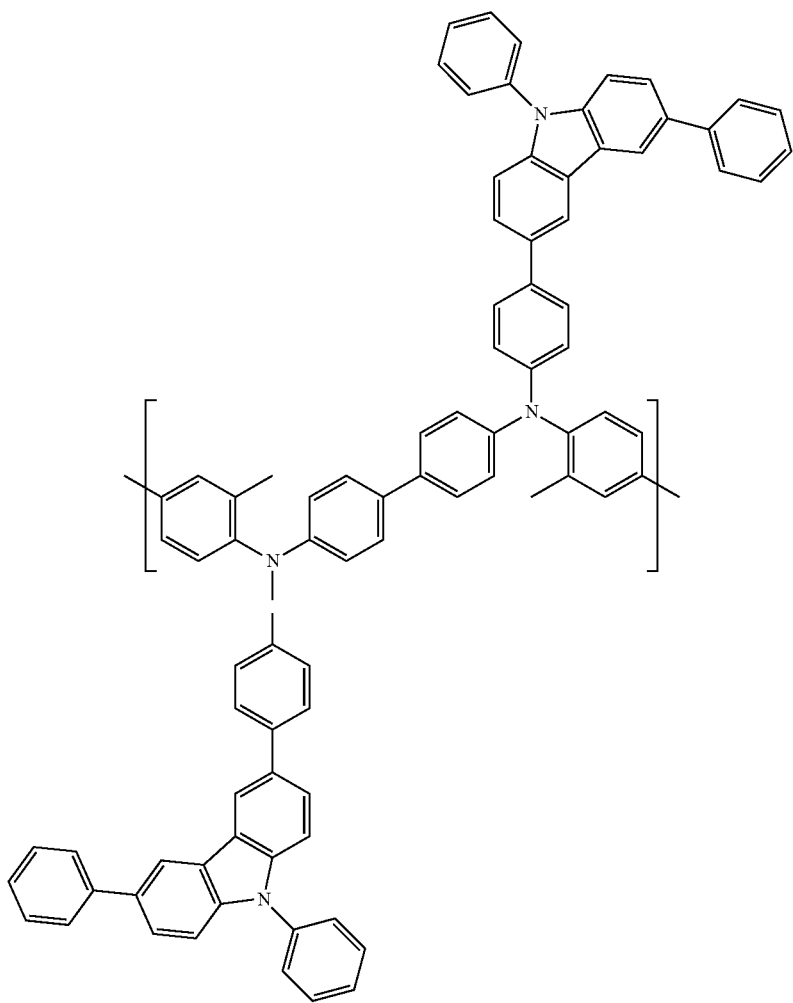
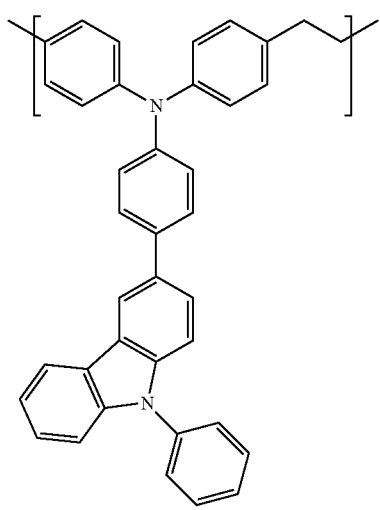

-continued
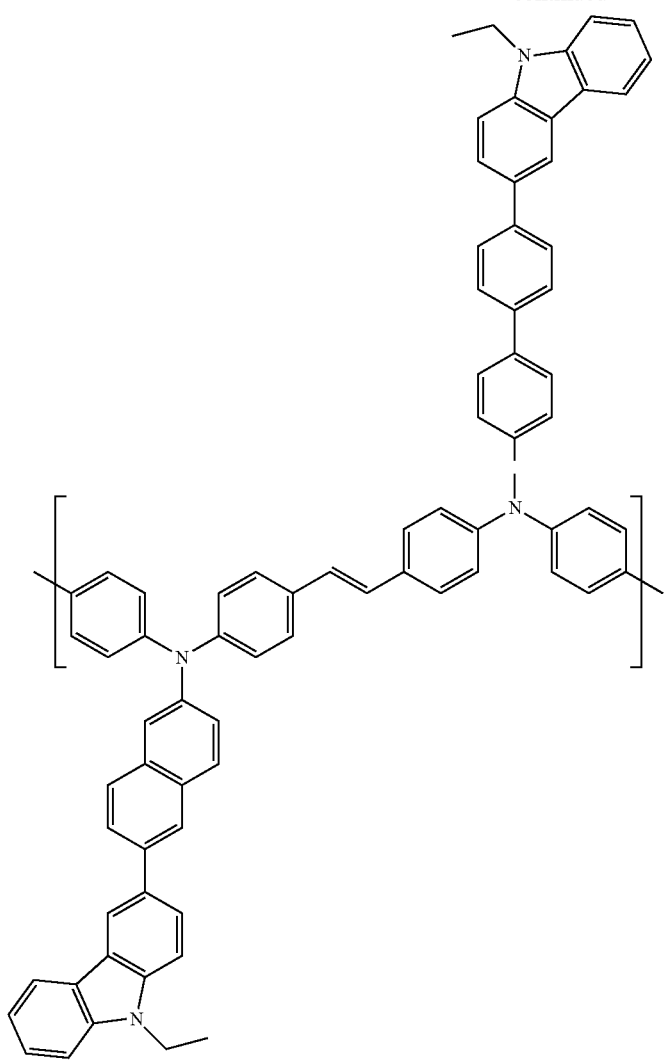
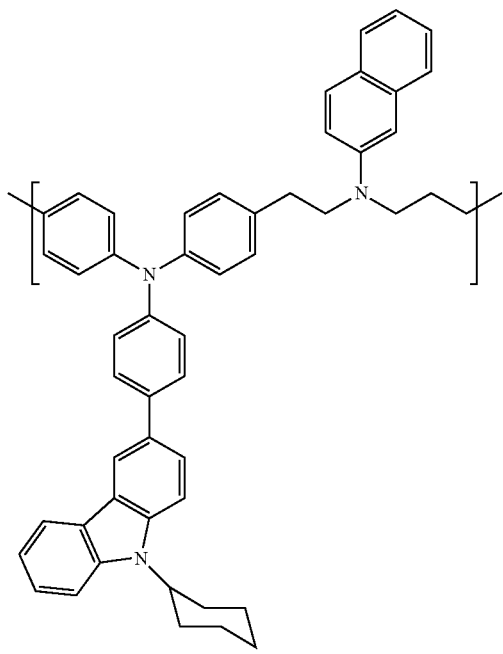

-continued
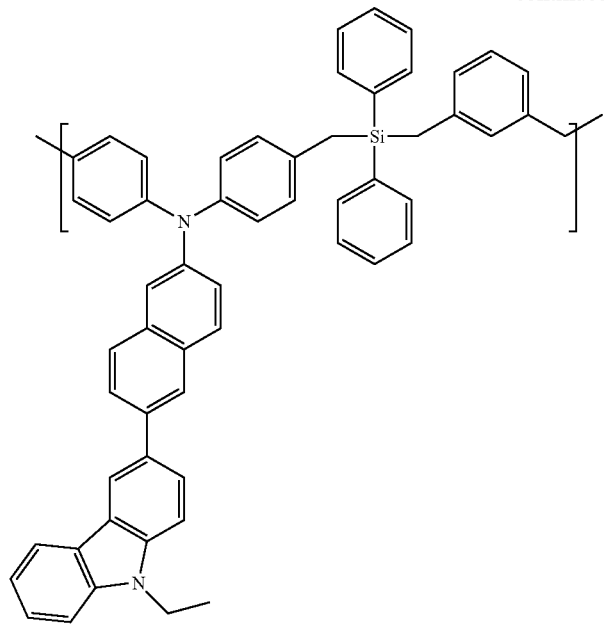
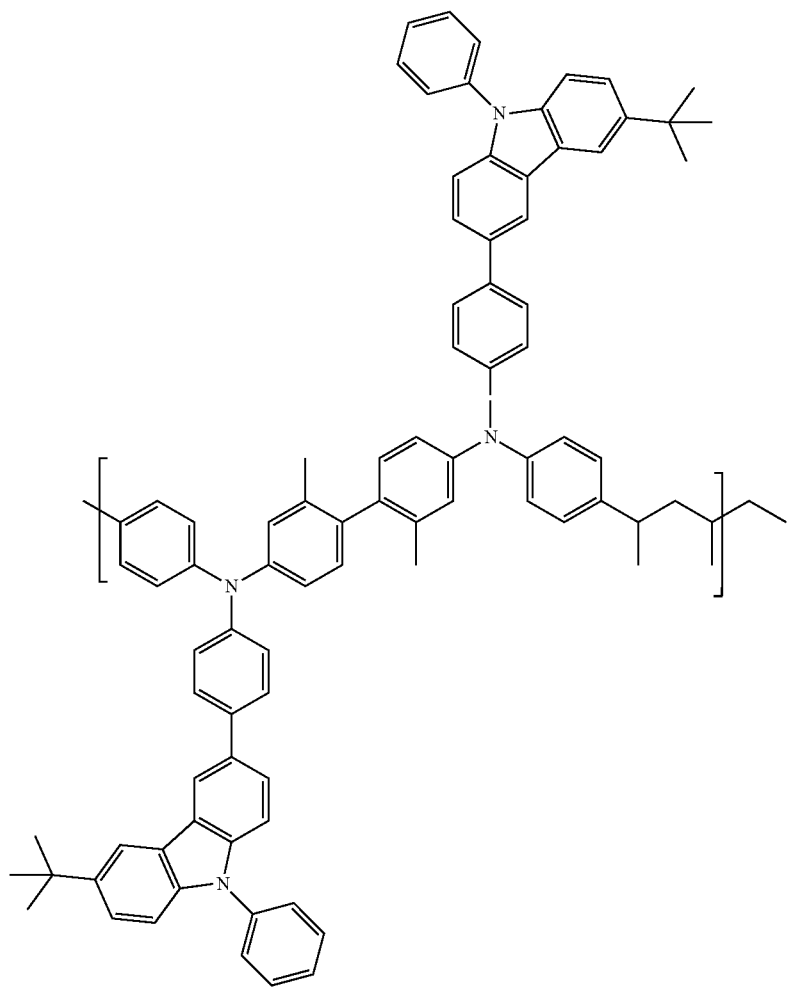

-continued
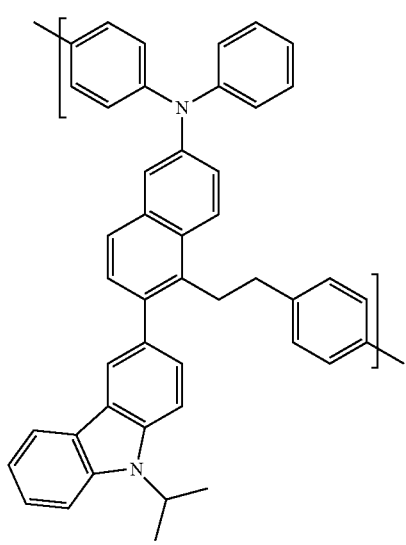
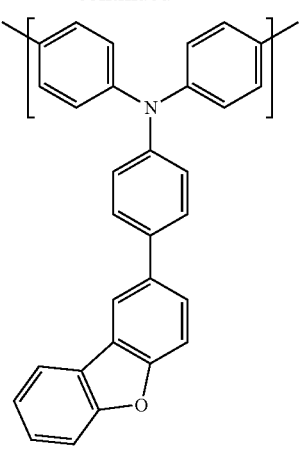
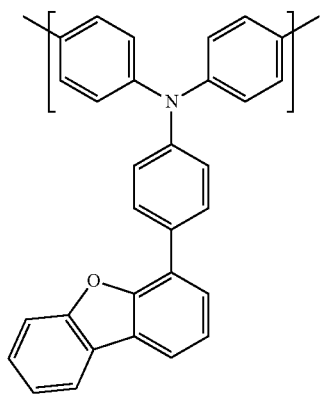
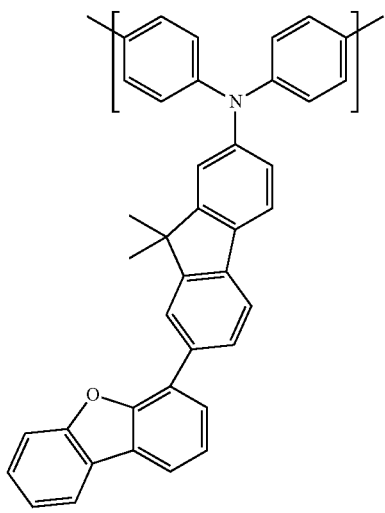
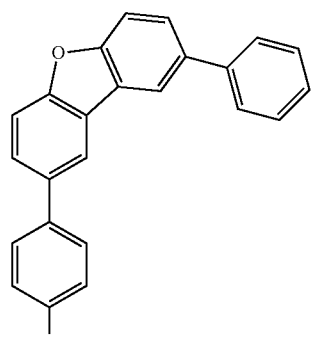

-continued
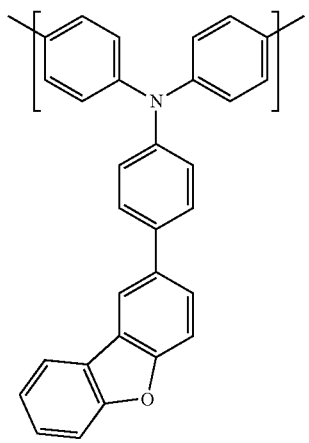
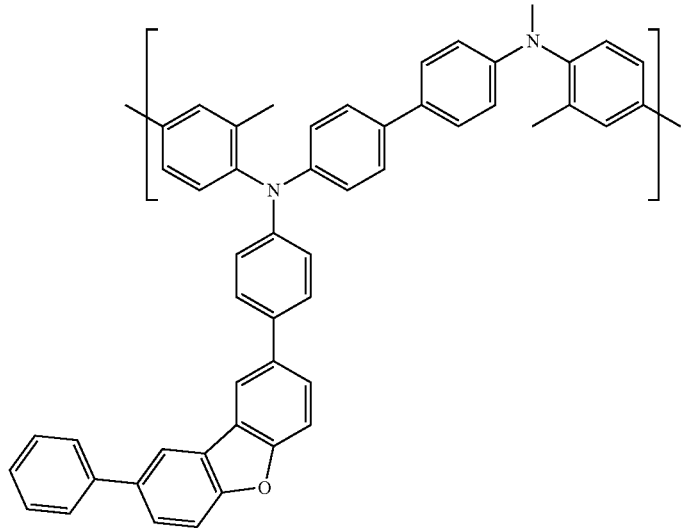
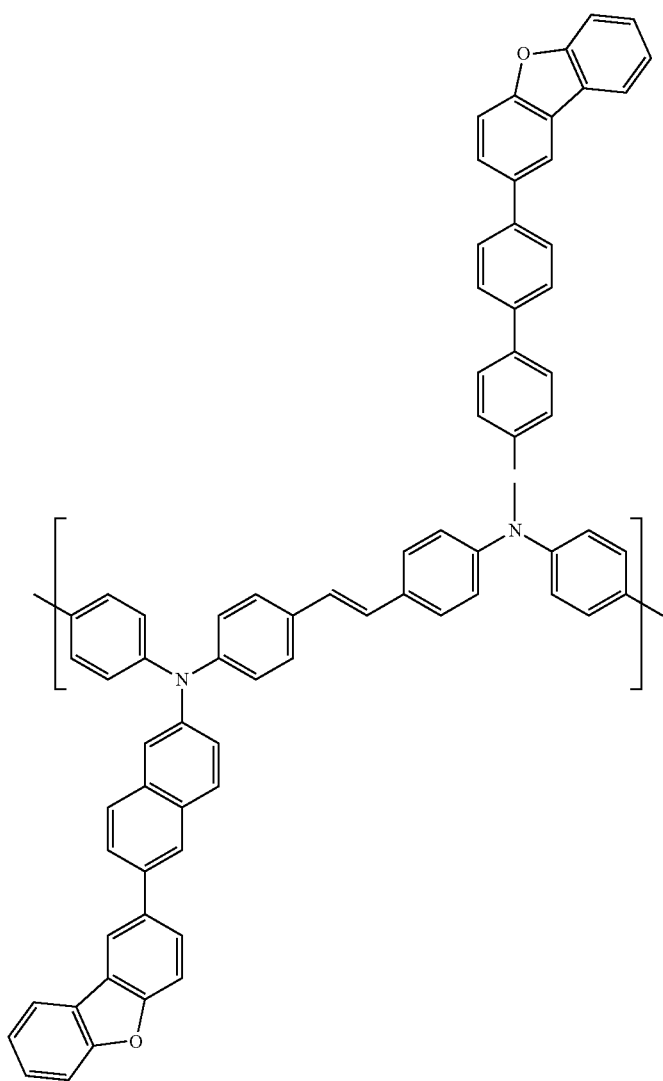

-continued
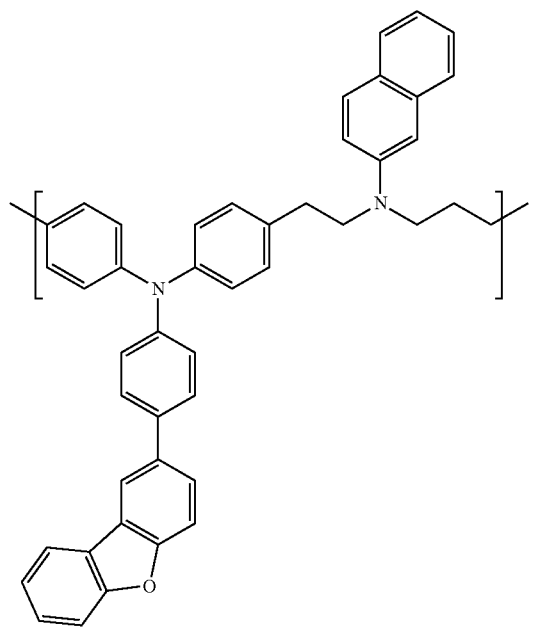
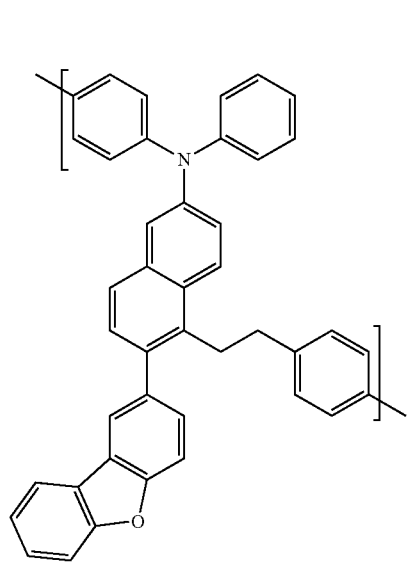
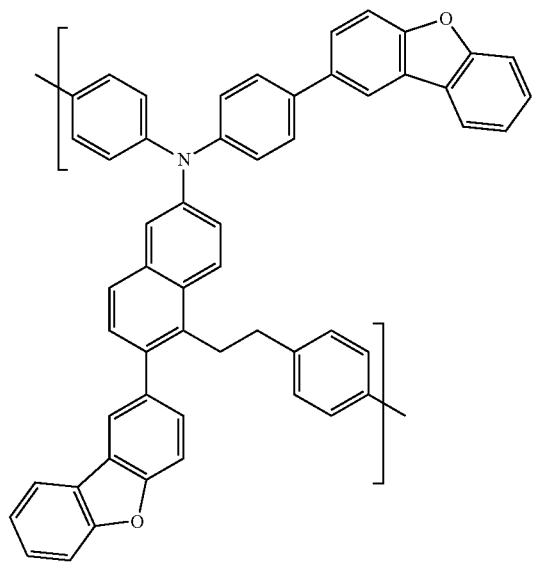

-continued
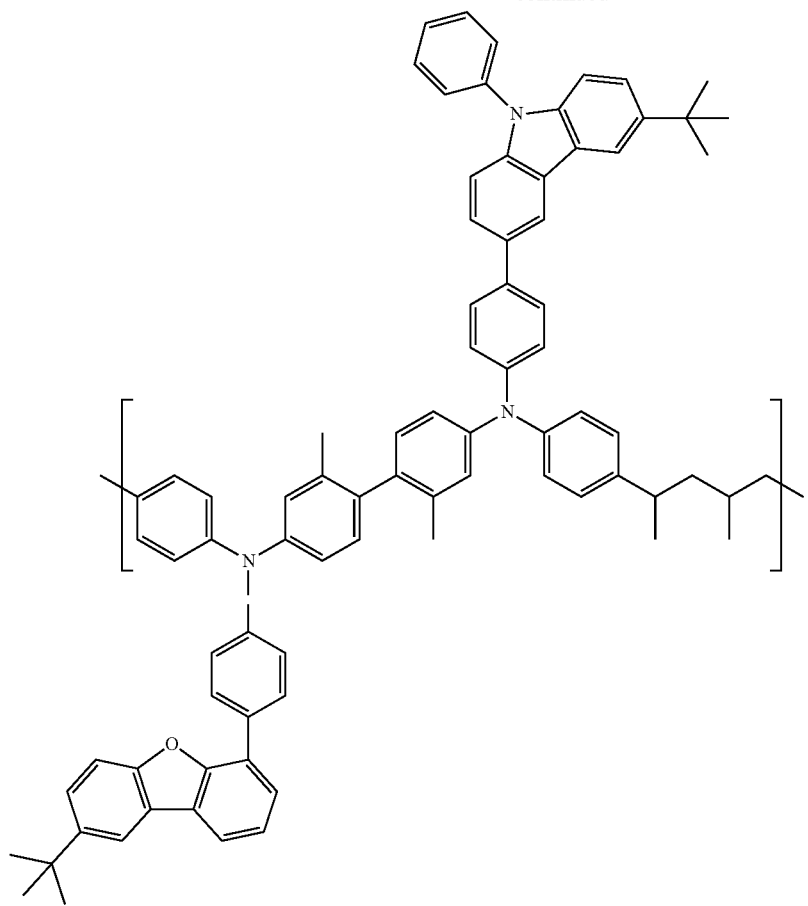
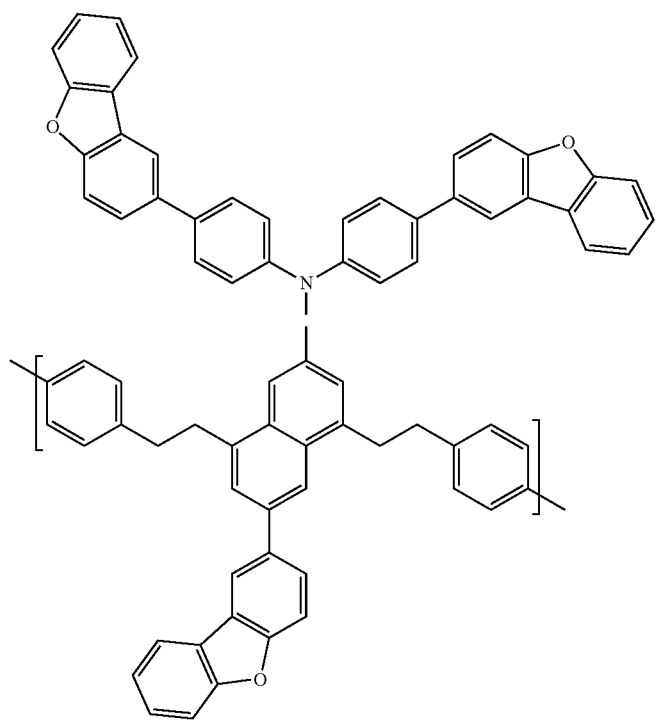

-continued
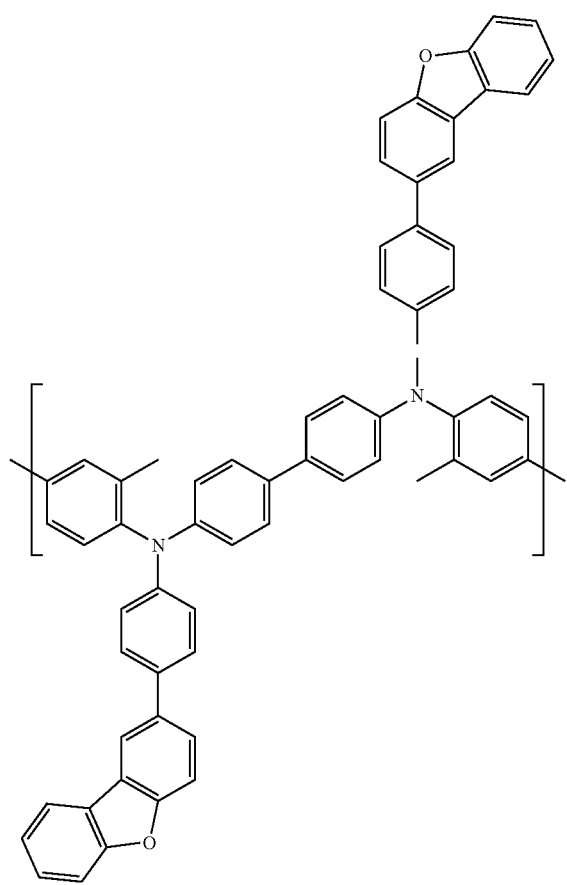
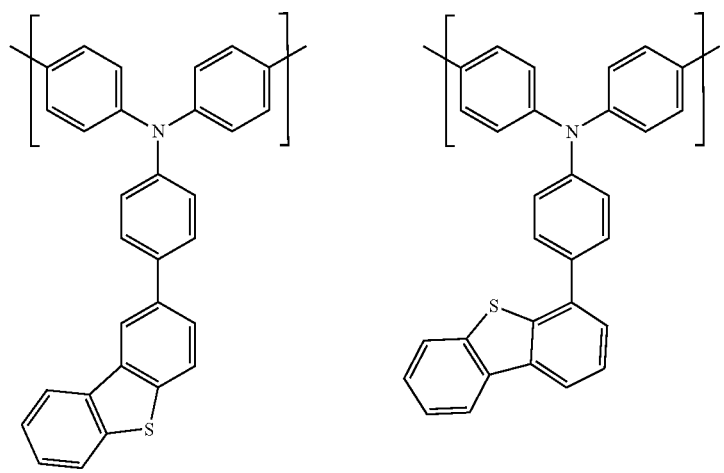

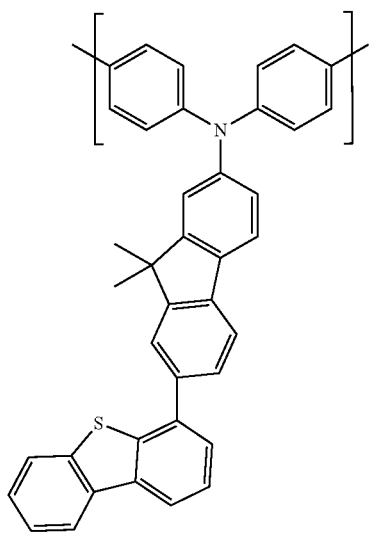
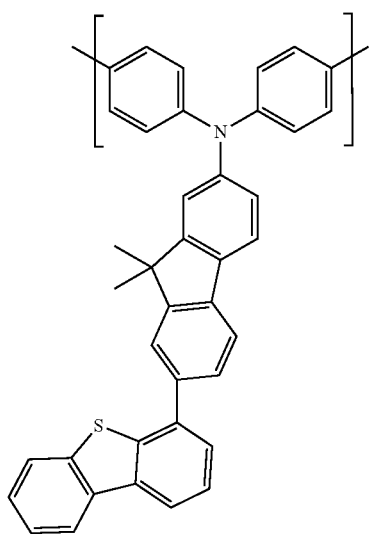
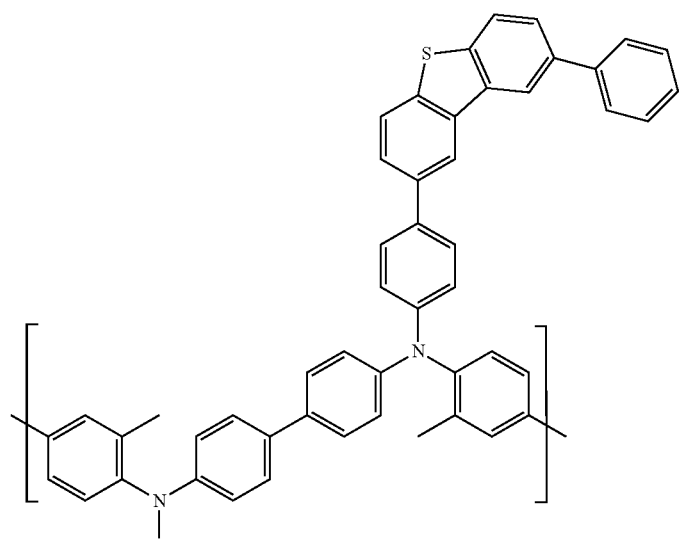

-continued
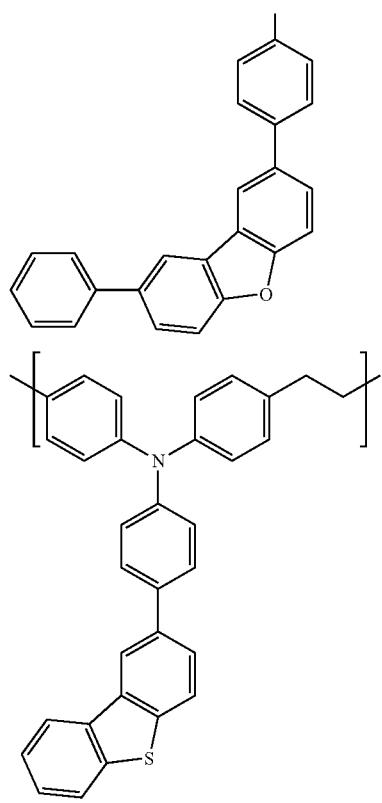
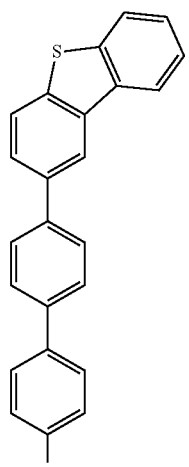

-continued
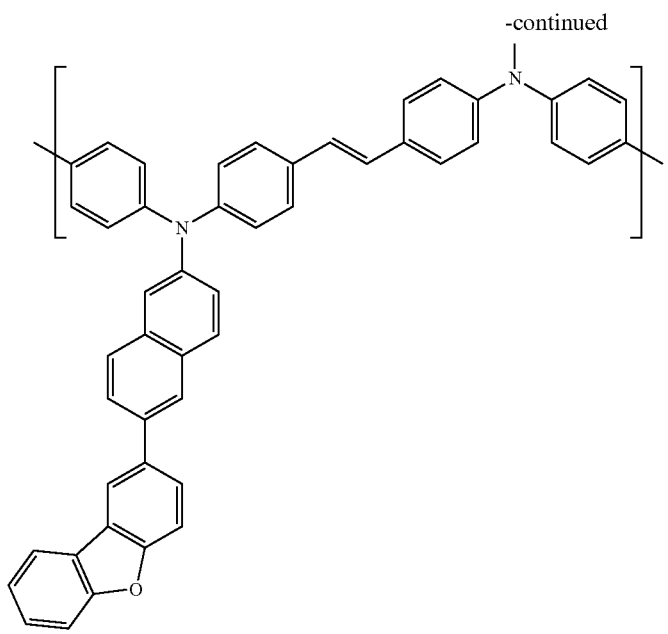
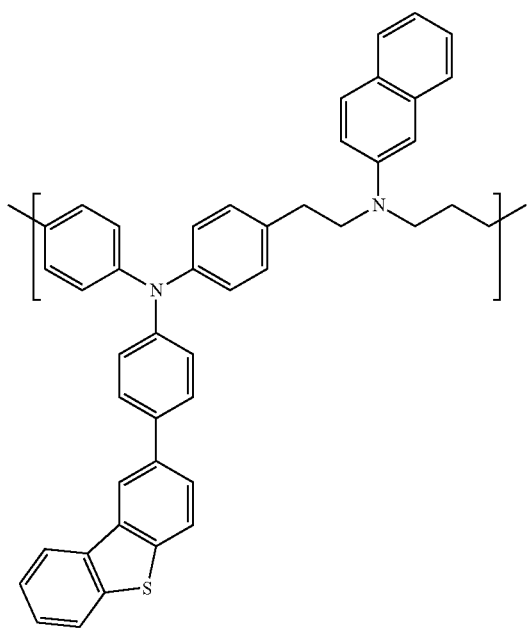

-continued
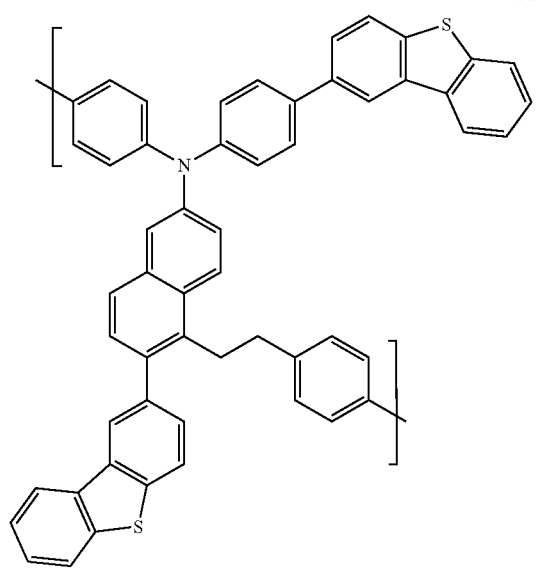
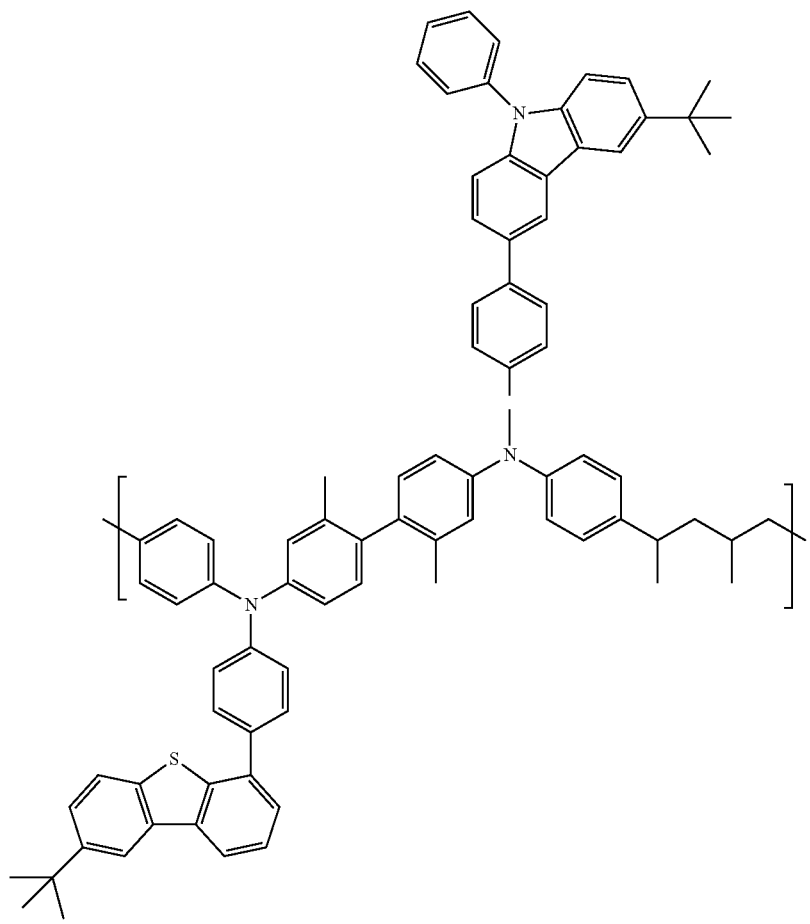

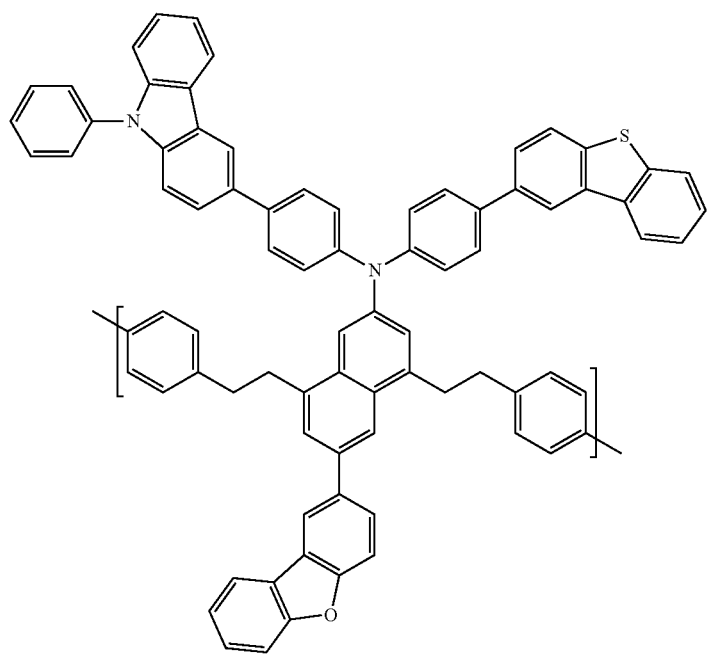
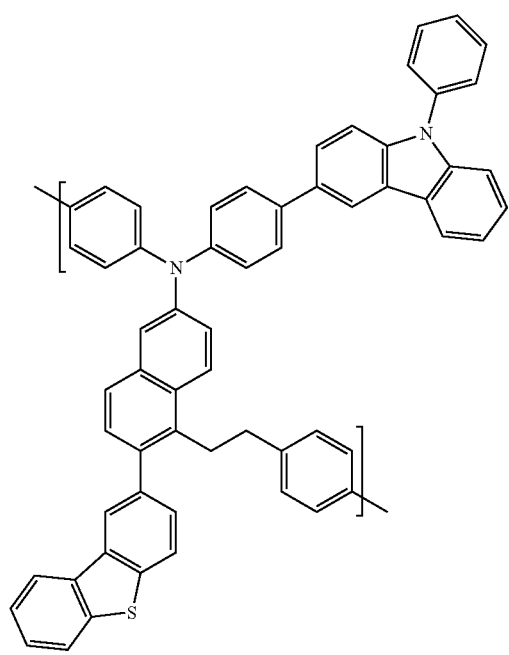

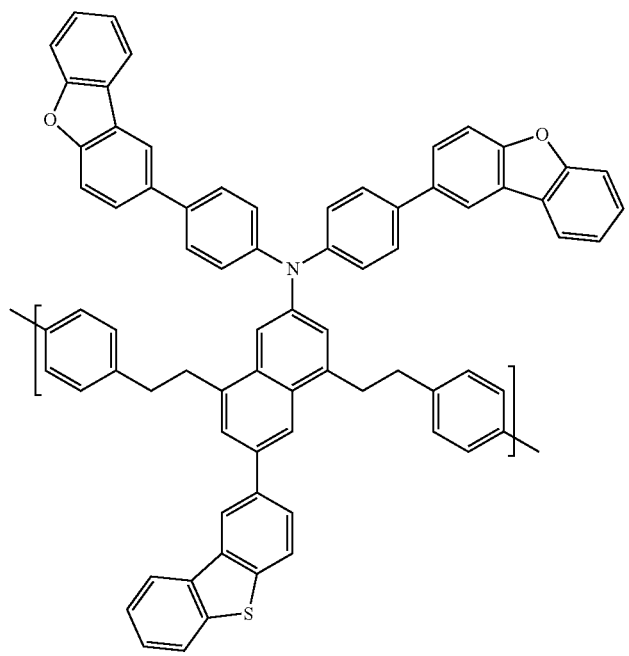
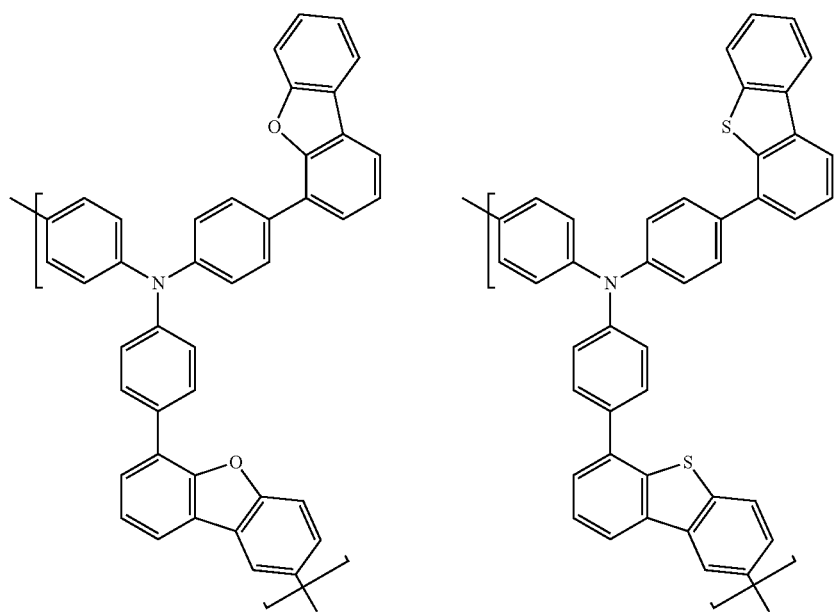

-continued
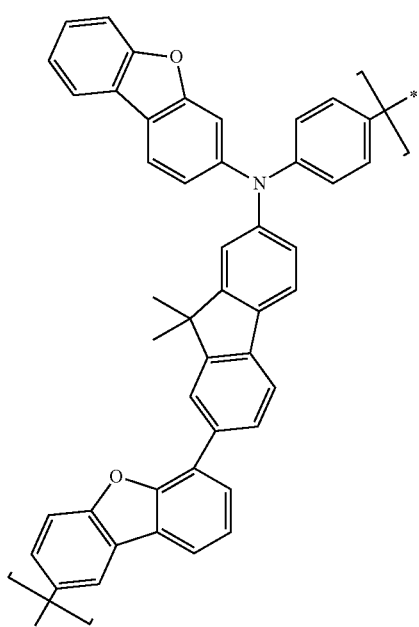
55
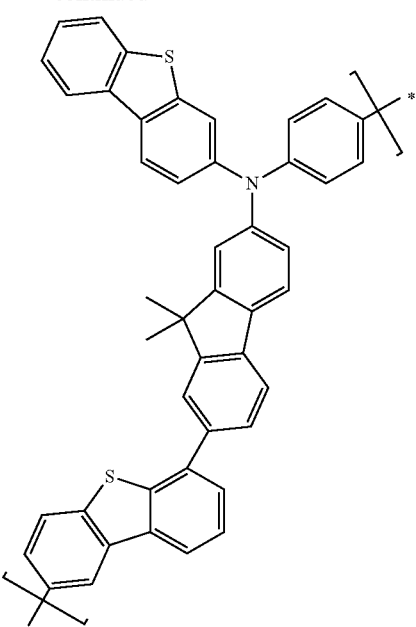
56
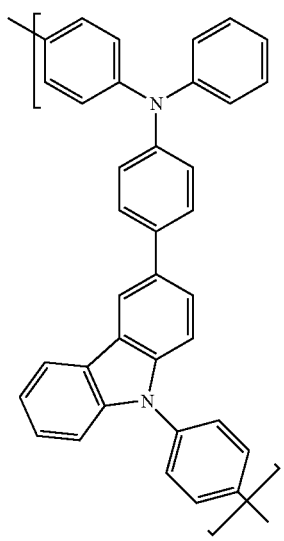
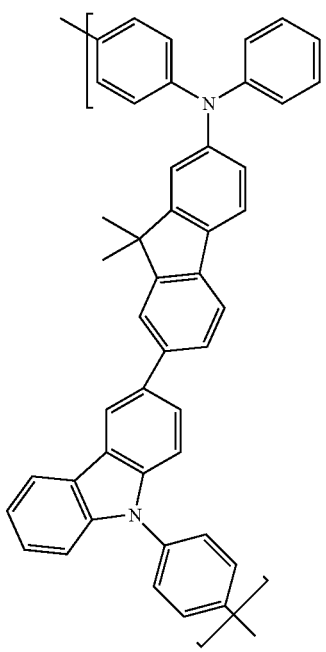

-continued
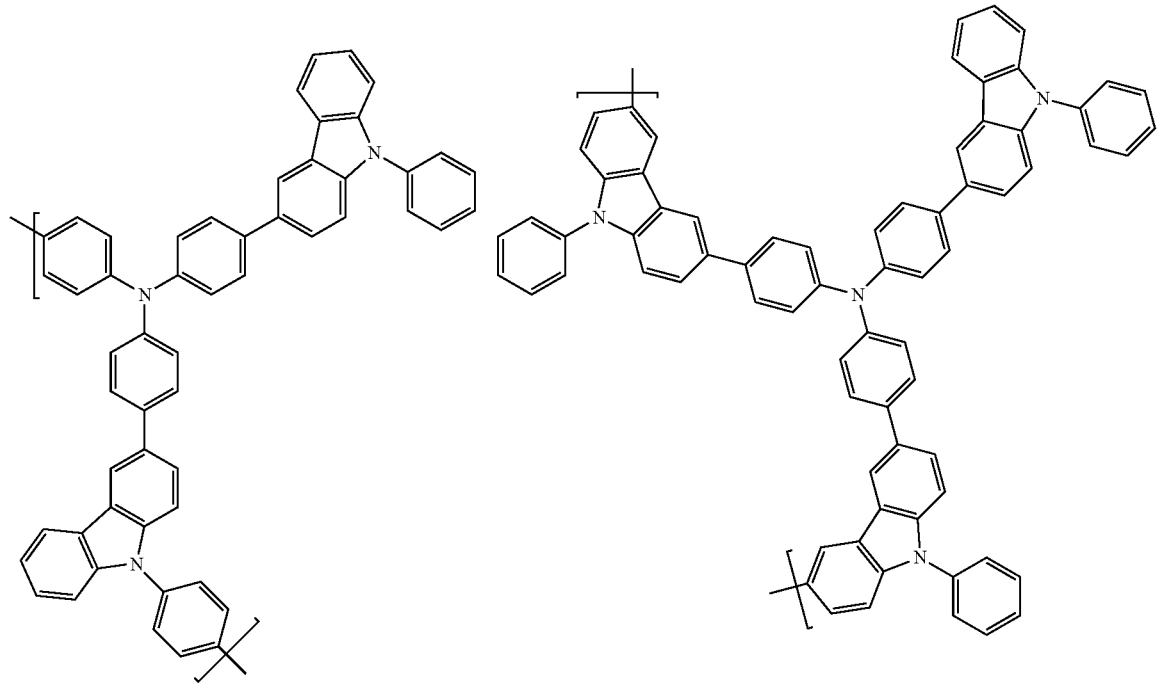
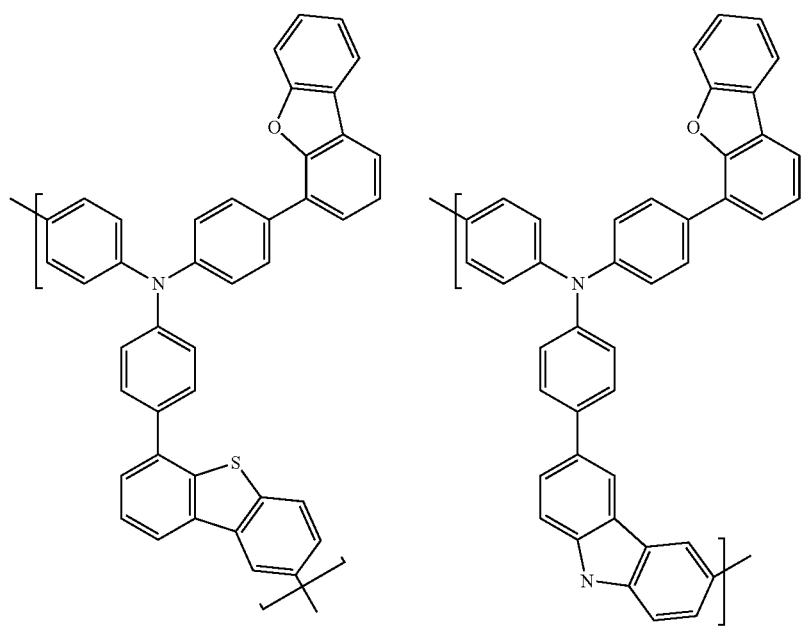

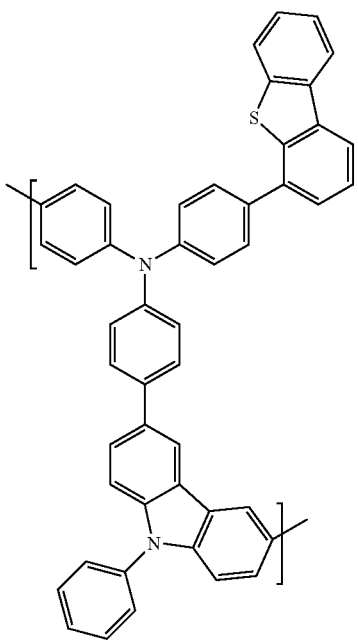

In the polymer compound of the invention, if the structural unit of the formula (1) is taken as A and the structure units shown by the formulas (16) to (19) are taken as B, it may be a random copolymer (-ABBABBBAAABA-), an alternating copolymer (-ABABABABABAB-), a block copolymer (-AAAAAABBBBBB-) or a graft copolymer (whichever of the unit A and the unit B may be a main chain, and whichever of the unit A and the unit B may be a side chain).

The number average molecular weight (Mn) of the polymer compound of the invention is preferably $10^3$ to $10^8$, more preferably $10^3$ to $10^5$.

Moreover, the weight-average molecular weight (Mw) is preferably $10^3$ to $10^8$, more preferably $10^4$ to $10^6$. The both molecular weights are the values obtained by using the size exclusion chromatography (SEC) and calibrating with standard polystyrene.

In the polymer compound of the invention, the molar ratio of the structural unit A and the structural unit B is preferably 0.1:99.9 to 100:0, more preferably 10:90 to 100:0, and particularly preferably 30:70 to 100:0.

The polymer compound of the invention can be preferably used as a material for an organic EL device. In particular, the polymer compound of the invention is preferable as the hole-transporting material (a material for a hole-transporting layer and a hole-injecting layer) of an organic EL device.

The organic EL device of the invention is an organic EL device in which one or more organic thin film layers including at least an emitting layer are interposed between an anode and a cathode. At least one of the organic thin film layers contains the polymer compound of the invention as a component singly or in the form of a mixture.

In the organic EL device of the invention, it is preferred that the organic thin film layers have a hole-transporting layer and/or a hole-injecting layer and that the polymer compound of the invention be contained in these layers. It is particularly preferred that the polymer compound of the invention be contained in the hole-transporting layer or the hole-injecting layer as the main component.

The device structure of the organic EL device of the invention will be described below.
(1) Structure of Organic EL Device As the representative device structure of the organic EL device of the invention, the structures shown by the following (1) to (13) or the like can be given.
(1) Anode/emitting layer/cathode
(2) Anode/hole-injection layer/emitting layer/cathode
(3) Anode/emitting layer/electron-injecting layer/cathode
(4) Anode/hole-injecting layer/emitting layer/electron-injecting layer/cathode
(5) Anode/organic semiconductor layer/emitting layer/cathode
(6) Anode/organic semiconductor layer/electron-blocking layer/emitting layer/cathode
(7) Anode/organic semiconductor layer/emitting layer/adhesion-improving layer/cathode
(8) Anode/hole-injecting layer/hole-transporting layer/emitting layer/electron-injecting layer/cathode
(9) Anode/insulating layer/emitting layer/insulating layer/cathode
(10) Anode/inorganic semiconductor layer/insulating layer/emitting layer/insulating layer/cathode
(11) Anode/organic semiconductor layer/insulating layer/emitting layer/insulating layer/cathode
(12) Anode/insulating layer/hole-injecting layer/hole-transporting layer/emitting layer/insulating layer/cathode
(13) Anode/insulating layer/hole-injecting layer/hole-transporting layer/emitting layer/electron-injecting layer/cathode Of these, normally, the structure (8) is preferably used. However, the device structure is not limited thereto.

FIG. 1 shows the structure (8). This organic EL device comprises an anode 10 and a cathode 20, and a hole-injecting layer 30, a hole-transporting layer 32, an emitting layer 34 and an electron-injecting layer 36 which are interposed therebetween. The hole-injecting layer 30, the hole-transporting layer 32, the emitting layer 34 and the electron-injecting layer 36 correspond to the plurality of organic thin film layers. At least one of these organic thin film layers 30, 32, 34 and 36 contains the compound of the invention.

The polymer compound of the invention may be used in any organic thin film layer of the organic EL device. It can be used for an emission region or a hole-transporting region. Preferably, by using the polymer compound of the invention in a hole-transporting region, particularly preferably in hole-injecting and transporting layer, molecules are hard to be crystallized and the yield at the time of producing an organic EL device is improved.

The polymer compound of the invention may preferably be contained in the organic thin film layer in an amount of 30 to 100 mol %.

(2) Substrate

The luminescent device of the invention is formed on a substrate. The substrate as referred to herein is a substrate for supporting the luminescent device, and is preferably a flat and smooth substrate having a transmittance of 50% or more to light rays within visible ranges of 400 to 700 nm.

Specific examples thereof include glass plates and polymer plates. Examples of the glass plate include soda-lime glass, barium/strontium-containing glass, lead glass, aluminosilicate glass, boronsilicate glass, barium boronsilicate glass and quartz. Examples of the polymer plate include polycarbonate, acrylic polymer, polyethylene terephthalate, polyethersulfone and polysulfone.

Transparency is not required when the supporting substrate is positioned in the direction opposite to the light-outcoupling direction.

(3) Anode

The anode of the organic EL device of the invention plays a role for injecting holes into its hole-transporting layer or emitting layer. The anode effectively has a work function of 4.5 eV or more. As the specific examples of an anode material used in the invention, an indium oxide tin alloy (ITO), tin oxide (NESA), indium-zinc oxide, gold, silver, platinum, copper, etc. can be given.

The anode can be formed by forming these electrode materials into a thin film by vapor deposition, sputtering or the like.

In the case where emission from the emitting layer is outcoupled through the anode, the transmittance of the anode to the emission is preferably more than 10%. The sheet resistance of the anode is preferably several hundred $\Omega/\square$ or less. The film thickness of the anode, which varies depending upon the material thereof, is usually selected from 10 nm to 1 μm, preferably from 10 to 200 nm.

(4) Emitting Layer

The emitting layer of the organic EL device has the following functions (1), (2) and (3) in combination.

(1) Injection function: function of allowing injection of holes from the anode or hole-injecting layer and injection of electrons from the cathode or electron-injecting layer upon application of an electric field
(2) Transporting function: function of moving injected carriers (electrons and holes) due to the force of an electric field
(3) Emitting function: function of allowing electrons and holes to recombine therein to emit light Note that electrons and holes may be injected into the emitting layer with different degrees, or the transportation capabilities indicated by the mobility of holes and electrons may differ. It is preferable that the emitting layer move either electrons or holes.

As the method of forming the emitting layer, a known method such as deposition, spin coating, or an LB method may be applied. It is preferable that the emitting layer be a molecular deposition film. Here, the molecular deposition film means a film formed through deposition of a material compound in a vapor state or a film formed through solidification of a material compound in a solution state or a liquid state. The molecular deposition film is usually distinguished from a thin film (molecular accumulation film) formed using the LB method by the difference in aggregation structure or higher order structure or the difference in function due to the difference in structure.

The emitting layer may also be formed by dissolving a binder such as a resin and a material compound in a solvent to obtain a solution, and forming a thin film from the solution by spin coating or the like, as disclosed in JP-A-57-51781.

In the invention, if need arises, known emitting materials other than the emitting materials formed of the polymer compound of the invention may be contained in the emitting layer insofar as the object of the invention is not impaired. An emitting layer containing other known emitting materials may be stacked on the emitting layer containing the emitting materials formed of the polymer compound of the invention.

In the invention, one of the following emitting materials may be used. As far as the object of the invention is not impaired, a plurality of emitting materials may be used in a mixture, or other known emitting materials may be contained. It is also possible to stack a plurality of emitting layers.

As the emitting material (host and dopant) used for the emitting layer, for example, anthracene, naphthalene, phenanthrene, pyrene, tetracene, coronene, chrysene, fluorescein, perylene, phthaloperylene, naphthaloperylene, perynone, phthaloperynone, naphthaloperynone, diphenylbutadiene, tetraphenylbutadiene, coumarin, oxadiazole, aldazine, bisbenzoxazoline, bisstyryl, pyrazine, cyclopentadiene, a quinoline metal complex, an aminoquinoline metal complex, a benzoquinoline metal complex, imine, diphenylethylene, vinylanthracene, diaminocarbazole, pyran, thiopyran, polymethine, merocyanine, an imidazole chelate oxinoid compound, quinacridone, rubrene, a fluorescent pigment and like can be given. Note that the emitting material is not limited to these compounds.

As the host material for use in the emitting layer, the compounds represented by the following formulas (i) to (ix) are preferred.

Asymmetrical anthracene represented by the following formula (i):

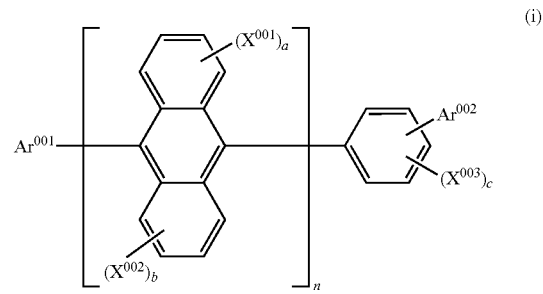

wherein $Ar^{001}$ is a substituted or unsubstituted fused aromatic group having 10 to 50 (preferably 10 to 30, more preferably 10 to 20) ring carbon atoms.

$Ar^{002}$ is a substituted or unsubstituted aromatic group having 6 to 50 (preferably 6 to 20, more preferably 6 to 14) ring carbon atoms.

$X^{001}$ to $X^{003}$ are independently a substituted or unsubstituted aromatic group having 6 to 50 (preferably 6 to 20, more preferably 6 to 14) ring carbon atoms, a substituted or unsubstituted aromatic heterocyclic group having 5 to 50 (preferably 5 to 20) ring atoms, a substituted or unsubstituted alkyl group having 1 to 50 (preferably 1 to 20, more preferably 1 to 12, and particularly preferably 1 to 8) carbon atoms, a substituted or unsubstituted alkoxy group having 1 to 50 (preferably 1 to 20, more preferably 1 to 12, and particularly preferably 1 to 8) carbon atoms, a substituted or unsubstituted aralkyl group having 6 to 50 (preferably 6 to 20, more preferably 6 to 14) carbon atoms, a substituted or unsubstituted aryloxy group having 5 to 50 (preferably 5 to 20) ring atoms, a substituted or unsubstituted arylthio group having 5 to 50 (preferably 5 to 20) ring atoms, a substituted or unsubstituted alkoxycarbonyl group having 1 to 50 (preferably 1 to 20, more preferably 1 to 12, and particularly preferably 1 to 8) carbon atoms, a carboxyl group, a halogen atom, a cyano group, a nitro group, and a hydroxy group.

a, b and c are each an integer of 0 to 4.

n is an integer of 1 to 3. When n is two or more, the groups in [ ] may be the same or different.

In addition, if the group shown by $Ar^{001}$ or the like has a substituent, as the substituent, the same groups as exemplified as those for $Ar^1$, $L^1$ or the like of the above-mentioned formulas (1) and (2) can be given. In this specification, the same can be applied to the substituent when the group shown in each of the following formulas has a substituent.

Asymmetrical monoanthracene derivatives represented by the following formula (ii):

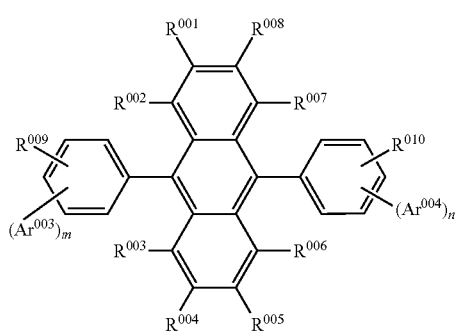

wherein $Ar^{003}$ and $Ar^{004}$ are independently a substituted or unsubstituted aromatic ring group having 6 to 50 (preferably 6 to 20, more preferably 6 to 14) ring cargon atoms;

m and n are each an integer of 1 to 4;

provided that in the case where m=n=1 and $Ar^{003}$ and $Ar^{004}$ are symmetrically bonded to the benzene rings, $Ar^{003}$ and $Ar^{004}$ are not the same, and in the case where m or n is an integer of 2 to 4, m is different from n.

$R^{001}$ to $R^{010}$ are independently a hydrogen atom, a substituted or unsubstituted aromatic ring group having 6 to 50 (preferably 6 to 20, more preferably 6 to 14) ring carbon atoms, a substituted or unsubstituted aromatic heterocyclic ring group having 5 to 50 (preferably 5 to 20) ring atoms, a substituted or unsubstituted alkyl group having 1 to 50 (preferably 1 to 20, more preferably 1 to 12 and, particularly preferably 1 to 8) carbon atoms, a substituted or unsubstituted cycloalkyl group, a substituted or unsubstituted alkoxy group having 1 to 50 (preferably 1 to 20, more preferably 1 to 12, and particularly preferably 1 to 8) carbon atoms, a substituted or unsubstituted aralkyl group having 6 to 50 (preferably 6 to 20, more preferably 6 to 14) carbon atoms, a substituted or unsubstituted aryloxy group having 5 to 50 (preferably 5 to 20) ring atoms, a substituted or unsubstituted arylthio group having 5 to 50 (preferably 5 to 20) ring atoms, a substituted or unsubstituted alkoxycarbonyl group having 1 to 50 (preferably 1 to 20, more preferably 1 to 12, and particularly preferably 1 to 8) carbon atoms, a substituted or unsubstituted silyl group, a carboxyl group, a halogen atom, a cyano group, a nitro group, and a hydroxy group.

Asymmetrical pyrene derivatives represented by the following formula (iii):

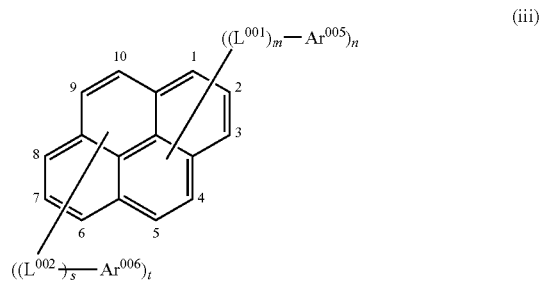

wherein $Ar^{005}$ and $Ar^{006}$ are independently a substituted or unsubstituted aromatic group having 6 to 50 (preferably 6 to 20, more preferably 6 to 14) ring carbon atoms;

$L^{001}$ and $L^{002}$ are each a substituted or unsubstituted phenylene group, a substituted or unsubstituted naphthalenylene group, a substituted or unsubstituted fluorenylene group, or a substituted or unsubstituted dibenzosilolylene group;

m is an integer of 0 to 2, n is an integer of 1 to 4, s is an integer of 0 to 2, and t is an integer of 0 to 4;

$L^{001}$ or $Ar^{005}$ bonds at any one position of the $1^{st}$ to $5^{th}$ positions of the pyrene, and $L^{002}$ or $Ar^{006}$ bonds at any one position of the $6^{th}$ to $10^{th}$ positions of the pyrene; provided that when n+t is an even number, $Ar^{005}$, $Ar^{006}$, $L^{001}$ and $L^{002}$ satisfy the following (1) and (2):

(1) $A^{005} \neq Ar^{006}$ and/or $L^{001} \neq L^{002}$ where ≠ means these substituents are groups having different structures from each other.

(2) when $Ar^{005} = Ar^{006}$ and $L^{001} = L^{002}$, (2-1) m≠s and/or n≠t, or (2-2) when m=s and n=t, (2-2-1) when $L^{001}$ and $L^{002}$ or pyrene are independently bonded to different bonding positions of $Ar^{005}$ and $Ar^{006}$, or (2-2-2) when $L^{001}$ and $L^{002}$ or pyrene are bonded to the same position of $Ar^{005}$ and $Ar^{006}$, the positions of the substitution of $L^{001}$ and $L^{002}$ or $Ar^{005}$ and $Ar^{006}$ at pyrene are neither the $1^{st}$ position and the $6^{th}$ position, nor the $2^{nd}$ position and the $7^{th}$ position.

Asymmetrical anthracene derivatives represented by the following formula (iv):

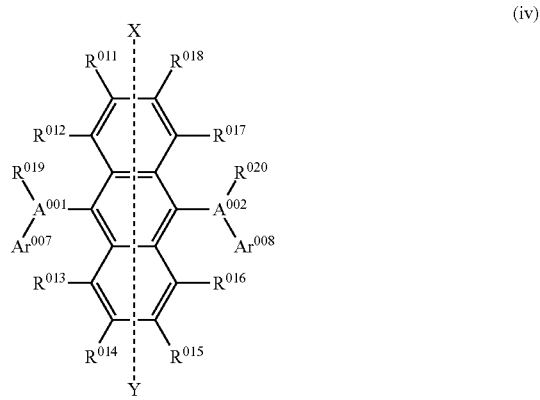

wherein $A^{001}$ and $A^{002}$ are independently a substituted or unsubstituted fused aromatic ring group having 10 to 20 ring carbon atoms, $Ar^{007}$ and $Ar^{008}$ are independently a hydrogen atom or a substituted or unsubstituted aromatic ring group having 6 to 50 (preferably 6 to 20, more preferably 6 to 14) ring carbon atoms, $R^{011}$ to $R^{020}$ are independently a hydrogen atom, a substituted or unsubstituted aromatic ring group having 6 to 50 (preferably 6 to 20, more preferably 6 to 14) ring carbon atoms, an aromatic heterocyclic group having 5 to 50 (preferably 5 to 20) ring atoms, a substituted or unsubstituted alkyl group having 1 to 50 (preferably 1 to 20, more preferably 1 to 12, and particularly preferably 1 to 8) carbon atoms, a substituted or unsubstituted cycloalkyl group, an alkoxy group having 1 to 50 (preferably 1 to 20, more preferably 1 to 12, and particularly preferably 1 to 8) carbon atoms, a substituted or unsubstituted aralkyl group having 6 to 50 (preferably 6 to 20, and more preferably 6 to 14) carbon atoms, a substituted or unsubstituted aryloxy group having 5 to 50 (preferably 5 to 20) ring atoms, a substituted or unsubstituted arylthio group having 5 to 50 (preferably 5 to 20) ring atoms, a substituted or unsubstituted alkoxycarbonyl group having 1 to 50 (preferably 1 to 20, more preferably 1 to 12, and particularly preferably 1 to 8) carbon atoms, a substituted or unsubstituted silyl group, a carboxyl group, a halogen atom, a cyano group, a nitro group or a hydroxy group, there may be a plurality of $Ar^{007}$, $Ar^{008}$, $R^{019}$ and $R^{020}$, respectively, and adjacent groups thereof may form a saturated or unsaturated ring structure, provided that, in the formula (iv), groups do not symmetrically bond to $9^{th}$ and $10^{th}$ positions of the central anthracene with respect to X-Y axis.

Anthracene derivative represented by the following formula (v):

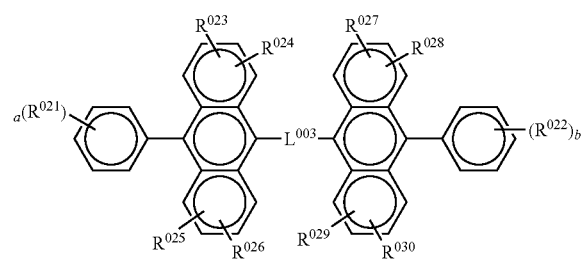

(v)

wherein $R^{021}$ to $R^{030}$ are independently a hydrogen atom, an alkyl group, a cycloalkyl group, an aryl group which may be substituted, an alkoxy group, an aryloxy group, an alkylamino group, an alkenyl group, an arylamino group or a heterocyclic group which may be substituted;

a and b are independently an integer of 1 to 5, and when they are two or more, $R^{021}$s or $R^{022}$s may be the same or different from each other, or $R^{021}$s or $R^{022}$s may be bonded to each other to form the ring, and $R^{023}$ and $R^{024}$, $R^{025}$ and $R^{026}$, $R^{027}$ and $R^{028}$, $R^{029}$ and $R^{030}$ may be bonded to each other to form the ring;

and $L^{003}$ is a single bond, —O—, —S—, —N(R)— (R is an alkyl group or an aryl group which may be substituted), an alkylene group or an arylene group.

Anthracene derivative represented by the following formula (vi):

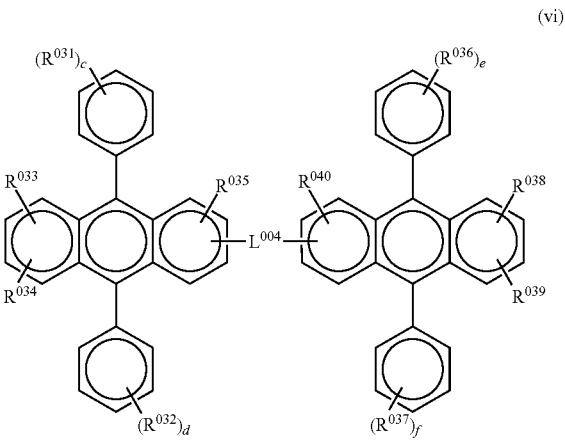

(vi)

wherein $R^{031}$ to $R^{040}$ are independently a hydrogen atom, an alkyl group, a cycloalkyl group, an aryl group, an alkoxyl group, an aryloxy group, an alkylamino group, an arylamino group or a heterocyclic group which may be substituted;

c, d, e and f are each an integer of 1 to 5, and when they are two or more, $R^{031}$s, $R^{032}$s, $R^{036}$s or $R^{037}$s may be the same or different, $R^{031}$s, $R^{032}$s, $R^{036}$s or $R^{037}$s may be bonded to form a ring, and $R^{033}$ and $R^{034}$, and $R^{039}$ and $R^{040}$ may be bonded to each other to form a ring;

and $L^{004}$ is a single bond, —O—, —S—, —N(R)— (R is an alkyl group or an aryl group which may be substituted), an alkylene group or an arylene group.

Spirofluorene derivatives represented by the following formula (vii):

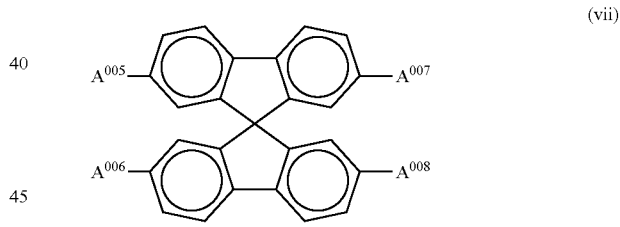

(vii)

wherein $A^{005}$ to $A^{008}$ are independently a substituted or unsubstituted biphenyl group or a substituted or unsubstituted naphthyl group.

Fused ring-containing compounds represented by the following formula (viii):

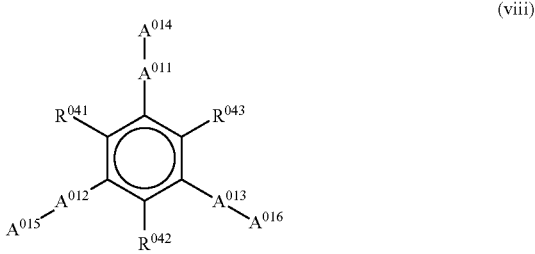

(viii)

wherein $A^{011}$ to $A^{013}$ are independently a substituted or unsubstituted arylene group having 6 to 50 (preferably 6 to 20, more preferably 6 to 14) ring carbon atoms;

$A^{014}$ to $A^{016}$ are independently a hydrogen atom or a substituted or unsubstituted aryl group having 6 to 50 (preferably 6 to 20, more preferably 6 to 14) ring carbon atoms;

$R^{041}$ to $R^{043}$ are independently a hydrogen atom, an alkyl group having 1 to 6 carbon atoms, a cycloalkyl group having 3 to 6 carbon atoms, an alkoxy group having 1 to 6 carbon atoms, an aryloxy group having 5 to 18 carbon atoms, an aralkyloxy group having 7 to 18 carbon atoms, an arylamino group having 5 to 16 carbon atoms, a nitro group, a cyano group, an ester group having 1 to 6 carbon atoms, or a halogen atom, provided that at least one of $A^{011}$ to $A^{016}$ is a group having a fused aromatic ring with three or more rings.

Fluorene compounds represented by the following formula (ix):

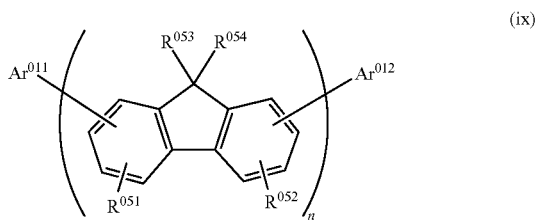

wherein $R^{051}$ and $R^{052}$ are a hydrogen atom, a substituted or unsubstituted alkyl group, a substituted or unsubstituted aralkyl group, a substituted or unsubstituted aryl group, a substituted or unsubstituted heterocyclic group, substituted amino group, a cyano group or a halogen atom, $R^{051}$s or $R^{052}$s bonded to different fluorene groups may be the same or different, and $R^{051}$ and $R^{052}$ bonded to a single fluorene group may be the same or different. $R^{053}$ and $R^{054}$ are a hydrogen atom, a substituted or unsubstituted alkyl group, a substituted or unsubstituted aralkyl group, a substituted or unsubstituted aryl group, or a substituted or unsubstituted heterocyclic group, provided that $R^{053}$s or $R^{054}$s bonded to different fluorene groups may be the same or different, and $R^{053}$ and $R^{054}$ bonded to a single fluorene group may be the same or different. $Ar^{011}$ and $Ar^{012}$ are a substituted or unsubstituted fused polycyclic aromatic group with a total number of benzene rings of three or more or a fused polycyclic heterocyclic group which is bonded to the fluorene group through substituted or unsubstituted carbon and has a total number of benzene rings and heterocyclic rings of three or more, provided that $Ar^{011}$ and $Ar^{012}$ may be the same or different. n is an integer of 1 to 10.

Among the above materials, the host material is preferably the anthracene derivative, more preferably the monoanthracene derivative, and particularly the asymmetrical anthracene.

As the specific examples of the host compound at the time of using a phosphorescent dopant, a compound containing a carbazole ring is preferable. A compound containing a carbazole ring, which is a host suitable for phosphorescence emission, is a compound which allows a phosphorescent compound to emit as a result of energy transfer from its excited state to the phosphorescent compound. The host compound is not limited so long as the compound can transfer its excited energy to a phosphorescent compound and it can be selected depending on purposes. The host compound may contain any heterocyclic ring other than a carbazole ring.

Specific examples of the host compounds include carbazole, triazole, oxazole, oxadiazole, imidazole, polyarylalkane, pyrazoline, pyrazolone, phenylenediamine, arylamine, amino-substituted calcone, styryl anthracene, fluorenone, hydrazone, stilbene and silazane derivatives; aromatic tertiary amine, styrylamine, aromatic dimethylidene and porphyrin compounds; anthraquinodimethane, anthrone, diphenylquinone, thiopyrandioxide, carbodiimide, fluoreniridenemethane and distyrylpyrazine derivatives; heterocyclic tetracarboxylic anhydrides such as naphthaleneperylene; phthalocyanine derivatives; metal complexes of 8-quinolinol derivatives; various metal complex polysilane compounds represented by metal complexes having metalphthalocyanine, benzoxazole or benzothiazole as a ligand; electroconductive macromolecular oligomers such as poly(N-vinylcarbazole) derivatives, aniline copolymers, thiophene oligomers and polythiophene; and macromolecular compounds such as polythiophene, polyphenylene, polyphenylenevinylene and polyfluorene derivatives. Host compounds can be used individually or as a combination of two or more kinds.

Specific compounds shown below can be exemplified.

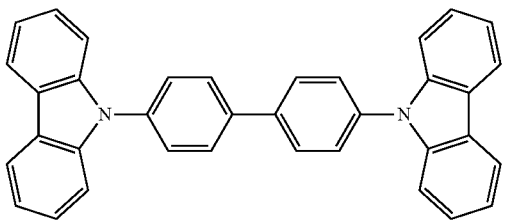

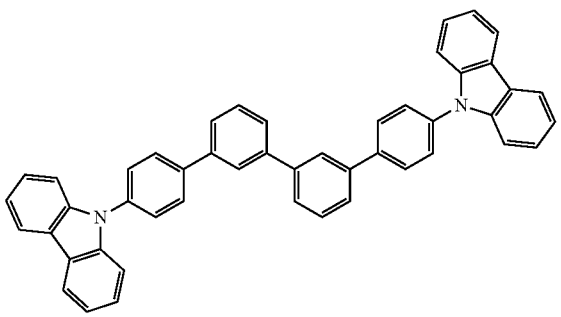

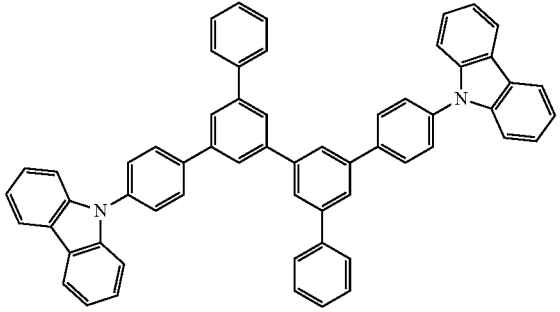

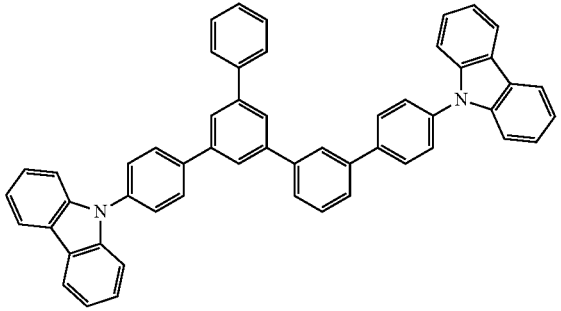

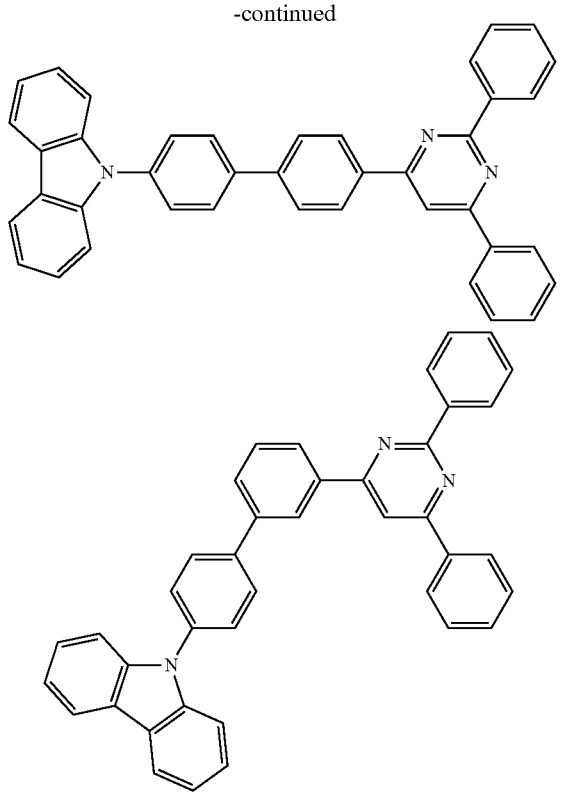

A phosphorescent dopant is a compound that can emit light from triplet excitons. The dopant is not limited so long as it can emit light from triplet excitons, but it is preferably a metal complex containing at least one metal selected from the group of Ir, Ru, Pd, Pt, Os and Re. A porphyrin metal complex or an ortho-metalated metal complex is preferable. As a porphyrin metal complex, a porphyrin platinum complex is preferable. The phosphorescent compounds can be used individually or as a combination of two or more kinds.

There are various ligands forming an ortho-metalated metal complex. Preferable ligands include 2-phenylpyridine, 7,8-benzoquinoline, 2-(2-thienyl)pyridine, 2-(1-naphthyl)pyridine and 2-phenylquinoline derivatives. These derivatives may have substituents, if necessary. Fluorides and derivatives with a trifluoromethyl group introduced are particularly preferable as a blue dopant. As an auxiliary ligand, preferred are ligands other than the above-mentioned ligands, such as acetylacetonate and picric acid may be contained.

The content of a phosphorescent dopant in an emitting layer is not limited and can be properly selected according to purposes; for example, it is 0.1 to 70 wt %, preferably 1 to 30 wt %. When the content of a phosphorescent compound is less than 0.1 wt %, emission may be weak and the advantages thereof may not be sufficiently obtained. When the content exceeds 70 wt %, the phenomenon called concentration quenching may significantly proceed, thereby degrading the device performance.

The emitting layer may contain hole-transporting materials, electron-transporting materials and polymer binders, if necessary.

The thickness of an emitting layer is preferably from 5 to 50 nm, more preferably from 7 to 50 nm and most preferably from 10 to 50 nm. When it is less than 5 nm, the formation of an emitting layer and the adjustment of chromaticity may become difficult. When it exceeds 50 nm, the driving voltage may increase.

(5) Hole-Injecting Layer and Hole-Transporting Layer (Hole-Injecting and Transporting Layer: Hole-Transporting Region)

The hole-injecting and transporting layer is a layer for helping the injection of holes into the emitting layer to transport the holes to a light emitting region. The hole mobility thereof is large and the ionization energy thereof is usually as small as 5.6 eV or less. Such a hole-injecting and transporting layer is preferably made of a material which can transport holes to the emitting layer at a lower electric field intensity. The hole mobility thereof is preferably at least $10^{-4}$ cm$^2$/V·second when an electric field of, e.g. $10^4$ to $10^6$ V/cm is applied.

When the polymer compound of the invention is used in the hole-transporting region, a hole-injecting and transporting layer may be formed of the polymer compound of the invention alone, or may be formed of a mixture of the polymer compound of the invention with other materials.

In the invention, as far as the object of the invention is not impaired, the hole-transporting layer or the hole-injecting layer may contain other organic compounds than the above polymer compound. Further, other hole-transporting layer or hole-injecting layer containing a known organic compound may be stacked on the hole-transporting layer or the hole-injecting layer containing the polymer compound of the invention.

Any materials which have the above preferable properties can be used as the material for forming the hole-injecting and transporting layer by mixing with the polymer compound of the invention without particular limitation. The material for forming the hole-injecting and transporting layer can be arbitrarily selected from materials which have been widely used as a material transporting carriers of holes in photoconductive materials and known materials used in a hole-injecting and transporting layer of organic EL devices. In the invention, a material which has hole-transporting properties and can be used for the hole-transporting region is referred to as a hole-transporting material.

Specific examples include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, 54-119925, and others), arylamine derivatives (see U.S. Pat. Nos. 3,567,450, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996) and aniline copolymers (JP-A-2-282263).

As the material for the hole-injecting and transporting layer, the above-mentioned substances can be used. The following can also be used: porphyrin compounds (disclosed in JP-A-63-295695 and others), aromatic tertiary amine compounds and styrylamine compounds (see U.S. Pat. No. 4,127,412, JP-A-53-27033, 54-58445, 55-79450, 55-144250, 56-119132, 61-295558, 61-98353 and 63-295695, and others). Aromatic tertiary amine compounds are particularly preferably used.

The following can also be given as examples: 4,4'-bis(N-(1-naphthyl)-N-phenylamino)biphenyl (NPD), which has in the molecule thereof two fused aromatic rings, disclosed in U.S. Pat. No. 5,061,569, and 4,4',4"-tris(N-(3-methylphenyl)-N-phenylamino)triphenylamine (MTDATA), wherein three triphenylamine units are linked in a star-burst form, disclosed in JP-A-4-308688.

Inorganic compounds such as aromatic dimethylidene type compounds, mentioned above as the material for an emitting layer, and p-type Si and p-type SiC can also be used as the material of the hole-injecting and transporting layer.

The hole-injecting and transporting layer can be formed from the polymer compounds of the invention by a known method such as vacuum vapor deposition, spin coating, casting or LB technique. The film thickness of the hole-injecting and transporting layer is not particularly limited, and is usually from 5 nm to 5 μm. This hole-injecting and transporting layer may be a single layer made of one or two or more of the above-mentioned materials, or may be stacked hole-injecting and transporting layers made of different compounds from one used in the above-mentioned hole-injecting and transporting layer, insofar as the compound of the invention is contained.

The organic semiconductor layer may be provided as a layer for helping the injection of holes or electrons into the emitting layer, and is preferably a layer having an electric conductivity of $10^{-10}$ S/cm or more. As the material of such an organic semiconductor layer, electroconductive oligomers such as thiophene-containing oligomers or arylamine-containing oligomers disclosed in JP-A-8-193191, and electroconductive dendrimers such as arylamine-containing dendrimers may be used.

(6) Electron-Injecting Layer and Electron-Transporting Layer (Electron-Injecting and Transporting Layer)

The electron-injecting and transporting layer is a layer which assists injection of electrons into the emitting layer and transports electrons to the emitting region, and exhibits a high electron mobility. An adhesion-improving layer is formed of a material which exhibits particularly excellent adhesion to the cathode.

The thickness of the electron-injecting and transporting layer is arbitrarily selected in the range of several nanometers to several micrometers. When the electron-injecting and transporting layer has a large thickness, it is preferable that the electron mobility be at least $10^{-6}$ cm$^2$/Vs or more at an applied electric field of $10^4$ to $10^6$ V/cm in order to prevent an increase in voltage.

The material used in the electron-injecting and transporting layer is preferably a metal complex of 8-hydroxyquinoline or a derivative thereof or an oxadiazole derivative. Specific examples of the metal complex of 8-hydroxyquinoline or derivative thereof include metal chelate oxynoid compounds containing a chelate of oxine (generally, 8-quinolinol or 8-hydroxyquinoline), e.g. tris(8-quinolinolato)aluminum.

An electron-transporting compound of the following formula can be given as the oxadiazole derivative.

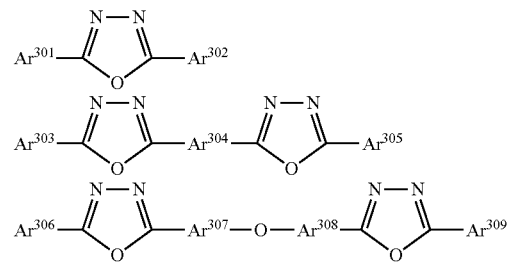

wherein $Ar^{301}$, $Ar^{302}$, $Ar^{303}$, $Ar^{305}$, $Ar^{306}$ and $Ar^{309}$ are independently a substituted or unsubstituted aryl group, and $Ar^{304}$, $Ar^{307}$ and $Ar^{308}$ are independently a substituted or unsubstituted arylene group.

As examples of the aryl group, a phenyl group, a biphenyl group, an anthranyl group, a perylenyl group, and a pyrenyl group can be given. As examples of the arylene group, a phenylene group, a naphthylene group, a biphenylene group, an anthranylene group, a perylenylene group, a pyrenylene group, and the like can be given. As the substituent, an alkyl group having 1 to 10 carbon atoms, an alkoxy group having 1 to 10 carbon atoms, a cyano group, and the like can be given. The electron-transporting compound is preferably one from which a thin film can be formed.

The following compounds can be given as specific examples of the electron-transporting compound.

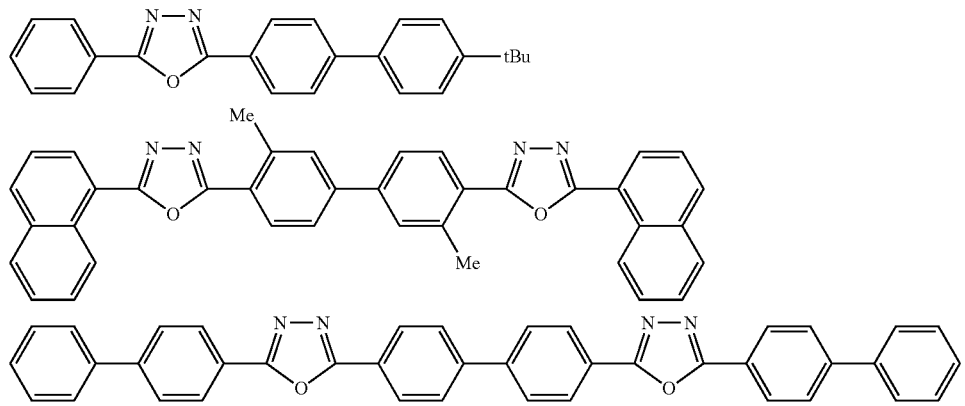

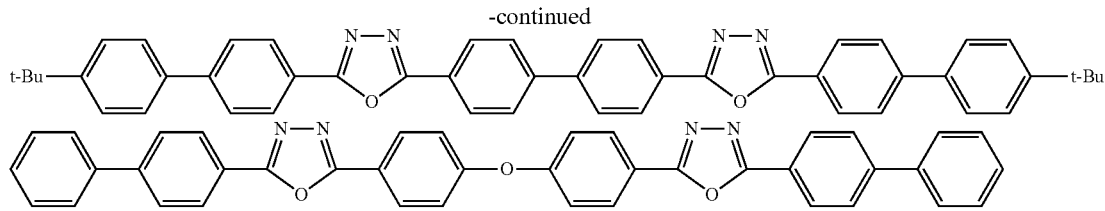

Me is methyl and tBu is t-butyl.

Furthermore, as materials used for the electron-injecting and transporting layer, the compounds represented by the following formulas (A) to (F) may be used.

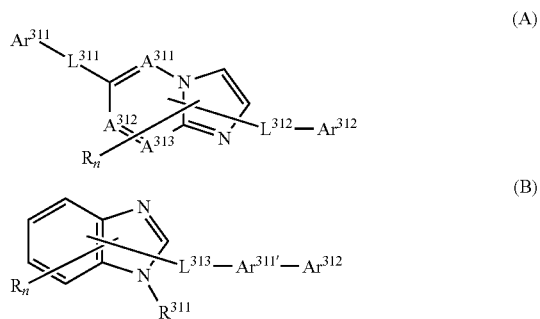

A nitrogen-containing heterocyclic derivative shown by the formulas (A) and (B). In the formulas (A) and (B), $A^{311}$ to $A^{313}$ are independently a nitrogen atom or a carbon atom;

$Ar^{311}$ is a substituted or unsubstituted aryl group having 6 to 60 (preferably 6 to 20, more preferably 6 to 14) ring carbon atoms or a substituted or unsubstituted heteroaryl group having 3 to 60 (preferably 3 to 20, more preferably 3 to 14) ring atoms; $Ar^{311'}$ is a substituted or unsubstituted arylene group having 6 to 60 (preferably 6 to 20, more preferably 6 to 14) ring atoms or a substituted or unsubstituted heteroarylene group having 3 to 60 (preferably 3 to 20, more preferably 3 to 14) ring carbon atoms; $Ar^{312}$ is a hydrogen atom, a substituted or unsubstituted aryl group having 6 to 60 (preferably 6 to 20, more preferably 6 to 14) ring carbon atoms, a substituted or unsubstituted heteroaryl group having 3 to 60 (preferably 3 to 20, more preferably 3 to 14) ring atoms, a substituted or unsubstituted alkyl group having 1 to 20 (preferably 1 to 12, more preferably 1 to 8) carbon atoms, or a substituted or unsubstituted alkoxy group having 1 to 20 (preferably 1 to 12, more preferably 1 to 8) carbon atoms, provided that one of $Ar^{311}$ and $Ar^{312}$ is a substituted or unsubstituted fused ring group having 10 to 60 (preferably 10 to 30, more preferably 10 to 20) ring carbon atoms, or a substituted or unsubstituted mono-hetero fused ring group having 3 to 60 (preferably 3 to 20, more preferably 3 to 14) ring atoms;

$L^{311}$, $L^{312}$ and $L^{313}$ are independently a single bond, a substituted or unsubstituted arylene group having 6 to 60 ring carbon atoms, a substituted or unsubstituted heteroarylene group having 3 to 60 ring atoms or a substituted or unsubstituted fluorenylene group;

R and $R^{311}$ are independently a hydrogen atom, a substituted or unsubstituted aryl group having 6 to 60 ring carbon atoms, a substituted or unsubstituted heteroaryl group having 3 to 60 ring atoms, a substituted or unsubstituted alkyl group having 1 to 20 (preferably 1 to 12, more preferably 1 to 8) carbon atoms, or a substituted or unsubstituted alkoxy group having 1 to 20 (preferably 1 to 12, more preferably 1 to 8) carbon atoms, n is an integer of 0 to 5, and when n is two or more, plural Rs may be the same or different, and adjacent Rs may be bonded to each other to form a carbocyclic aliphatic ring or a carbocyclic aromatic ring.

A nitrogen-containing heterocyclic derivative shown by the following formula (C):

$$HAr-L^{314}-Ar^{321}-Ar322 \qquad (C)$$

wherein HAr is a nitrogen-containing heterocycle having 3 to 40 (preferably 3 to 30, more preferably 3 to 24) carbon atoms which may have a substituent, $L^{314}$ is a single bond, an arylene group having 6 to 60 (preferably 6 to 20, more preferably 6 to 14) carbon atoms which may have a substituent, a heteroarylene group which may have a substituent having 3 to 60 (preferably 3 to 20, more preferably 3 to 14) carbon atoms, or a fluorenylene group which may have a substituent; $Ar^{321}$ is an aromatic divalent hydrocarbon group having 6 to 60 (preferably 6 to 20, more preferably 6 to 14) carbon atoms which may have a substituent, and $Ar^{322}$ is an aryl group having 6 to 60 (preferably 6 to 20, more preferably 6 to 14) carbon atoms which may have a substituent or a heteroaryl group having 3 to 60 (preferably 3 to 20, more preferably 3 to 14) carbon atoms which may have a substituent.

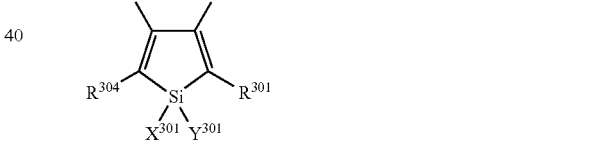

Silacyclopentadiene derivatives represented by the formula (D) wherein $X^{301}$ and $Y^{301}$ are independently a saturated or unsaturated hydrocarbon group having 1 to 6 carbon atoms, an alkoxy group, an alkenyloxy group, an alkynyloxy group, a hydroxyl group, a substituted or unsubstituted aryl group, or a substituted or unsubstituted hetero ring, or X and Y are bonded to form a saturated or unsaturated ring, and $R^{301}$ to $R^{304}$ are independently hydrogen, a halogen atom, an alkyl group, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group, or a cyano group. These groups may be substituted, or adjacent groups may form a substituted or unsubstituted fused ring.

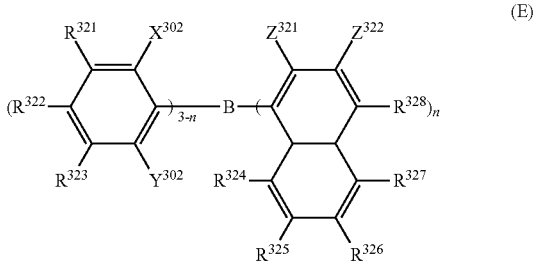

(E)

Borane derivatives represented by the formula (E) wherein $R^{321}$ to $R^{328}$ and $Z^{322}$ are independently a hydrogen atom, a saturated or unsaturated hydrocarbon group, an aromatic hydrocarbon group, a heterocyclic group, a substituted amino group, a substituted boryl group, an alkoxy group, or an aryloxy group, $X^{302}$, $Y^{302}$ and $Z^{321}$ are independently a saturated or unsaturated hydrocarbon group, an aromatic hydrocarbon group, a heterocyclic group, a substituted amino group, an alkoxy group, or an aryloxy group, $Z^{321}$ and $Z^{322}$ may be bonded to each other to form a fused ring, n is an integer of 1 to 3, $R^{321}$s to $R^{328}$S, $X^{302}$s, $Y^{302}$S, $Z^{322}$s and $Z^{321}$s may be the same or different when n or (3-n) is 2 or more, provided that a case in which n is 1, X, Y, and $R^{322}$ are methyl groups, and $R^{328}$ is a hydrogen atom or a substituted boryl group, and a case in which n is 3 and $Z^{321}$ is a methyl group are excluded.

(F)

Gallium complexes shown by the formula (F) wherein $Q^{301}$ and $Q^{302}$ are independently ligands represented by the following formula (K) and $L^{315}$ is a halogen atom, a substituted or unsubstituted alkyl group, a substituted or unsubstituted cycloalkyl group, a substituted or unsubstituted aryl group, a substituted or unsubstituted heterocyclic group, —OR (R is a hydrogen atom, a substituted or unsubstituted alkyl group, a substituted or unsubstituted cycloalkyl group, a substituted or unsubstituted aryl group, or a substituted or unsubstituted heterocyclic group) or a ligand represented by —O—Ga-$Q^{303}$($Q^{304}$) wherein $Q^{303}$ and $Q^{304}$ are the same as $Q^{301}$ and $Q^{302}$.

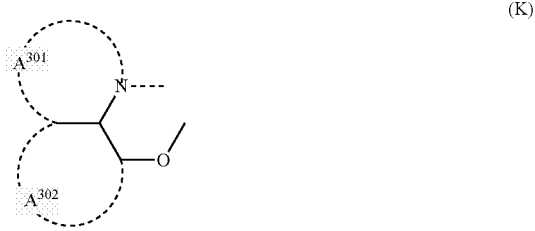

(K)

wherein rings $A^{301}$ and $A^{302}$ are independently a 6-membered aryl ring structure which may have a substituent and they are fused to each other.

The metal complexes have the strong nature of an n-type semiconductor and large ability of injecting electrons. Further, the energy generated at the time of forming a complex is small so that a metal is then strongly bonded to ligands in the complex formed and the fluorescent quantum efficiency becomes large as the emitting material.

Specific examples of the substituents for the rings $A^{301}$ and $A^{302}$ forming the ligand of the formula (K) include halogen atoms such as chlorine, bromine, iodine, and fluorine, substituted or unsubstituted alkyl groups such as a methyl group, ethyl group, propyl group, butyl group, sec-butyl group, tert-butyl group, pentyl group, hexyl group, heptyl group, octyl group, stearyl group, and trichloromethyl group, substituted or unsubstituted aryl groups such as a phenyl group, naphthyl group, biphenyl group, anthranyl group, phenanthryl group, fluorenyl group, pyrenyl group, 3-methylphenyl group, 3-methoxyphenyl group, 3-fluorophenyl group, 3-trichloromethylphenyl group, 3-trifluoromethylphenyl group, and 3-nitrophenyl group, substituted or unsubstituted alkoxy groups such as a methoxy group, n-butoxy group, tert-butoxy group, trichloromethoxy group, trifluoroethoxy group, pentafluoropropoxy group, 2,2,3,3-tetrafluoropropoxy group, 1,1,1,3,3,3-hexafluoro-2-propoxy group, and 6-(perfluoroethyl)hexyloxy group, substituted or unsubstituted aryloxy groups such as a phenoxy group, p-nitrophenoxy group, p-tert-butylphenoxy group, 3-fluorophenoxy group, pentafluorophenoxy group, and 3-trifluoromethylphenoxy group, substituted or unsubstituted alkylthio groups such as a methylthio group, ethylthio group, tert-butylthio group, hexylthio group, octylthio group, and trifluoromethylthio group, substituted or unsubstituted arylthio groups such as a phenylthio group, p-nitrophenylthio group, p-tert-butylphenylthio group, 3-fluorophenylthio group, pentafluorophenylthio group, and 3-trifluoromethylphenylthio group, a cyano group, a nitro group, an amino group, mono- or di-substituted amino groups such as a methylamino group, diethylamino group, ethylamino group, diethylamino group, dipropylamino group, dibutylamino group, and diphenylamino group, acylamino groups such as a bis(acetoxymethyl)amino group, bis(acetoxyethyl)amino group, bis(acetoxypropyl)amino group, and bis(acetoxybutyl)amino group, a hydroxyl group, a siloxy group, an acyl group, substituted or unsubstituted carbamoyl groups such as a carbamoyl group, a methylcarbamoyl group, dimethylcarbamoyl group, ethylcarbamoyl group, diethylcarbamoyl group, proypylcarbamoyl group, butylcarbamoyl group, and phenylcarbamoyl group, a carboxylic acid group, a sulfonic acid group, an imide group, cycloalkyl groups such as a cyclopentane group and a cyclohexyl group, heterocyclic groups such as a pyridinyl group, pyrazinyl group, pyrimidinyl group, pyridazinyl group, triazinyl group, indolinyl group, quinolinyl group, acridinyl group, pyrrolidinyl group, dioxanyl group, piperidinyl group, morpholidinyl group, piperazinyl group, carbazolyl group, furanyl group, thiophenyl group, oxazolyl group, oxadiazolyl group, benzooxazolyl group, thiazolyl group, thiadiazolyl group, benzothiazolyl group, triazolyl group, imidazolyl group, and benzimidazolyl group, and the like. The above substituents may be bonded to further form a six-membered aryl ring or heterocyclic ring.

A preferred embodiment of the organic EL device is a device containing a reducing dopant in an electron-transferring region or in an interfacial region between the cathode and the organic layer. The reducing dopant is defined as a substance which can reduce an electron-transferring compound. Accordingly, various substances which have given reducing properties can be used. For example, at least one substance can be preferably used which is selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, alkali metal carbonates, alkaline earth metal carbonates, rare earth metal carbonates, alkali metal organic complexes, alkaline earth metal organic complexes, and rare earth metal organic complexes.

More specific examples of the preferred reducing dopants include at least one alkali metal selected from the group comprising Li (work function: 2.9 eV), Na (work function: 2.36 eV), K (work function: 2.28 eV), Rb (work function: 2.16 eV) and Cs (work function: 1.95 eV), and at least one alkaline earth metal selected from the group comprising Ca (work function: 2.9 eV), Sr (work function: 2.0 to 2.5 eV), and Ba (work function: 2.52 eV). The one having a work function of 2.9 eV or less is preferable.

Among these, a more preferable reducing dopant is at least one alkali metal selected from the group comprising K, Rb and Cs. Even more preferable is Rb or Cs. Most preferable is Cs.

These alkali metals are particularly high in reducing ability. Thus, the addition of a relatively small amount thereof to an electron-injecting zone improves the luminance of the organic EL device and make the lifetime thereof long. As a reducing agent having a work function of 2.9 eV or less, combinations of two or more alkali metals are preferable, and particularly combinations including Cs, such as Cs and Na, Cs and K, Cs and Rb, or Cs, Na and K, are preferable.

The combination containing Cs makes it possible to exhibit the reducing ability efficiently. The luminance of the organic EL device can be improved and the lifetime thereof can be made long by the addition thereof to its electron-injecting zone.

In the invention, an electron-injecting layer made of an insulator or a semiconductor may further be provided between a cathode and an organic layer. By forming the electron-injecting layer, a current leakage can be effectively prevented and electron-injecting properties can be improved.

As the insulator, at least one metal compound selected from the group comprising alkali metal calcogenides, alkaline earth metal calcogenides, halides of alkali metals and halides of alkaline earth metals can be preferably used. When the electron-injecting layer is formed of the alkali metal calcogenide or the like, the injection of electrons can be preferably further improved.

Specifically preferable alkali metal calcogenides include $Li_2O$, LiO, $Na_2S$, $Na_2Se$ and NaO and preferable alkaline earth metal calcogenides include CaO, BaO, SrO, BeO, BaS and CaSe. Preferable halides of alkali metals include LiF, NaF, KF, CsF, LiCl, KCl and NaCl. Preferable halides of alkaline earth metals include fluorides such as $CaF_2$, $BaF_2$, $SrF_2$, $MgF_2$ and $BeF_2$ and the other halides than fluorides.

Semiconductors forming an electron-injecting and transporting layer include one or combinations of two or more of oxides, nitrides, and oxidized nitrides containing at least one element of Ba, Ca, Sr, Yb, Al, Ga, In, Li, Na, Cd, Mg, Si, Ta, Sb and Zn.

An inorganic compound forming an electron-injecting and transporting layer is preferably a microcrystalline or amorphous insulating thin film. When the electron-transporting layer is formed of the insulating thin films, more uniformed thin film is formed whereby pixel defects such as a dark spot are decreased.

Examples of such an inorganic compound include the above-mentioned alkali metal calcogenides, alkaline earth metal calcogenides, halides of alkali metals, and halides of alkaline earth metals.

(7) Cathode

As the cathode, in order to inject electrons to the electron-injecting and transporting layer or the emitting layer, a metal having a small work function (4 eV or less), an alloy, an electroconductive compound or a mixture thereof is used as an electrode material. Specific examples of the electrode substance include sodium, sodium-potassium alloy, magnesium, lithium, magnesium/silver alloy, aluminum/aluminum oxide, aluminum/lithium alloy, indium, and rare earth metals.

This cathode can be made by forming the electrode substances into a thin film by vapor deposition, sputtering or some other method.

In the case where light is emitted from the emitting layer through the cathode, the cathode preferably has a light transmittance of larger than 10%.

The sheet resistance of the cathode is preferably several hundred $\Omega/\square$ or less, and the film thickness thereof is usually from 10 nm to 1 μm, preferably from 50 to 200 nm.

(8) Insulating Layer

In the organic EL device, pixel defects based on leakage or a short circuit are easily generated since an electric field is applied to the super thin film. In order to prevent this, it is preferred to insert an insulative thin layer between the pair of electrodes.

Examples of the material used in the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide. These may be mixed or stacked.

(9) Method for Producing an Organic EL Device

As for the method for forming an organic EL device, for example, by using the above-mentioned materials and methods, necessary layers are formed successively from an anode, and a cathode is finally formed. The organic EL device can be fabricated in the order reverse to the above, i.e., the order from a cathode to an anode.

An example of the fabrication of the organic EL device will be described below which has a structure wherein the following are successively formed on a transparent substrate: anode/hole-injecting layer/emitting layer/electron-injecting layer/cathode.

First, a thin film made of an anode material is formed on a transparent substrate by the deposition method or by the sputtering method, thereby to form an anode. Next, a hole-injecting layer is formed on this anode. The hole-injecting layer can be formed by vacuum vapor deposition, spin coating, casting, LB technique, or some other method. Vacuum vapor deposition is preferred since a homogenous film is easily obtained and pinholes are not easily generated. It is preferable to form by coating methods, such as the spin coating method, from the viewpoint of increasing the area and reducing the cost. In the case where the hole-injecting layer is formed by vacuum vapor deposition, conditions for the deposition vary depending upon a compound used (a material for the hole-injecting layer), a desired structure of the hole-injecting layer, and others. In general, the conditions are preferably selected from the following: deposition source temperature of 50 to 450° C., vacuum degree of $10^{-7}$ to $10^{-3}$ Torr, vapor deposition rate of 0.01 to 50 nm/second, and substrate temperature of −50 to 300° C.

Next, an emitting layer is formed on the hole-injecting layer. Although an emitting layer can be formed by forming an emitting material into a thin film by methods such as a vacuum vapor deposition method, sputtering, spin coating method, a casting method or the like, in respect for easiness in forming a uniform film, unlikelihood of generation of piholes, or the like, it is preferable to form an emitting layer by the vacuum vapor deposition method. It is preferable to form by coating methods, such as the spin coating method, from the viewpoint of increasing the area and reducing the cost. In the case where the emitting layer is formed by vacuum vapor deposition, conditions for the deposition, which vary depending on a compound used, can be generally selected from conditions similar to those for the hole-injecting layer.

Next, an electron-injecting layer is formed on the emitting layer. Also in this case, it is preferable to form by a vacuum vapor deposition method in respect of the need of obtaining a uniform film, as in the case of the hole-injecting layer and the emitting layer. It is preferable for form a film by a coating method such as spin coating method in respect of increasing the area and reducing the cost. Conditions for the deposition can be selected from conditions similar to those for the hole-injecting layer and the emitting layer.

Lastly, a cathode is stacked thereon to obtain an organic EL device. The cathode can be formed by the deposition or sputtering. However, vapor vacuum deposition is preferred in order to protect underlying organic layers from being damaged when the cathode film is formed.

For the organic EL device fabrication described above, it is preferred that the formation from the anode to the cathode be continuously carried out, using only one vacuuming operation.

The method for forming each of the layers in the organic EL device is not particularly limited. The organic thin film layer containing the compound of the invention can be formed by well-known methods, such as the vacuum deposition method, the molecular-beam-deposition method (the MBE method) or a coating method using a solution obtained by dissolving the compound of the invention in a solvent.

As the above-mentioned coating method, for example, the spin coating method, the casting method, the micro photogravure coating method, the photogravure coating method, the bar coating method, the roll coating method, the wire bar coating method, the dip coating method, the spray coating method, the screen-printing method, the flexographic printing method, the off-set printing method, the inkjet printing method etc. can be given. In respect of easiness in formation of a pattern, the screen-printing method, the flexographic printing method, the off-set printing method, and the ink-jet printing method are preferable. The film formation by these methods can be conducted under conditions which are well known to a person skilled in the art, and therefore, the details are not described.

It suffices that a solution for film forming contain at least one type of the polymer compound of the invention, and may contain, in addition to the polymer compound, a hole-transporting material, an electron-transporting material, an emitting material, a solvent, additives such as a stabilizer, or the like. The content of this polymer compound in this solution for film forming is preferably 1 to 100 wt %, more preferably 50 to 100 wt % relative to the total weight of the composition excluding the solvent. The amount ratio of the solvent is preferably 0.1 to 20 wt %, more preferably 0.5 to 10 wt %, relative to the solution for film formation.

The solution for film forming may contain an additive for adjusting viscosity and/or surface tension such as a thickening agent (a a high-molecular weight compound, a poor solvent of the polymer compound of the invention or the like), a viscosity decreasing agent (low-molecular-weight compound or the like), a surfactant or the like. Moreover, in order to improve preservation stability, a phenol-based antioxidant, a phosphor-based antioxidant or the like, which do not adversely affect the performance of the organic EL device may be contained.

Examples of the solvent for the solution for film forming include chlorine-based solvents such as chloroform, methylene chloride, 1,2-dicycloethane, carbon tetrachloride, tetrachloroethane, 1,1,2-trichloroethane, chlorobenzene, and o-dichlorobenzene; ether-based solvents such as dibutyl ether, tetrahydrofuran, dioxane and anisole; aromatic solvents which may have an alkyl group, an alkoxy group and a halogen such as benzene, dodecylbenzene, toluene, chlorotoluene and xylene; aliphatic hydrocarbon solvents such as cyclohexane, methyl cyclohexane, n-pentane, n-hexane, n-heptane, n-octane, n-nonan and n-decan; ketone-based solvents such as acetone, methyl ethyl ketone, methyl butyl ketone, cyclohexanone, cycloheptanone, cyclopentanone, cyclooctanone, benzophenone and acetophenone; ester-based solvents such as ethyl acetate, butyl acetate, ethylcellosolve acetate, methyl benzoate, phenyl acetate and amyl acetate; polyvalent alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin and 1,2-hexandiol and its derivatives; alcohol-based solvents such as methanol, ethanol, propanol, butanol, pentanol, hexanol, octanol, nonanol, benzyl alcohol, isopropanol, cyclohexanol and ethyl cellosolve; sulfoxide-based solvents such as dimethyl sulfoxide and amide-based solvents such as N-methyl-2-pyrrolidone and N,N-dimethylformamide. Moreover, these organic solvents may be used alone or in combination of two or more. Of these, in respect of solubility, uniform film formation, viscosity properties or the like, aromatic hydrocarbon-based solvents, ether-based solvents, aliphatic hydrocarbon-based solvents, ester-based solvents and ketone-based solvents are preferable. Toluene, xylene, ethylbenzene, diethylbenzene, trimethylbenzene, n-propylbenzene, isopropylbenzene, n-butylbenzene, isobutylbenzene, 5-butylbenzene, n-hexylbenzene, cyclohexylbenzene, 1-methylnaphthalene, tetralin, anisole, ethoxybenzene, cyclohexane, bicylohexyl, cyclohexenylcyclohexanone, n-heptylcyclohexane, n-hexylcyclohexane, decaline, methyl benzoate, cyclohexanone, 2-propylcyclohexanone, 2-heptanone, 3-heptanone, 4-heptanone, 2-octanone, 2-nonanone, 2-decanone, dicyclohexylketone, acetophenone and benzophenone are more preferable.

EXAMPLES

Hereinbelow, the invention will be explained in more detail.

The following intermediates 1 to 17 were synthesized, and the polymer compounds (A) to (C) were synthesized in Examples 1 to 3 given later.

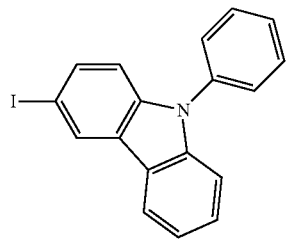

Intermediate 1

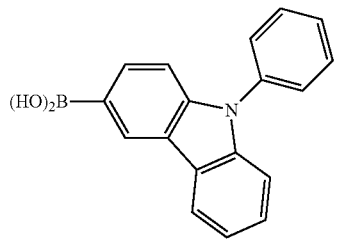

Intermediate 2

-continued
Intermediate 3
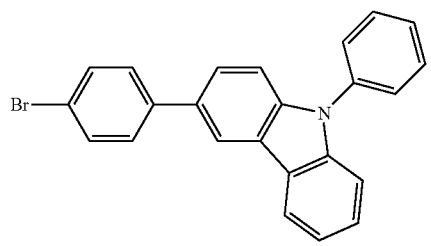
Intermediate 4
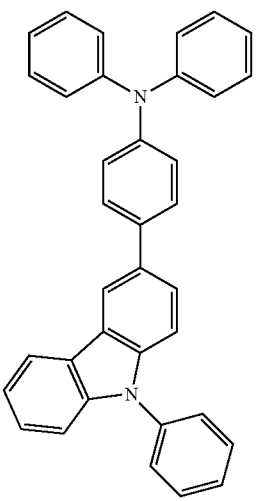
Intermediate 5
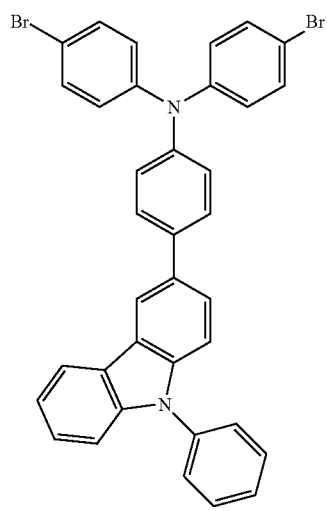
Intermediate 6
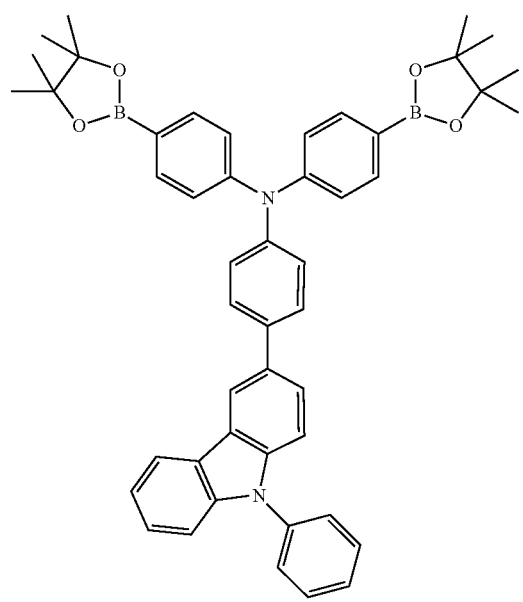

Intermediate 7
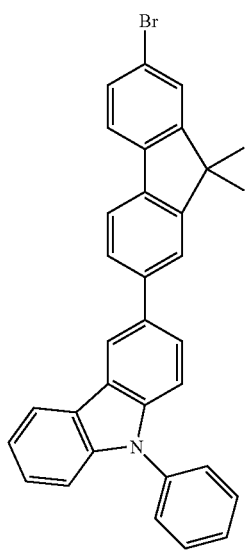
Intermediate 8
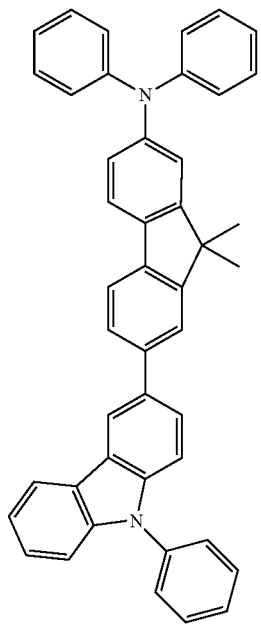
Intermediate 9
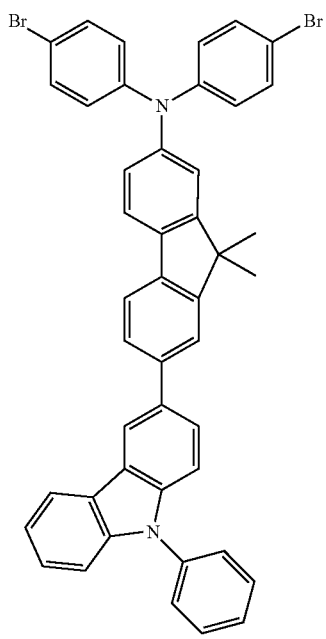
Intermediate 10
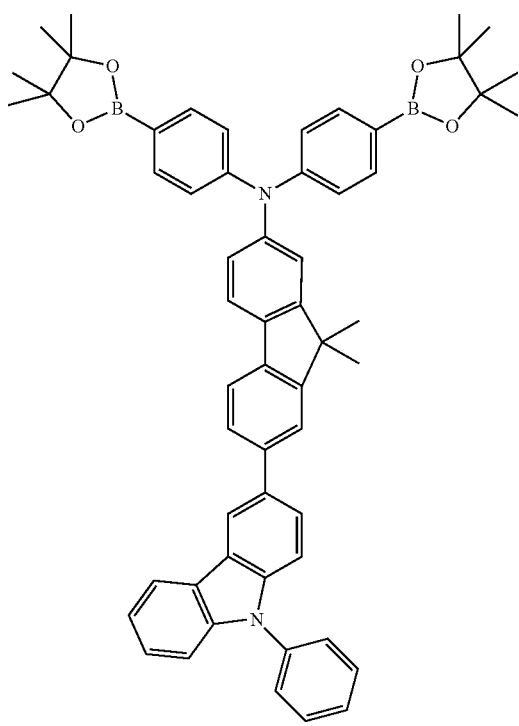

-continued
Intermediate 11
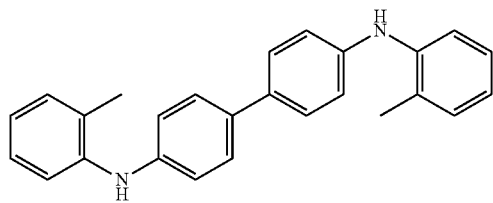
Intermediate 12
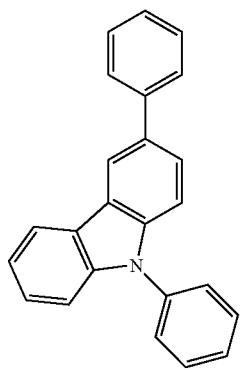
Intermediate 13
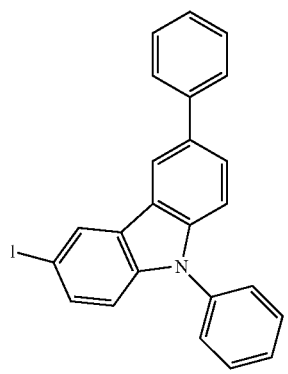
Intermediate 14
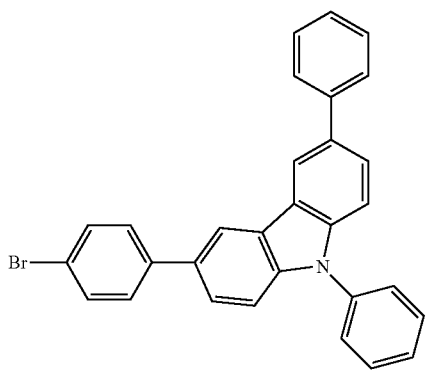
Intermediate 15
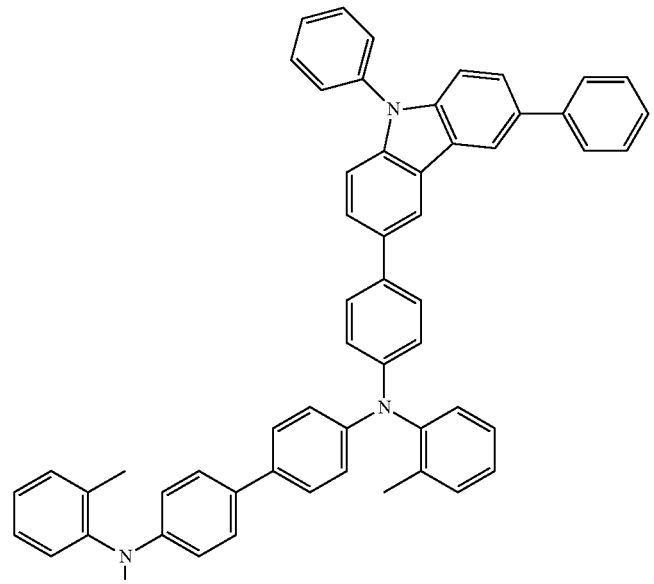

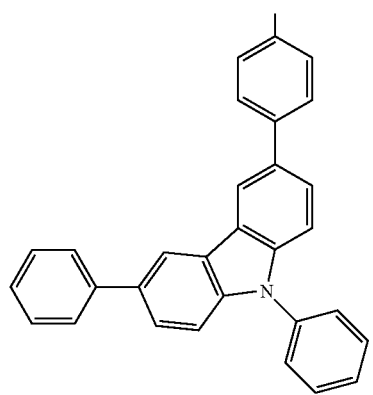
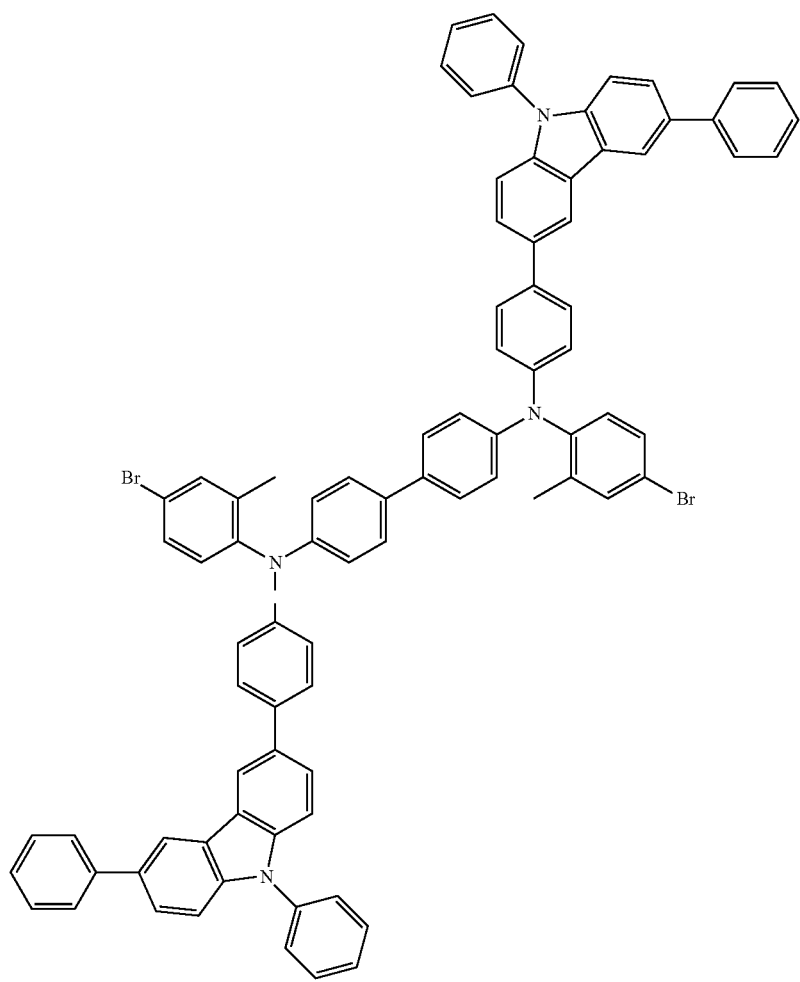
Intermediate 16

Intermediate 17

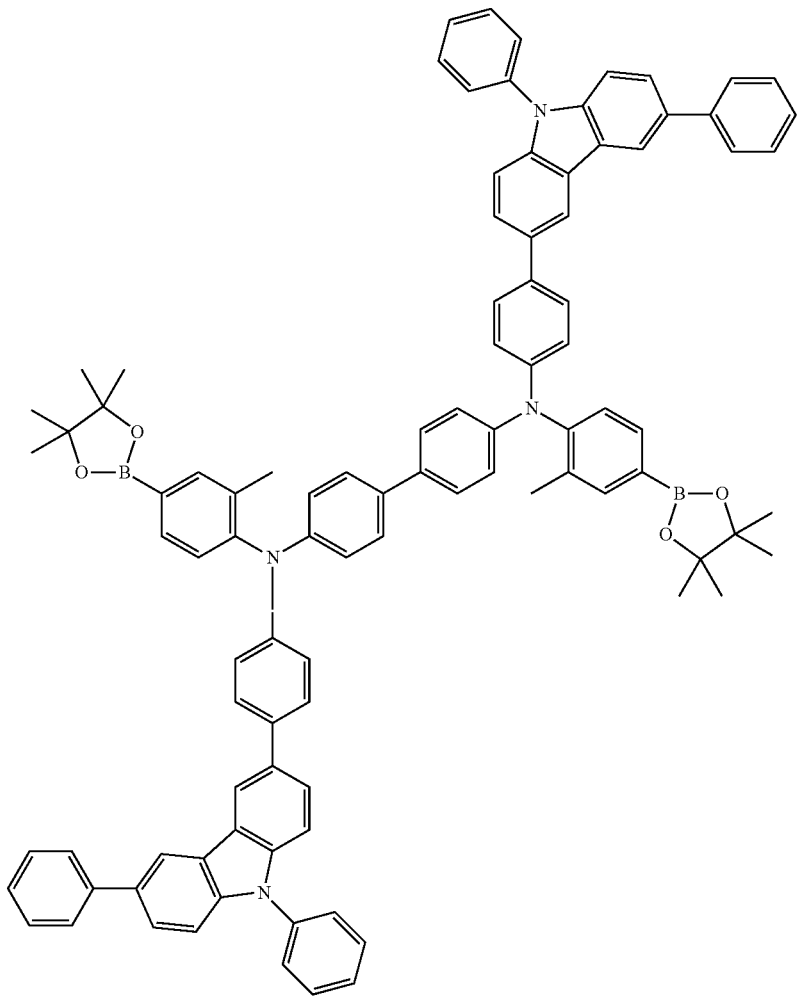

[Synthesis of Intermediate]
Intermediate 1

17.7 g of 9-phenylcarbazole, 6.03 g of potassium iodide, 7.78 g of potassium iodate, 5.90 mL of sulfuric acid and ethanol were placed, and the resulting mixture was reacted at 75° C. for 2 hours.

After cooling, clean water and ethyl acetate were added, and the mixture was separated and extracted. Then, sodium bicarbonate water and clean water were added to wash an organic layer and allow it to be concentrated. The resulting crude product was purified by silica gel chromatography (toluene). The resulting solid was dried under reduced pressure, whereby 21.8 g of white solid was obtained. As a result of the analysis of FD-MS (Field Desorption Mass Spectrometry), the solid was identified as the intermediate 1.

Intermediate 2

Under an argon stream, to 13.1 g of the intermediate 1, dehydrated toluene and dehydrated ether were added, and the resultant was cooled to −45° C. Then, 25 ml of a n-butyl lithium hexane solution (1.58M) was added dropwise, and heated to −5° C. over 1 hour with stirring. Then, the mixture was again cooled to −45° C., and after 25 mL of triisopropyl boronate was added dropwise slowly, a reaction was conducted for 2 hours.

After heating to room temperature, a 10% dilute hydrochloric acid solution was added, followed by stirring. An organic layer was extracted. After washing with a saturated saline solution, the mixture was dried with anhydrous magnesium sulfate, and the resultant was filtered and concentrated. The solid thus obtained was purified by silica gel chromatography (toluene). The resulting solid was washed with n-hexane, followed by drying under reduced pressure, whereby 7.10 g of a solid was obtained. As a result of the analysis of FD-MS, the solid was identified as the intermediate 2.

Intermediate 3

21.8 g of the intermediate 1, 11.8 g of 4-bromophenylboronic acid, 1.38 g of Pd(PPh$_3$)$_4$, 21.9 g of sodium carbonate, clean water and dimethoxyethane were mixed. The resulting mixture was allowed to react for 8 hours under reflux.

After cooling, the reaction solution was filtered, and the filtration residue was extracted with acetone, and the separated aqueous layer was extracted with dichloromethane. The collected filtrate was separated, followed by addition of acetone and dichloromethane. The resulting mixture was separated. The filtration residue was extracted with acetone, and the separated aqueous layer was extracted with dichloromethane. The organic layer thus collected was washed with clean water, concentrated, and the resulting crude product was purified with silica gel chloromatography (hexane:dichloromethane=9:1). The resulting solid was recrystallized from toluene and methanol, and dried under reduced pressure, whereby 4.18 g of white solids was obtained. As a result of the analysis of FD-MS, the solid was identified as the intermediate 3.

Intermediate 4

Under argon stream, 3.7 g of diphenylamine, 8.0 g of the intermediate 3, 231 mg of Pd$_2$(dba)$_3$, 325 mg of P(t-Bu)$_3$, 2.9 g of tert-butoxy sodium and toluene were mixed. The resulting mixture was allowed to react at 80° C. for 4 hours. Here, "dba" means dibenzylideneacetone.

After cooling, toluene was added, celite filtration was conducted. The filtrate was concentrated, and purified by silica gel chromatography (hexane:dichloromethane=6:1). The resulting solid was washed with n-hexane, and dried under a reduced pressure, whereby 7.0 g of yellowish white solids were obtained. As a result of the analysis of FD-MS, the solid was identified as the intermediate 4.

Intermediate 5

Under argon stream, 7.0 g of the intermediate 4 was put in dehydrated N,N-dimethylformamide. The resultant was cooled on ice. Then, a dehydrated N,N-dimethylformamide solution in which 5.3 g of N-bromosuccinimide had been dissolved was added dropwise. After the dropwise addition, the reaction was conducted at room temperature for 4 hours.

Then, the deposited crystals were taken out by titration, and washed with methanol. Thereafter, the resultant was dried under reduced pressure, whereby 7.3 g of white solids were obtained. As a result of the analysis of FD-MS, the solid was identified as the intermediate 5.

Intermediate 6

Under argon stream, 3.7 g of the intermediate 5, 4.1 g of bis(pinacolato)diboron, 395 mg of PdCl$_2$(dppf), 274 mg of bis(diphenylphosphino)ferrocene, 3.3 g of potassium acetate, and dehydrate dioxane were mixed. The resulting mixture was allowed to react with reflux at 100° C. for 28 hours. Here, "dppf" means diphenylphosphinoferrocene.

After cooling, celite filtration was conducted. The filtrate was concentrated, and purified by silica gel chromatography (toluene). The resulting solids were recrystallized from toluene and ethanol, and dried under a reduced pressure, whereby 2.9 g of white solids were obtained. As a result of the analysis of FD-MS, the solid was identified as the intermediate 6.

Intermediate 7

Synthesis was conducted by the same method as in the synthesis of the intermediate 3, except that the intermediate 2 was used instead of the intermediate 1 and 2-bromo-7-iode-9,9-dimethylfluorene was used instead of 4-bromophenylboronic acid. As a result of the analysis of FD-MS, the solid was identified as the intermediate 7.

Intermediate 8

Synthesis was conducted by the same method as in the synthesis of the intermediate 4, except that, the intermediate 7 was used instead of the intermediate 3. As a result of the analysis of FD-MS, the solid was identified as the intermediate 8.

Intermediate 9

Synthesis was conducted by the same method as in the synthesis of the intermediate 5, except that the intermediate 8 was used instead of the intermediate 4. As a result of the analysis of FD-MS, the solid was identified as the intermediate 9.

Intermediate 10

Synthesis was conducted by the same method as in the synthesis of the intermediate 6, except that the intermediate 9 was used instead of the intermediate 5. As a result of the analysis of FD-MS, the solid was identified as the intermediate 10.

Intermediate 11

Synthesis was conducted by the same method as in the synthesis of the intermediate 4, except that orthomethylaniline was used as diphenylamine and 4,4'-dibromobiphenyl was used instead of the intermediate 3. As a result of the analysis of FD-MS, the solid was identified as the intermediate 11.

Intermediate 12

Synthesis was conducted by the same method as in the synthesis of the intermediate 3, except that phenylboronic acid was used instead of 4-bromophenylboronic acid. As a result of the analysis of FD-MS, the solid was identified as the intermediate 12.

Intermediate 13

Synthesis was conducted by the same method as in the synthesis of the intermediate 1, except that the intermediate 12 was used instead of 9-phenyl carbazole. As a result of the analysis of FD-MS, the solid was identified as the intermediate 13.

Intermediate 14

Synthesis was conducted by the same method as in the synthesis of the intermediate 3, except that the intermediate 13 was used instead of the intermediate 1. As a result of the analysis of FD-MS, the solid was identified as the intermediate 14.

Intermediate 15

Synthesis was conducted by the same method as in the synthesis of the intermediate 4, except that the intermediate 11 was used instead of diphenylamine and the intermediate 14 was used instead of the intermediate 3. As a result of the analysis of FD-MS, the solid was identified as the intermediate 15.

Intermediate 16

Synthesis was conducted by the same method as in the synthesis of the intermediate 5, except that the intermediate 15 was used instead of the intermediate 4. As a result of the analysis of FD-MS, the solid was identified as the intermediate 16.

Intermediate 17

Synthesis was conducted by the same method as in the synthesis of the intermediate 6, except that the intermediate 16 was used instead of the intermediate 5. As a result of the analysis of FD-MS, the solid was identified as the intermediate 17.

[Synthesis of Polymer Compound]

Example 1

The following polymer compound (A) was synthesized.

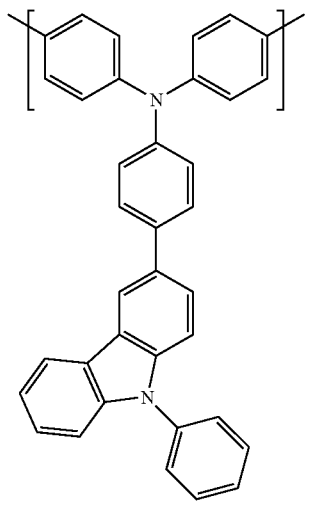

(A)

Under argon stream, 2.7 g of the intermediate 5, 2.9 g of the intermediate 6, 231 mg of Pd(PPh$_3$)$_4$, 0.5 g of Aliquat336 (manufactured by Aldrich), 25 ml of a 2M sodium carbonate solution and 25 mL of toluene were allowed to react under reflux for 28 hours. After the reaction, in order to allow the terminal of the bromo group to be blocked, 100 mg of phenyl boric acid was added, and the resultant was reacted under reflux for 4 hours. Then, in order to allow the terminal of the boronate group to be blocked, 100 mg of bromobenzene was added, and the resulting mixture was reacted under reflux for 4 hours.

After cooling, the reaction solution was poured to methanol, and the deposited polymer was washed with methanol and an aqueous dilute hydrochloric acid solution, followed by drying, whereby 2.5 g of compound A was obtained.

The molecular weight of the polymer compound (A) thus obtained was Mn=11000 and Mw=23000 (calibrated by standard polystyrene).

Example 2

The following polymer compound (B) was synthesized.

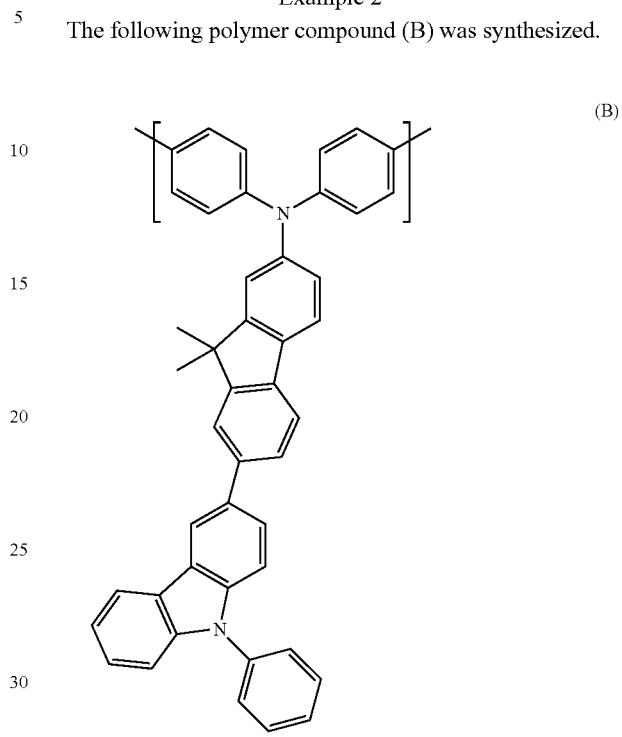

(B)

Synthesis was conducted by the same method as in the synthesis of the compound (A), except that, the intermediate 9 was used instead of the intermediate 5 and the intermediate 10 was used instead of the intermediate 6.

The molecular weight of the polymer compound (B) thus obtained was Mn=19000 and Mw=40000 (calibrated by standard polystyrene).

Example 3

The following polymer compound (C) was synthesized.

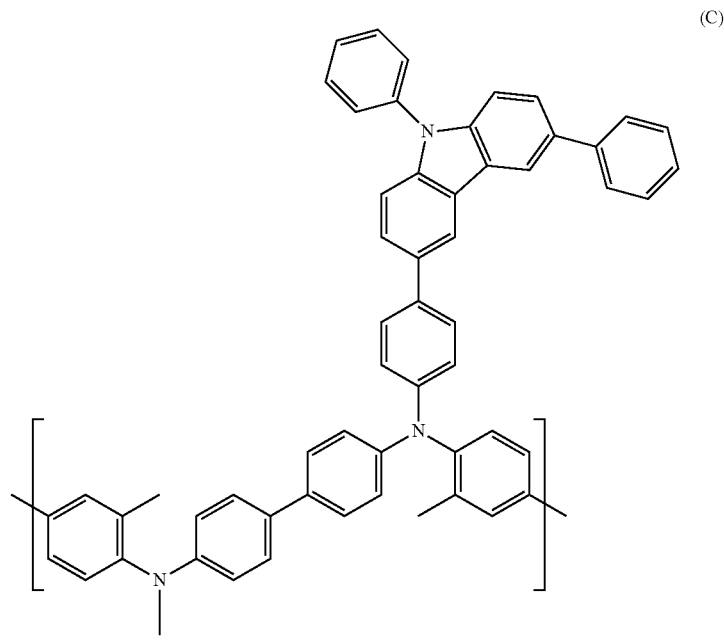

(C)

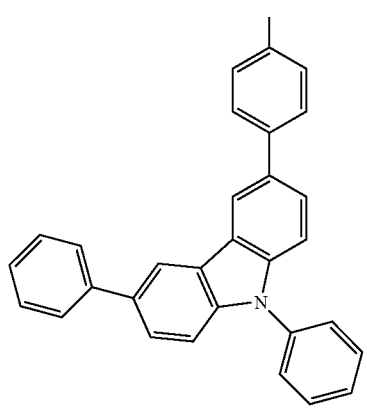

Synthesis was conducted by the same method as in the synthesis of the compound (A), except that the intermediate 16 was used instead of the intermediate 5 and the intermediate 17 was used instead of the intermediate 6.

The molecular weight of the polymer compound (C) thus obtained was Mn=50000 and Mw=100000 (calibrated by standard polystyrene).

[Fabrication of Organic EL Device]

Example 4

A glass substrate of 25 mm by 75 mm by 1.1 mm thick with ITO transparent electrode lines (GEOMATEC CO., LTD.) was subjected to ultrasonic cleaning with isopropyl alcohol for 5 minutes, and cleaned with ultraviolet rays and ozone for 30 minutes. The cleaned glass substrate with transparent electrode lines was mounted on a substrate holder in a vapor vacuum deposition device. First, a 60 nm-thick polyethylenedioxythiophene polystyrene sulfonic acid (PEDOT PSS), which was to be used in a hole-injecting layer, was formed by spin coating so as to cover the surface of the transparent electrode on which the transparent electrode lines were formed. Subsequent to the formation of this film, a 1.0 wt % toluene solution of the above-mentioned compound (A) was formed in a film of 20 nm by spin coating. As a result, an uniform film was obtained. This film functioned as a hole-transporting layer. This was dried at 120° C. under a reduced pressure for 1 hour. The following compound EM1 was deposited in a film thickness of 40 nm. At the same time, as the emitting molecule, an amine compound D1 which has the following styryl group was deposited such that the weight ratio of EM1 and D1 became 40:2. This film functioned as the emitting layer. On this film, an Alq film was formed into a thickness of 10 nm. This film functioned as an electron-injecting layer. Thereafter, Li as the reducing dopant (Li source: manufactured by Saes Getters, Co., Ltd.) and Alq were co-deposited, whereby an Alq:Li film (film thickness: 10 nm) was formed as the electron-injecting layer (cathode). On this Alq:Li film, a metal Al was deposited to form a metallic cathode, whereby an organic EL device was produced.

For the organic EL device thus obtained, emission color was observed, and the luminous efficiency (Current efficiency) and half life time at an initial luminance of 2000 cd/m², at room temperature and at DC constant current driving were measured. The measurement results are shown in Table 1.

EM1

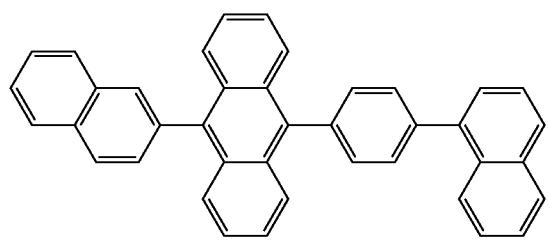

D1

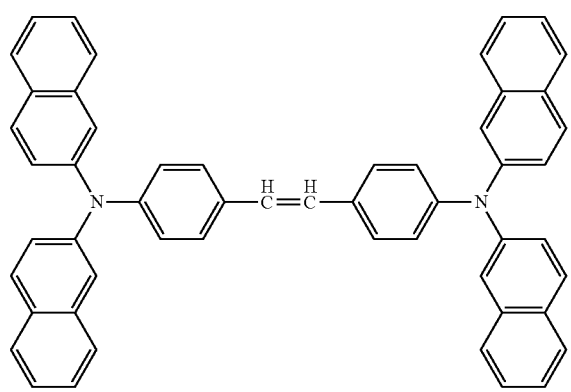

Alq

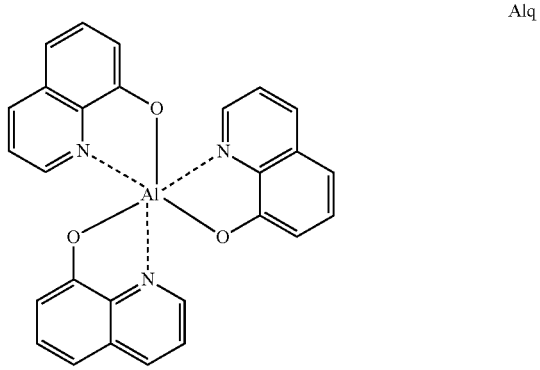

TABLE 1

| Example | Compound | Current efficiency (cd/A) | Half life time (n) | Emission color |
|---|---|---|---|---|
| Example 4 | A | 6.9 | 900 | Blue |
| Example 5 | B | 7.1 | 880 | Blue |
| Example 6 | C | 7.2 | 870 | Blue |
| Example 7 | A | 6.1 | 800 | Blue |
| Example 8 | A | 6.5 | 850 | Blue |
| Example 9 | A | 6.8 | 950 | Blue |
| Com. Example 1 | PVCz | 3.5 | 350 | Blue |

Examples 5 and 6

An organic EL device was fabricated and evaluated in the same manner as in Example 4, except that the compounds shown in Table 1 were used as the hole-transporting material instead of the compound (A). The results are shown in Table 1.

Example 7

An organic EL device was fabricated and evaluated in the same manner as in Example 4, except that the following arylamine compound D2 was used instead of the the amine compound D1 having a styryl group. The results are shown in Table 1.

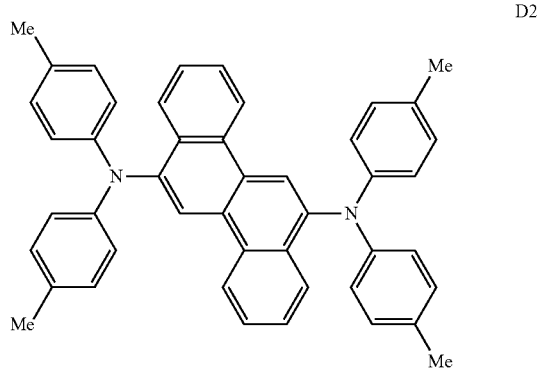

D2

(Me is a methyl group)

Example 8

A glass substrate of 25 mm by 75 mm by 1.1 mm thick with an ITO transparent electrode (GEOMATEC CO., LTD.) was subjected to ultrasonic cleaning with isopropyl alcohol for 5 minutes, and cleaned with ultraviolet rays and ozone for 30 minutes. The cleaned glass substrate with transparent electrode lines was mounted on a substrate holder in a vacuum deposition device. First, a 1.0 wt % toluene solution of the above-mentioned compound (A) was formed in a thickness of 60 nm by spin coating so as to cover the surface of the transparent electrode on which the transparent electrode lines were formed. A uniform film was obtained. This film functioned as a hole-injecting and transporting layer. After drying this film under a reduced pressure at 120° C. for 1 hour, a compound EM1 was formed into a film by deposition in a film thickness of 40 nm. Simultaneously, as the emitting molecule, the following amine compound D1 having a styryl group was deposited such that the weight ratio of EM1 and D1 became 40:2. This film functioned as an emitting layer. A 10 nm-thick Alq film was formed thereon. The film serves as an electron-injecting layer. Then, Li as a reductive dopant (Li source: manufactured by SAES Getters Co., Ltd.) and Alq were co-deposited, whereby an Alq:Li film (film thickness: 10 nm) was formed as an electron-injecting layer (cathode). Metal aluminum was deposited on the Alq:Li film to form a metallic cathode, whereby an organic EL device was fabricated.

The resulting organic EL device was evaluated in the same manner as in Example 4. The results are shown in Table 1.

Example 9

A glass substrate of 25 mm by 75 mm by 1.1 mm thick with an ITO transparent electrode (GEOMATEC CO., LTD.) was subjected to ultrasonic cleaning with isopropyl alcohol for 5 minutes, and cleaned with ultraviolet rays and ozone for 30 minutes. The cleaned glass substrate with transparent electrode lines was mounted on a substrate holder in a vacuum vapor deposition device. First, a 1.0 wt % toluene solution of the above-mentioned compound (A) was formed in a thickness of 40 nm by spin coating so as to cover the surface of the transparent electrode on which the transparent electrode lines were formed. A uniform film was obtained. This film functioned as a hole-injecting layer. This film was dried under a reduced pressure at 120° C. for 1 hour. On this film, as a hole-transporting layer, N,N,N',N'-tetrakis(4-biphenyl)-4,4'-benzidine was deposited in a thickness of 20 nm. Further, a compound EM1 with a thickness of 40 nm was deposited thereon to form a film. Simultaneously, as the emitting molecule, the following amine compound D1 having a styryl group was deposited such that the weight ratio of EM1 and D1 became 40:2. This film functioned as an emitting layer. A 10 nm-thick Alq film was formed on this film. The film serves as an electron-injecting layer. Then, Li as a reductive dopant (Li source: manufactured by SAES Getters Co., Ltd.) and Alq were co-deposited, whereby an Alq:Li film (film thickness: 10 nm) was formed as an electron-injecting layer (cathode). Metal aluminum was deposited on the Alq:Li film to form a metallic cathode, whereby an organic EL device was fabricated.

The resulting organic EL device was evaluated in the same manner as in Example 4. The results are shown in Table 1.

Comparative Example 1

An organic EL device was fabricated in the same manner as in Example 4, except that, as the hole-transporting material, a 1.0 wt % methylene chloride solution of poly(N-vinylcarbazole) (PVCz) was formed into a 60 nm-thick film by spin coating instead of the compound (A).

The resulting organic EL device was evaluated in the same manner as in Example 4. The results are shown in Table 1.

The following intermediates 18 to 40 were synthesized, and polymer compounds (D) to (H) were synthesized in the examples given later.

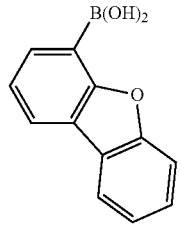

Intermediate 18

-continued
Intermediate 19
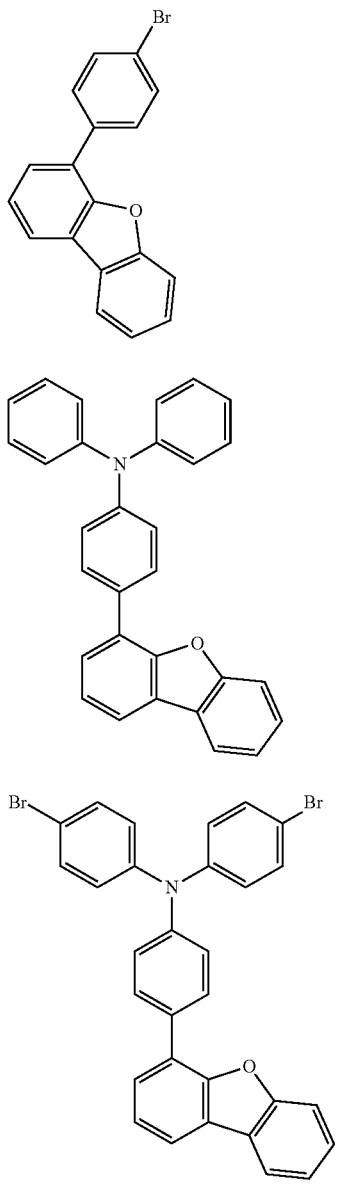
Intermediate 20
Intermediate 21
Intermediate 22
-continued
Intermediate 23
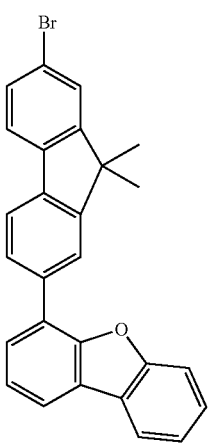
Intermediate 24
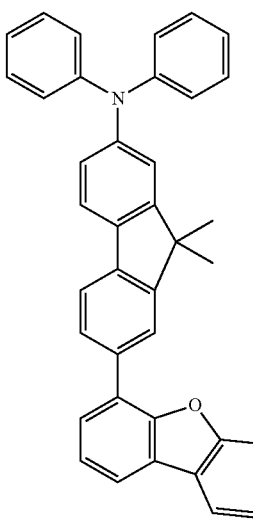
Intermediate 25
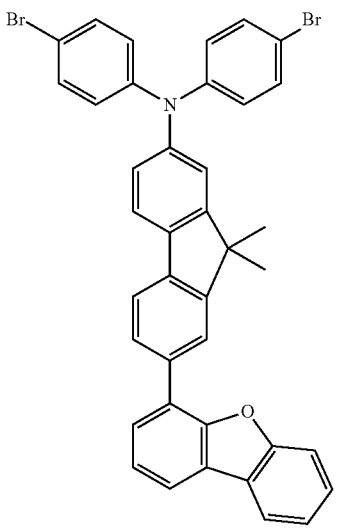

Intermediate 26
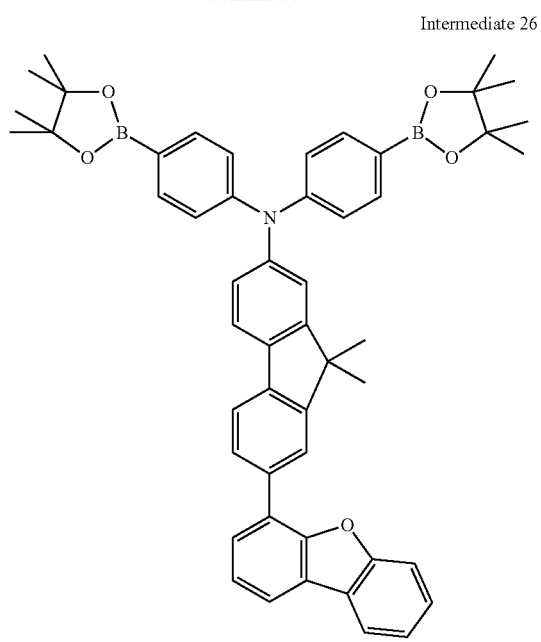
Intermediate 27
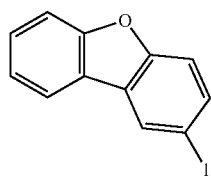
Intermediate 28
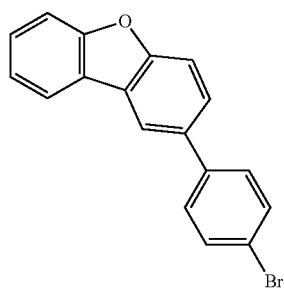
Intermediate 29
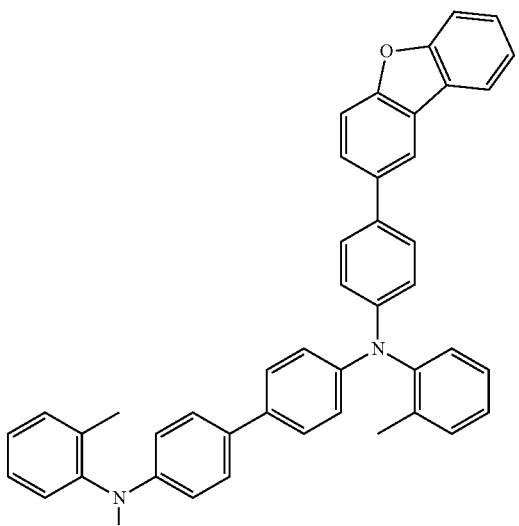
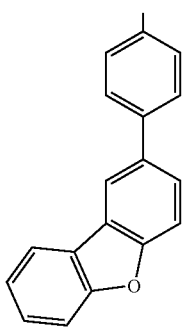
Intermediate 30
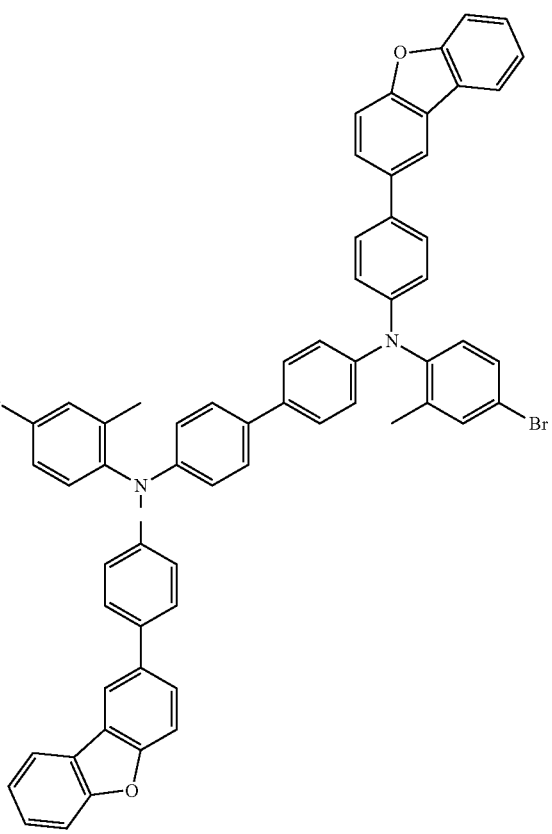

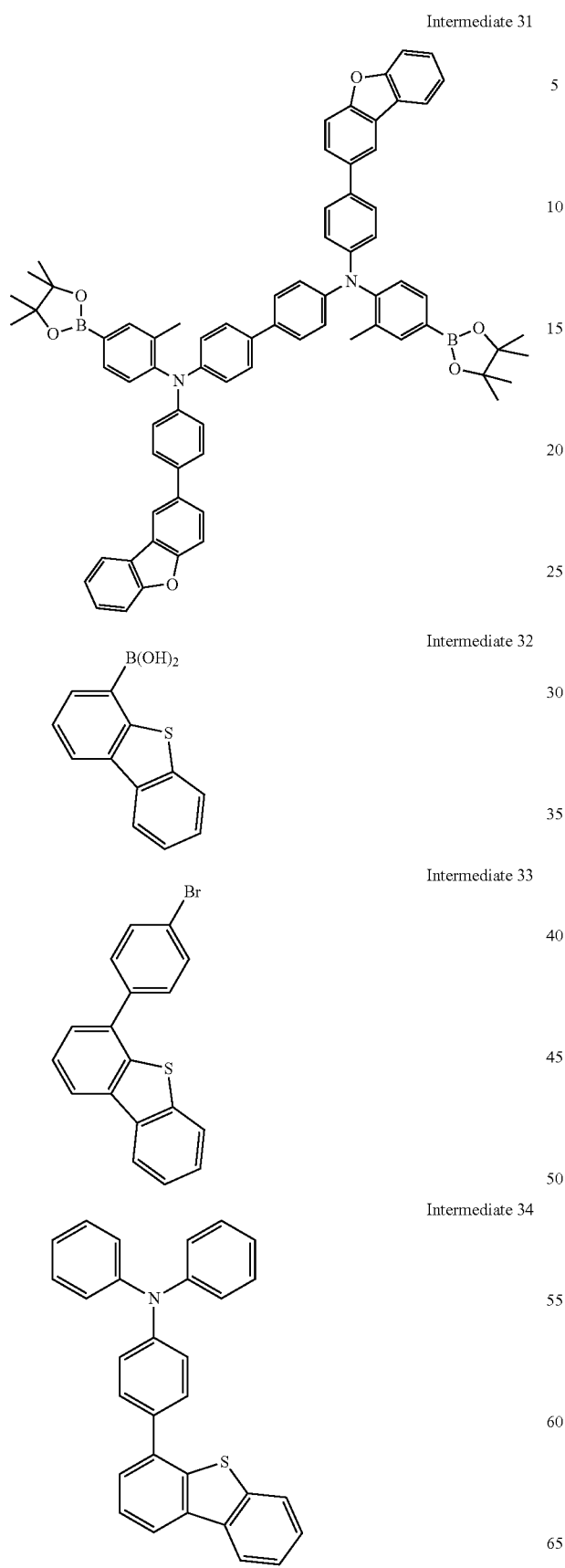
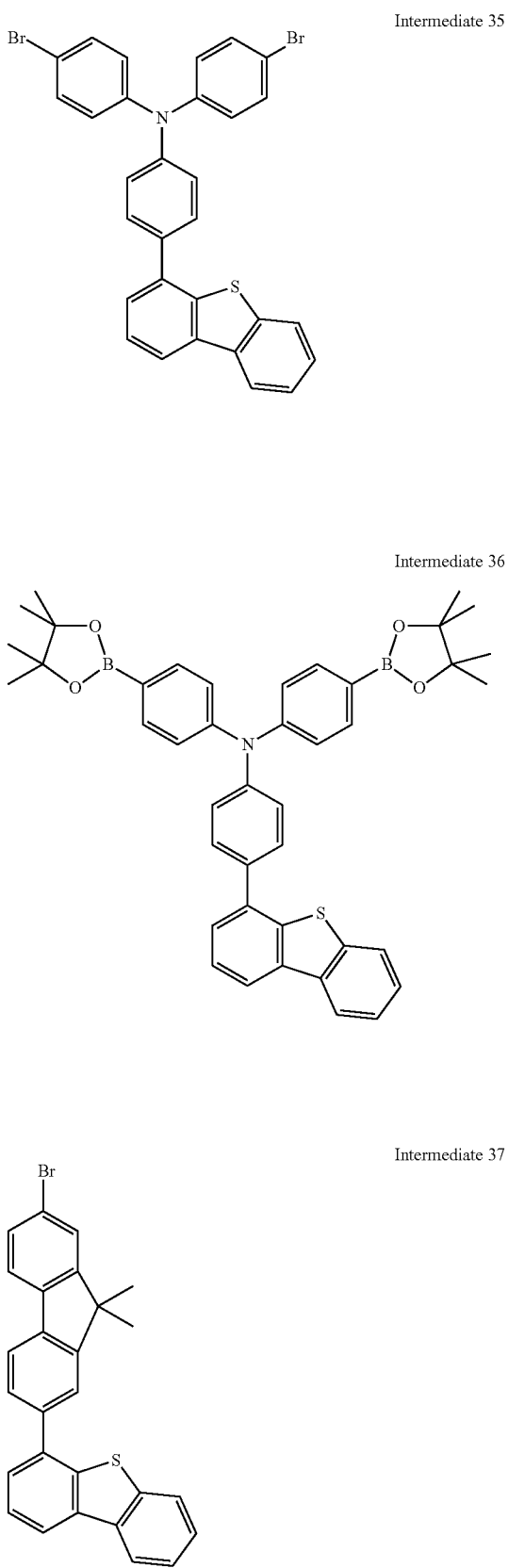

Intermediate 38

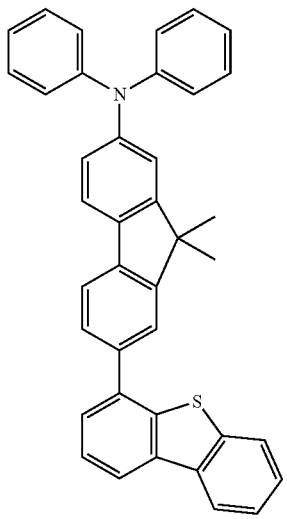

Intermediate 39

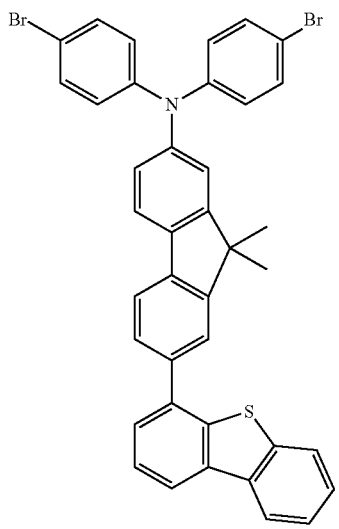

Intermediate 40

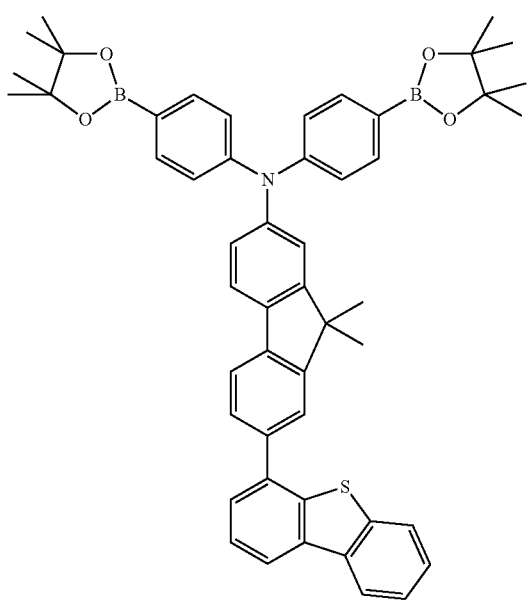

[Synthesis of Intermediate]

Intermediate 18

Under argon stream, dehydrated toluene and dehydrated ether were added to 5.8 g of dibenzofuran. The resulting mixture was cooled to −45° C. 26 mL of a n-butyl lithium hexane solution (1.58M) was added dropwise. The mixture was heated to −5° C. for 1 hour with stirring. The mixture was again cooled to −45° C., 25 ml of boronic triisopropyl ester was added dropwise slowly, and the mixture was allowed to react for 2 hours.

After heating to the room temperature, a 10% dilute hydrochloric solution was added, followed by stirring, whereby an organic layer was extracted. After washing with a saturated saline solution, the organic layer was dried with anhydrous magnesium sulfate, filtered and concentrated. The solid thus obtained was purified by silica gel chromatography (toluene). The resulting solid was then washed with n-hexane, and dried under a reduced pressure, whereby a solid of 5.3 g was obtained. As a result of the analysis of FD-MS, the solid was identified as the intermediate 18.

Intermediate 19

Synthesis was conducted by the same method as in the synthesis of the intermediate 3, except that the intermediate 18 was used instead of the intermediate 1 and 1-bromo-4-iodophenyl was used instead of 4-bromophenylboronic acid. As a result of the analysis of FD-MS, the solid was identified as the intermediate 19.

Intermediate 20

Synthesis was conducted by the same method as in the synthesis of the intermediate 4, except that the intermediate 19 was used instead of the intermediate 3. As a result of the analysis of FD-MS, the solid was identified as the intermediate 20.

Intermediate 21

Synthesis was conducted by the same method as in the synthesis of the intermediate 5, except that the intermediate 20 was used instead of the intermediate 4. As a result of the analysis of FD-MS, the solid was identified as the intermediate 21.

Intermediate 22

Synthesis was conducted by the same method as in the synthesis of the intermediate 6, except that the intermediate 21 was used instead of the intermediate 5. As a result of the analysis of FD-MS, the solid was identified as the intermediate 22.

Intermediate 23

Synthesis was conducted by the same method as in the synthesis of the intermediate 3, except that the intermediate 18 was used instead of the intermediate 1 and 2-bromo-7-iodo-9,9-dimethylfluorene was used instead of 4-bromophenyl boronic acid. As a result of the analysis of FD-MS, the solid was identified as the intermediate 23.

Intermediate 24

Synthesis was conducted by the same method as in the synthesis of the intermediate 4, except that the intermediate 23 was used instead of the intermediate 3. As a result of the analysis of FD-MS, the solid was identified as the intermediate 24.

Intermediate 25

Synthesis was conducted by the same method as in the synthesis of the intermediate 5, except that the intermediate 24 was used instead of the intermediate 4. As a result of the analysis of FD-MS, the solid was identified as the intermediate 25.

Intermediate 26

Synthesis was conducted by the same method as in the synthesis of the intermediate 6, except that the intermediate 25 was used instead of the intermediate 5. As a result of the analysis of FD-MS, the solid was identified as the intermediate 26.

Intermediate 27

Synthesis was conducted by the same method as in the synthesis of the intermediate 1, except that dibenzofuran was used instead of 9-phenyl carbazole. As a result of the analysis of FD-MS, the solid was identified as the intermediate 27.

Intermediate 28

Synthesis was conducted by the same method as in the synthesis of the intermediate 3, except that the intermediate 27 was used instead of the intermediate 1. As a result of the analysis of FD-MS, the solid was identified as the intermediate 28.

Intermediate 29

Synthesis was conducted by the same method as in the synthesis of the intermediate 4, except that the intermediate 11 was used instead of diphenylamine, and the intermediate 28 was used instead of the intermediate 3. As a result of the analysis of FD-MS, the solid was identified as the intermediate 29.

Intermediate 30

Synthesis was conducted by the same method as in the synthesis of the intermediate 5, except that the intermediate 29 was used instead of the intermediate 4. As a result of the analysis of FD-MS, the solid was identified as the intermediate 30.

Intermediate 31

Synthesis was conducted by the same method as in the synthesis of the intermediate 6, except that the intermediate 30 was used instead of the intermediate 5. As a result of the analysis of FD-MS, the solid was identified as the intermediate 31.

Intermediate 32

Synthesis was conducted by the same method as in the synthesis of the intermediate 18, except that dibenzothiophene 8 was used instead of dibenzofuran. As a result of the analysis of FD-MS, the solid was identified as the intermediate 32.

Intermediate 33

Synthesis was conducted by the same method as in the synthesis of the intermediate 3, except that the intermediate 32 was used instead of the intermediate 1, and 1-bromo-4-iodophenyl was used instead of 4-bromophenyl boronic acid. As a result of the analysis of FD-MS, the solid was identified as the intermediate 33.

Intermediate 34

Synthesis was conducted by the same method as in the synthesis of the intermediate 4, except that the intermediate 33 was used instead of the intermediate 3. As a result of the analysis of FD-MS, the solid was identified as the intermediate 34.

Intermediate 35

Synthesis was conducted by the same method as in the synthesis of the intermediate 5, except that the intermediate 34 was used instead of the intermediate 4. As a result of the analysis of FD-MS, the solid was identified as the intermediate 35.

Intermediate 36

Synthesis was conducted by the same method as in the synthesis of the intermediate 6, except that the intermediate 35 was used instead of the intermediate 5. As a result of the analysis of FD-MS, the solid was identified as the intermediate 36.

Intermediate 37

Synthesis was conducted by the same method as in the synthesis of the intermediate 3, except that the intermediate 36 was used instead of the intermediate 1 and 2-bromo-7-iodine 9,9-dimethylfluorene was used instead of 4-bromophenylboronic acid. As a result of the analysis of FD-MS, the solid was identified as the intermediate 37.

Intermediate 38

Synthesis was conducted by the same method as in the synthesis of the intermediate 4, except that the intermediate 37 was used instead of the intermediate 3. As a result of the analysis of FD-MS, the solid was identified as the intermediate 38.

Intermediate 39

Synthesis was conducted by the same method as in the synthesis of the intermediate 5, except that the intermediate 38 was used instead of the intermediate 4. As a result of the analysis of FD-MS, the solid was identified as the intermediate 39.

Intermediate 40

Synthesis was conducted by the same method as in the synthesis of the intermediate 6, except that the intermediate 39 was used instead of the intermediate 5. As a result of the analysis of FD-MS, the solid was identified as the intermediate 40.

[Synthesis of Polymer Compound]

Example 10

The following polymer compound (D) was synthesized.

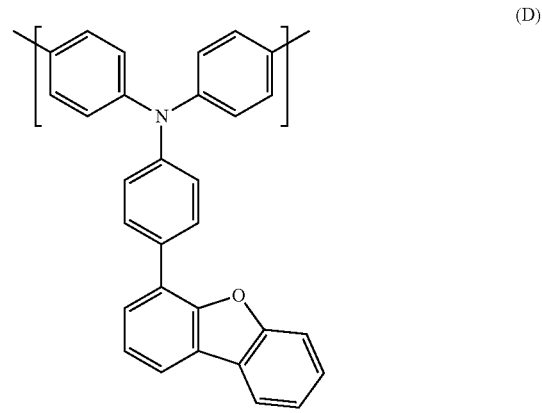

(D)

The polymer compound (D) was obtained in the same manner as in Example 1, except that the intermediate 5 was changed to the intermediate 21 and the intermediate 6 was changed to the intermediate 22.

The molecular weight of the polymer compound (D) thus obtained was Mn=12000 and Mw=21000 (calibrated by standard polystyrene).

Example 11

The following polymer compound (E) was synthesized.

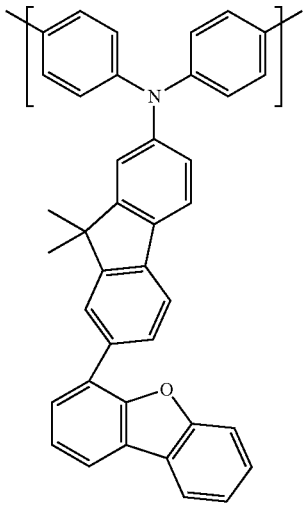
(E)

The polymer compound (E) was obtained in the same manner as in Example 1, except that the intermediate 5 was changed to the intermediate 25 and the intermediate 6 was changed to the intermediate 26.

The molecular weight of the polymer compound (D) thus obtained was Mn=17000 and Mw=35000 (calibrated by standard polystyrene).

Example 12

The following polymer compound (F) was synthesized.

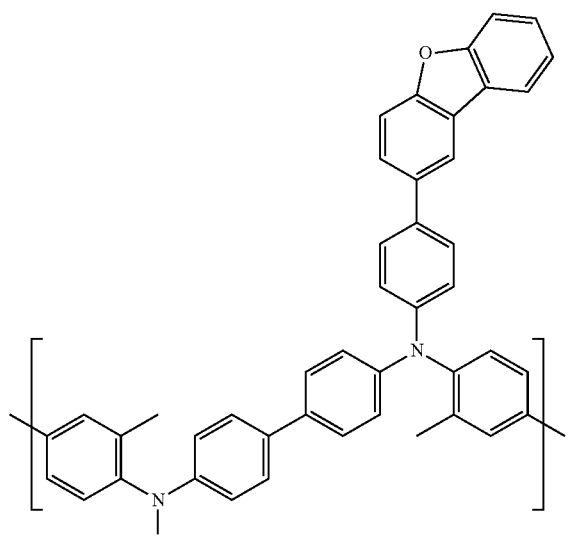
(F)

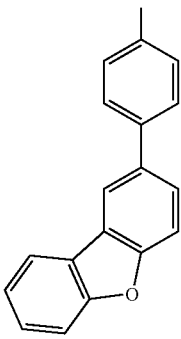

The polymer compound (F) was obtained in the same manner as in Example 1, except that the intermediate 5 was changed to the intermediate 30 and the intermediate 6 was changed to the intermediate 31.

The molecular weight of the polymer compound (F) thus obtained was Mn=52000 and Mw=98000 (calibrated by standard polystyrene).

Example 13

The following polymer compound (G) was synthesized.

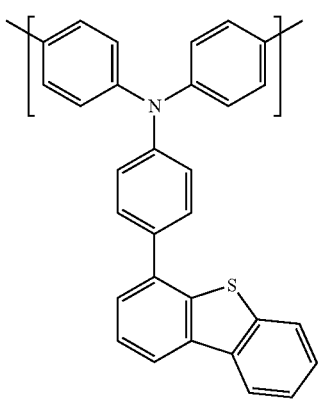
(G)

The polymer compound (G) was obtained in the same manner as in Example 1, except that the intermediate 5 was changed to the intermediate 35 and the intermediate 6 was changed to the intermediate 36.

The molecular weight of the polymer compound (G) thus obtained was Mn=14000 and Mw=25000 (calibrated by standard polystyrene).

Example 14

The following polymer compound (H) was synthesized.

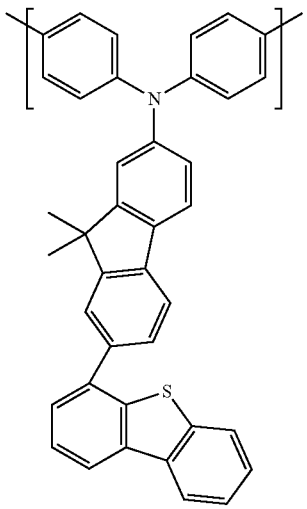
(H)

The polymer compound (H) was obtained in the same manner as in Example 1, except that the intermediate 5 was changed to the intermediate 39 and the intermediate 6 was changed to the intermediate 40.

The molecular weight of the polymer compound (H) thus obtained was Mn=20000 and Mw=42000 (calibrated by standard polystyrene).

Examples 15 to 19

Organic EL devices were fabricated and evaluated in the same manner as in Example 4, except that the compounds shown in Table 2 were used as the hole-transporting material instead of the compound (A). The results are shown in Table 2.

Examples 20 to 25

In Examples 20, 21 and 22, organic EL devices were fabricated by using the compound (D) in the same manner as in Examples 7, 8 and 9.

In Examples 23, 24 and 25, organic EL devices were fabricated by using the compound (G) in the same manner as in Examples 7, 8 and 9.

TABLE 2

| Example | Compound | Current efficiency (cd/A) | Half life time (h) | Emission color |
|---|---|---|---|---|
| Example 15 | D | 7.1 | 880 | Blue |
| Example 16 | E | 6.9 | 930 | Blue |
| Example 17 | F | 7.0 | 900 | Blue |
| Example 18 | G | 6.7 | 850 | Blue |
| Example 19 | H | 7.0 | 830 | Blue |
| Example 20 | D | 6.2 | 850 | Blue |
| Example 21 | D | 6.4 | 870 | Blue |
| Example 22 | D | 6.8 | 850 | Blue |
| Example 23 | G | 6.2 | 820 | Blue |
| Example 24 | G | 6.3 | 850 | Blue |
| Example 25 | G | 6.4 | 840 | Blue |

INDUSTRIAL APPLICABILITY

An organic EL device using the polymer compound of the invention as a material for an organic EL device, in particular as a hole-transporting material or a hole-injecting material, has a high luminous efficiency and a long life time. Therefore, the organic EL device of the invention is highly practical, and is useful as a light source such as a flat emitter for a wall-mounted television and back light or the like of a display.

The contents of the above-described documents are herein incorporated by reference in its entirety.

The invention claimed is:

1. A polymer compound comprising a repeating unit shown by the following formula (1) wherein at least one of $Ar^1$, $Ar^2$ and $Ar^3$ is a group shown by the formula (2):

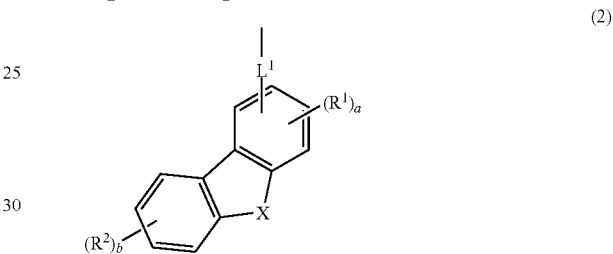

in the formula (1), $Ar^1$, $Ar^2$ and $Ar^3$, which may be the same or different, are a group shown by the formula (2), a substituted or an unsubstituted aromatic hydrocarbon group having 6 to 60 ring carbon atoms or a substituted or unsubstituted aromatic heterocyclic group having 5 to 60 ring atoms;

in the formula (2), $L^1$ is a substituted or unsubstituted aromatic hydrocarbon group having 6 to 60 ring carbon atoms, a substituted or unsubstituted fluorene group or a substituted or unsubstituted aromatic heterocyclic group having 5 to 60 ring atoms;

X is a substituted or unsubstituted hetero atom;

$R^1$ and $R^2$, which may be the same or different, are a hydrogen atom, a substituted or unsubstituted aryl group having 6 to 60 ring carbon atoms, a substituted or unsubstituted alkyl group having 1 to 50 carbon atoms, a substituted or unsubstituted alkoxy group having 1 to 50 carbon atoms, a substituted or unsubstituted aryloxy group having 6 to 50 ring carbon atoms, a substituted or unsubstituted arylthio group having 5 to 50 ring atoms, a substituted or unsubstituted alkoxycarhonyl group having 2 to 50 carbon atoms, an amino group substituted by a substituted or unsubstituted aryl group having 6 to 50 ring carbon atoms, a halogen atom, a cyano group, a nitro group, a hydroxyl group or a carboxyl group;

when the formula (1) has two or more groups shown by the formula (2), the groups shown by the formula (2) may be the same or different;

a is an integer of 0 to 3 and h is an integer of 0 to 4; and the two bonds shown in the formula (1) are, present on a group other than the group shown in the formula (2).

2. The polymer compound according to claim 1, wherein one or more and two or less of $Ar^1$, $Ar^2$ and $Ar^3$ in the formula (1) is a group shown by the formula (2).

3. The polymer compound according to claim 1, wherein at least one of the two bonds is present on a group other than the group of the formula (2).

4. The polymer compound according to claim 1, wherein the X is a group selected from a group shown by the following formula (3), O and S:

=NR³  (3)

wherein R³ is a substituted or unsubstituted aryl group having 6 to 60 ring carbon atoms or a substituted or unsubstituted alkyl group having 1 to 50 carbon atoms.

5. The polymer compound according to claim 1, wherein the group of the formula (2) is a group selected from the following formulas (4) to (8):

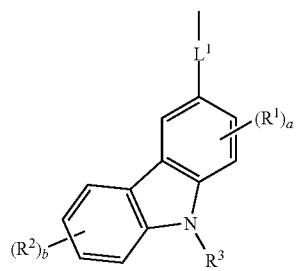

(4)

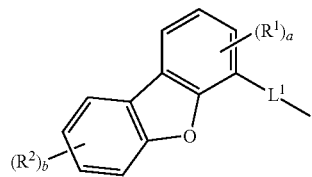

(5)

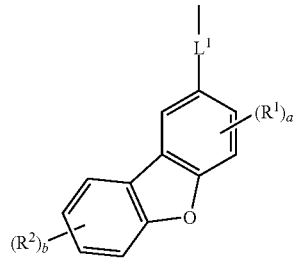

(6)

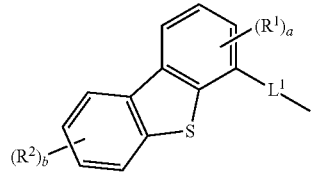

(7)

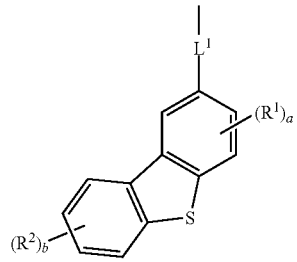

(8)

wherein L¹, R¹, R², R³, a and b are as defined in the formulas (1) to (3).

6. The polymer compound according to claim 1, which comprises at least one of the repeating units selected from those shown by the following formulas (9) to (13):

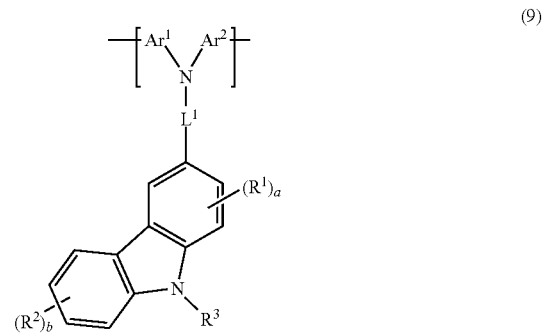

(9)

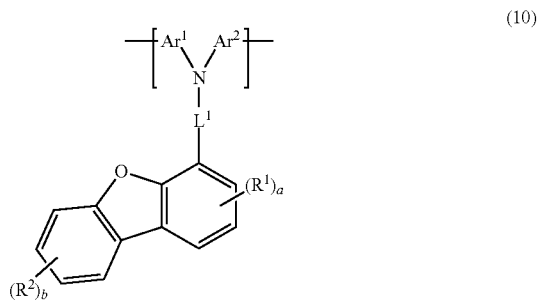

(10)

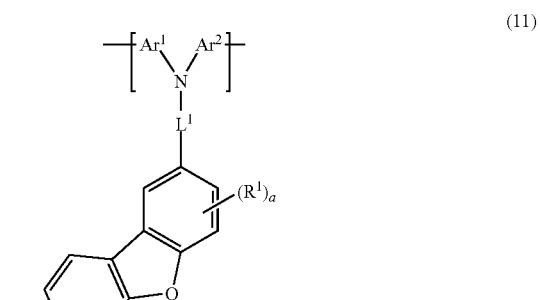

(11)

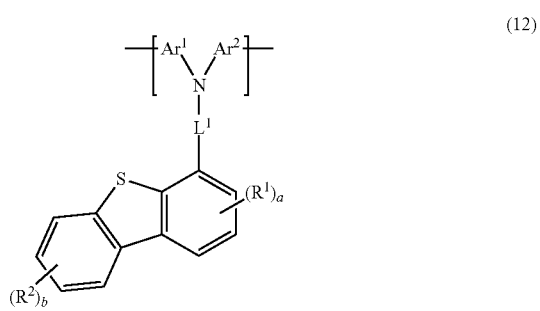

(12)

-continued (13)

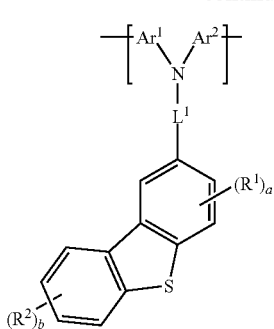

wherein Ar¹, Ar², L¹, R¹ to R³, a and b are as defined in the formulas (1) to (3).

7. The polymer compound according to claim 1, wherein the formula (1) is a repeating unit shown by the following formula (1'):

(1')

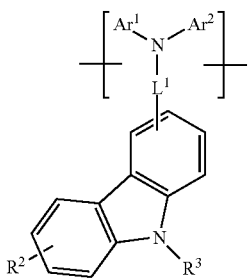

wherein L¹, Ar¹, Ar², R² and R³ are defined in the formulas (1) to (3).

8. The polymer compound according to claim 1, wherein Ar¹, Ar² and Ar³ are independently a ring selected from the group comprising a benzene ring, a naphthalene ring, an anthracene ring, a pyrene ring and a phenanthrene ring.

9. The polymer compound according to claim 1, wherein at least one of Ar¹, Ar² and Ar³ has a substituent and the substitutent is a group selected from the group comprising an alkyl group, an alkoxy group, an alkylthio group, an aryl group, an aryloxy group, an arylthio group, an arylalkyl group, an arylalkenyl group, an arylalkinyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group.

10. The polymer compound according to claim 1, wherein L¹ is a group selected from the group comprising a substituted or unsubstituted phenylene group, a substituted or unsubstituted biphenylene group, a substituted or unsubstituted terphenylene group, a substituted or unsubstituted naphthylene group, a substituted or unsubstituted phenanthrylene group, and a substituted or unsubstituted fluorenylene group.

11. The polymer compound according to claim 1, wherein R³ is a substituted or unsubstituted aryl group having 6 to 60 ring carbon atoms.

12. The polymer compound according to claim 1, wherein R¹ and R² urea substituted or unsubstituted aryl group having 6 to 60 ring carbon atoms, and bonded to the 3$^{rd}$ or the 6$^{th}$ position of the carbazole ring.

13. The polymer compound according to claim 1 which has a structure shown by the following formula (14) or (15):

(14)

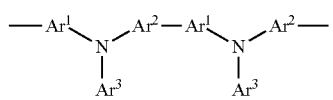

(15)

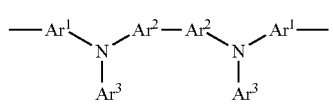

wherein Ar¹, Ar² and Ar³ are as defined in the formula (1).

14. The polymer compound according to claim 1 which comprises at least one of the repeating units shown by the following formulas (16) to (19):

 (16)

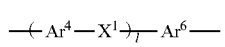 (17)

 (18)

 (19)

wherein Ar⁴, Ar⁵, Ar⁶ and Ar⁷ are independently an arylene group, a divalent heterocyclic group or a divalent group having a metal complex; X¹, X² and X³ are independently —CR⁴=CR⁵—, —C≡C—, —N(R⁶)—, —(SiR⁷R⁸)$_m$— or —C(R⁹R¹⁰)—; R⁴ and R⁵ are independently a hydrogen atom, an alkyl group, an aryl group, a monovalent heterocyclic group, a carboxyl group, a substituted carboxyl group, or a cyano group; R⁶ to R¹⁰ are independently a hydrogen atom, an alkyl group, an aryl group, a monovalent heterocyclic group, an arylalkyl group or a group containing a substituted amino group; l is an integer of 1 or 2 is an integer of 1 to 12; and when each of R⁴ to R¹⁰ plurally exist, they may be the same or may differ.

15. A material for an organic electroluminescence device which comprises the polymer compound according to claim 1.

16. The material for an organic electroluminescence device according to claim 15, which is for a hole-transporting layer or a hole-injecting layer.

17. An organic electroluminescence device comprising:
an anode;
a cathode; and
one or more organic thin film layers comprising an emitting layer between the anode and the cathode, at least one of the organic thin film layers comprising the material for an organic electroluminescence device according to claim 15.

18. An organic electroluminescence device comprising:
an anode;
a cathode;
one or more organic thin film layers comprising an emitting layer between the anode and the cathode; and
at least one of a hole-transporting layer and a hole-injecting layer between the anode and the emitting layer, the hole-transporting layer and the hole-injecting layer comprising the material for an organic electroluminescence device according to claim 16.

* * * * *